US012666175B2

(12) United States Patent
Kobayashi

(10) Patent No.: US 12,666,175 B2
(45) Date of Patent: Jun. 23, 2026

(54) PHOTOELECTRIC CONVERSION DEVICE, PHOTOELECTRIC CONVERSION SYSTEM, MOVABLE OBJECT AND EQUIPMENT

(71) Applicant: CANON KABUSHIKI KAISHA, Tokyo (JP)

(72) Inventor: Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 207 days.

(21) Appl. No.: 18/435,758

(22) Filed: Feb. 7, 2024

(65) Prior Publication Data

US 2024/0284076 A1 Aug. 22, 2024

(30) Foreign Application Priority Data

Feb. 20, 2023 (JP) ................................. 2023-024230

(51) Int. Cl.
*H04N 25/78* (2023.01)
*H04N 23/667* (2023.01)
(Continued)

(52) U.S. Cl.
CPC ........... *H04N 25/78* (2023.01); *H04N 23/667* (2023.01); *H04N 25/75* (2023.01); *H04N 25/76* (2023.01);
(Continued)

(58) Field of Classification Search
CPC ...... H04N 23/667; H04N 25/75; H04N 25/76; H04N 25/77; H04N 25/778; H04N 25/772; H04N 25/78; H04N 25/79; H10F 39/809
See application file for complete search history.

(56) References Cited

U.S. PATENT DOCUMENTS 7,990,440 B2   8/2011   Kobayashi
9,407,847 B2   8/2016   Maehashi
(Continued)

FOREIGN PATENT DOCUMENTS

JP   2019-30002 A   2/2019
JP   2019-75779 A   5/2019
JP   2022-2350 A    1/2022

OTHER PUBLICATIONS

U.S. Appl. No. 18/504,387, filed Nov. 8, 2023 by Hideo Kobayashi.
(Continued)

*Primary Examiner* — Lin Ye
*Assistant Examiner* — Chriss S Yoder, III
(74) *Attorney, Agent, or Firm* — VENABLE LLP

(57) ABSTRACT

The photoelectric conversion device includes a plurality of pixels each including a photoelectric conversion unit and an amplification unit configured to amplifies a signal based on charge generated by the photoelectric conversion unit, an output line connected to the plurality of pixels, an interconnection disposed adjacent to the output line, and a current source circuit connected to the output line and configured to supply a current to the amplification unit of the pixel via the output line. The current source circuit includes a current source transistor connected between the interconnection and a fixed voltage node, and a cascode transistor connected between the interconnection and the output line.

30 Claims, 35 Drawing Sheets

(51) Int. Cl.

| | |
|---|---|
| *H04N 25/75* | (2023.01) |
| *H04N 25/76* | (2023.01) |
| *H04N 25/77* | (2023.01) |
| *H04N 25/772* | (2023.01) |
| *H04N 25/778* | (2023.01) |
| *H04N 25/79* | (2023.01) |
| *H10F 39/00* | (2025.01) |

(52) U.S. Cl.

CPC ........... *H04N 25/77* (2023.01); *H04N 25/772* (2023.01); *H04N 25/778* (2023.01); *H04N 25/79* (2023.01); *H10F 39/809* (2025.01)

(56) References Cited

U.S. PATENT DOCUMENTS

| | | | | |
|---|---|---|---|---|
| 9,438,828 | B2 | 9/2016 | Itano | |
| 9,509,931 | B2 | 11/2016 | Kobayashi | |
| 9,602,752 | B2 | 3/2017 | Kobayashi | |
| 10,015,430 | B2 | 7/2018 | Kobayashi | |
| 10,477,123 | B2 * | 11/2019 | Kaneko .................. | H04N 25/76 |
| 10,609,316 | B2 | 3/2020 | Kobayashi | |
| 11,178,351 | B1 * | 11/2021 | Cheng .................. | H04N 25/778 |
| 11,268,851 | B2 | 3/2022 | Kobayashi | |
| 11,431,929 | B2 | 8/2022 | Kobayashi | |
| 11,463,644 | B2 | 10/2022 | Soda | |
| 11,470,275 | B2 | 10/2022 | Kobayashi | |
| 11,496,704 | B2 | 11/2022 | Sato et al. | |
| 11,616,925 | B2 | 3/2023 | Kobayashi | |
| 11,653,114 | B2 | 5/2023 | Nakazawa | |
| 11,688,755 | B2 | 6/2023 | Kobayashi | |
| 11,736,813 | B2 | 8/2023 | Kobayashi | |
| 11,800,253 | B2 | 10/2023 | Saito | |
| 11,843,880 | B2 | 12/2023 | Kobayashi | |
| 11,843,893 | B2 | 12/2023 | Kobayashi | |
| 11,910,116 | B2 | 2/2024 | Kobayashi | |
| 2019/0116327 | A1 | 4/2019 | Shouho | |
| 2020/0244907 | A1 | 7/2020 | Ueno | |
| 2021/0352232 | A1 | 11/2021 | Yorikado | |
| 2022/0046199 | A1 * | 2/2022 | Ueno .................. | H04N 25/671 |
| 2022/0303484 | A1 | 9/2022 | Kobayashi | |
| 2022/0303486 | A1 | 9/2022 | Kobayashi | |
| 2023/0041974 | A1 | 2/2023 | Kobayashi | |
| 2023/0070568 | A1 | 3/2023 | Kobayashi | |
| 2023/0072715 | A1 | 3/2023 | Kobayashi | |
| 2023/0117988 | A1 | 4/2023 | Kobayashi | |
| 2023/0154963 | A1 | 5/2023 | Kobayashi | |
| 2023/0171514 | A1 | 6/2023 | Kobayashi | |
| 2023/0178580 | A1 | 6/2023 | Yamazaki | |
| 2023/0179890 | A1 | 6/2023 | Kobayashi | |
| 2023/0216459 | A1 | 7/2023 | Kobayashi | |
| 2023/0247332 | A1 | 8/2023 | Kobayashi | |
| 2023/0282654 | A1 | 9/2023 | Kobayashi | |
| 2024/0022838 | A1 | 1/2024 | Muto | |
| 2024/0064439 | A1 | 2/2024 | Kobayashi | |
| 2024/0080590 | A1 | 3/2024 | Shimada | |
| 2024/0080591 | A1 | 3/2024 | Takahashi | |
| 2024/0147096 | A1 | 5/2024 | Kobayashi | |

OTHER PUBLICATIONS

U.S. Appl. No. 18/538,874, filed Dec. 13, 2023 by Hideo Kobayashi.
U.S. Appl. No. 18/646,985, filed Apr. 26, 2024 by Hideo Kobayashi.

* cited by examiner

FIG. 17A
FIG. 17B
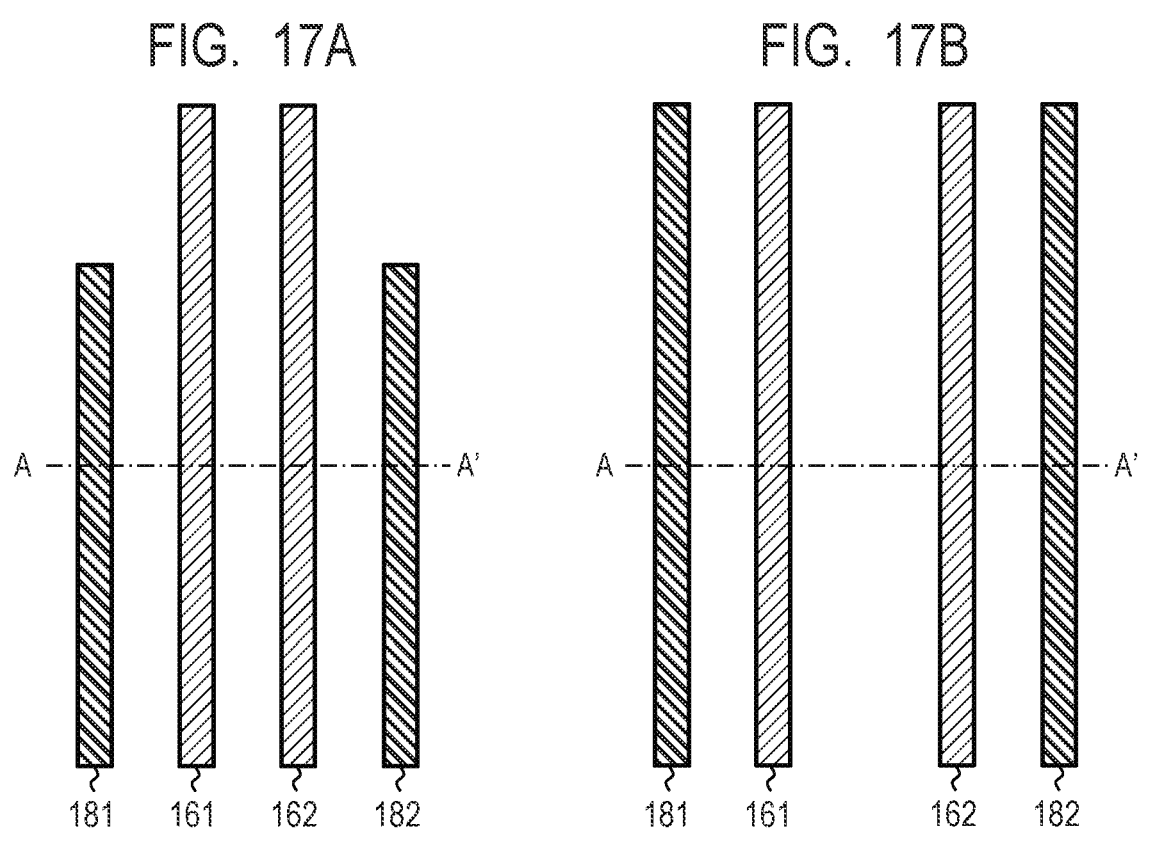
FIG. 17C
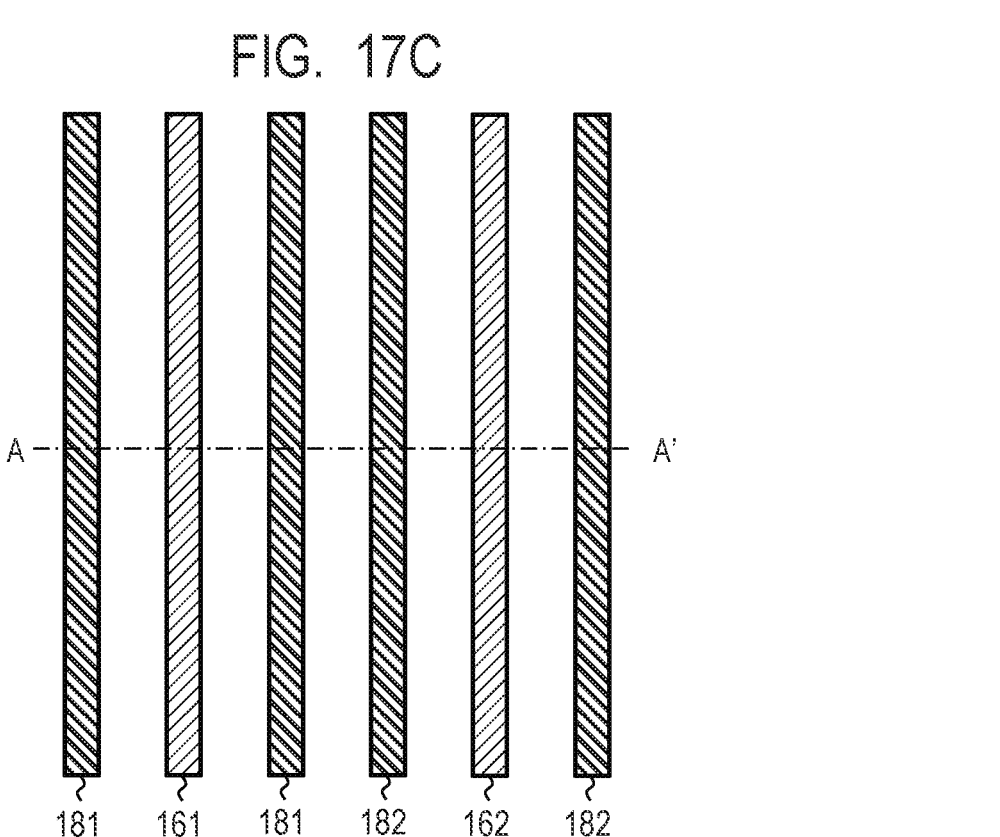

FIG. 18A
FIG. 18B
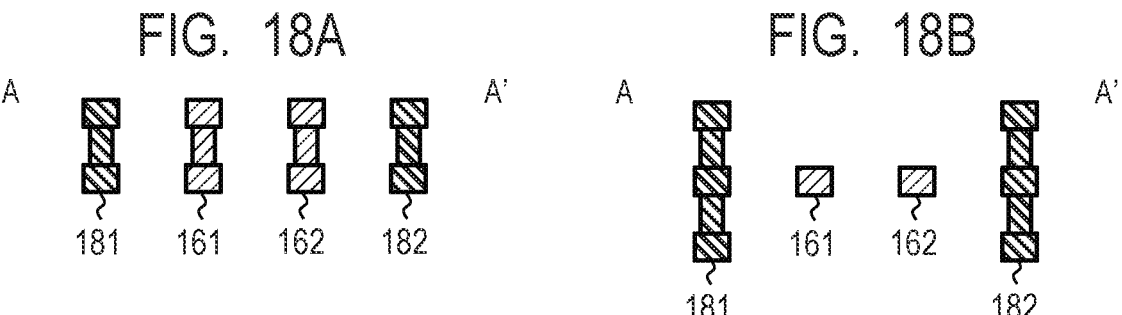
FIG. 18C
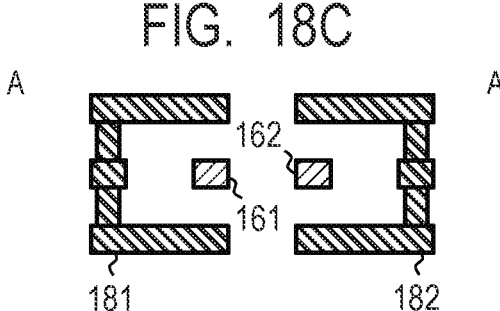
FIG. 18D
FIG. 18E
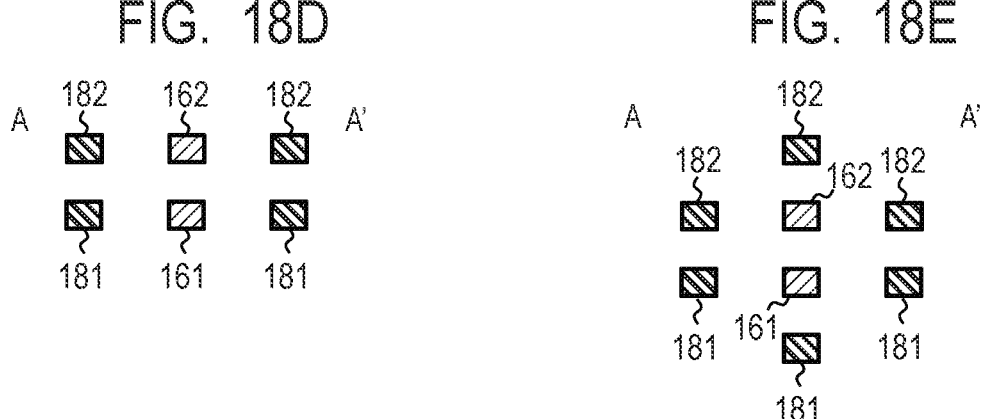

PHOTOELECTRIC CONVERSION DEVICE, PHOTOELECTRIC CONVERSION SYSTEM, MOVABLE OBJECT AND EQUIPMENT

BACKGROUND OF THE INVENTION

Field of the Invention

The present invention relates to a photoelectric conversion device, a photoelectric conversion system, a movable object, and equipment.

Description of the Related Art

In a photoelectric conversion device such as a CMOS image sensor, it is required to suppress the influence of parasitic capacitance connected to a signal line from the viewpoint of increasing the operation speed and the like. Japanese Patent Application Laid-Open No. 2019-030002 discloses a solid-state imaging element configured to reduce influence of parasitic capacitance connected to a vertical signal line by connecting a negative capacitance circuit to the vertical signal line.

However, in the technology described in Japanese Patent Application Laid-Open No. 2019-030002, there are cases where power consumption and a circuit area increase due to addition of the negative capacitance circuit.

SUMMARY OF THE INVENTION

It is an object of the present invention to provide a photoelectric conversion device capable of realizing an increase in operation speed while suppressing an increase in power consumption and chip area.

According to an embodiment of the present disclosure, there is provided a photoelectric conversion device including a plurality of pixels arranged to form a column and each including a photoelectric conversion unit and an amplification unit configured to amplify a signal based on charge generated by the photoelectric conversion unit, an output line connected to the plurality of pixels, an interconnection disposed adjacent to the output line, and a current source circuit connected to the output line and configured to supply a current to the amplification unit of the pixel via the output line, wherein the current source circuit includes a current source transistor connected between the interconnection and a fixed voltage node, and a cascode transistor connected between the interconnection and the output line.

According to another embodiment of the present specification, there is provided a photoelectric conversion device including a plurality of pixels arranged to form a column and each including a photoelectric conversion unit and an amplification unit configured to amplify a signal based on charge generated by the photoelectric conversion unit, an output line connected to the plurality of pixels, an interconnection disposed adjacent to the output line, and a current source circuit connected to the output line and configured to supply a current to the amplification unit of the pixel via the output line, wherein the current source circuit includes a current source transistor connected between the output line and the interconnection, and a resistor connected between the interconnection and a fixed voltage node.

According to still another embodiment of the present specification, there are provided a photoelectric conversion device including a plurality of pixels arranged to form a column and each including a photoelectric conversion unit and an amplification unit configured to amplify a signal based on charge generated by the photoelectric conversion unit, an output line connected to the plurality of pixels, a current source circuit connected to the output line and configured to supply a current to the amplification unit of the pixel via the output line, a first substrate provided with the plurality of pixels, and a second substrate stacked over the first substrate and provided with the current source circuit, wherein the output line is divided into a first portion disposed on the first substrate and to which a part of the plurality of pixels is connected, a second portion disposed on the first substrate and to which another part of the plurality of pixels is connected, and a third portion disposed on the second substrate and connected to the current source circuit, wherein the photoelectric conversion device further comprises a selection circuit disposed on the second substrate and configured to select one of the first portion and the second portion and electrically connect the selected one to the third portion, and wherein the current source circuit includes a current source transistor connected to the output line and a negative capacitance circuit connected to the output line.

Further features of the present invention will become apparent from the following description of exemplary embodiments with reference to the attached drawings.

BRIEF DESCRIPTION OF THE DRAWINGS

FIG. 2 is a circuit diagram illustrating a configuration example of a pixel in the photoelectric conversion device according to the first embodiment of the present invention.

FIG. 6 is a circuit diagram illustrating another configuration example of the bias circuit in the photoelectric conversion device according to the first embodiment of the present invention.

FIG. 10 is a circuit diagram illustrating a configuration example of a bias circuit in the photoelectric conversion device according to the second embodiment of the present invention.

FIG. 17A, FIG. 17B, and FIG. 17C are plan views illustrating other arrangement examples of the vertical output lines and the interconnections in the photoelectric conversion device according to the sixth embodiment of the present invention.

FIG. 18A, FIG. 18B, FIG. 18C, FIG. 18D, and FIG. 18E are cross-sectional views illustrating other arrangement examples of the vertical output lines and the interconnections in the photoelectric conversion device according to the sixth embodiment of the present invention.

FIG. 19 is a circuit diagram illustrating a configuration example of a photoelectric conversion device according to a seventh embodiment of the present invention.

FIG. 23 is a circuit diagram illustrating a configuration example of a photoelectric conversion device according to an eighth embodiment of the present invention.

FIG. 30 and FIG. 31 are circuit diagrams illustrating a configuration example of a current source circuit in a photoelectric conversion device according to a modification of the embodiments of the present invention.

DESCRIPTION OF THE EMBODIMENTS

Preferred embodiments of the present invention will now be described in detail in accordance with the accompanying drawings.

First Embodiment

Figure 1:
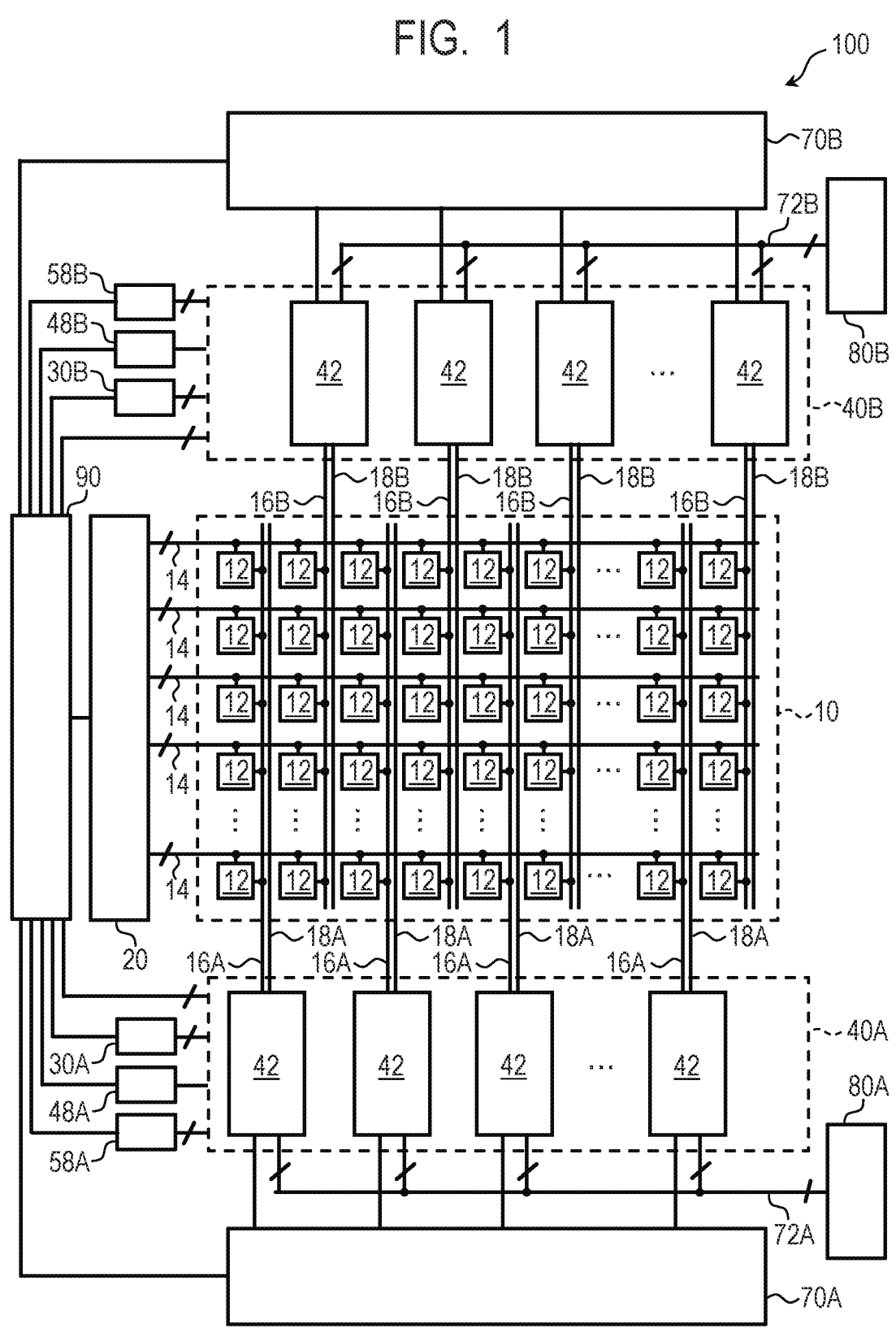
FIG. 1 is a block diagram illustrating a schematic configuration of a photoelectric conversion device according to a first embodiment of the present invention.
Figure 2:
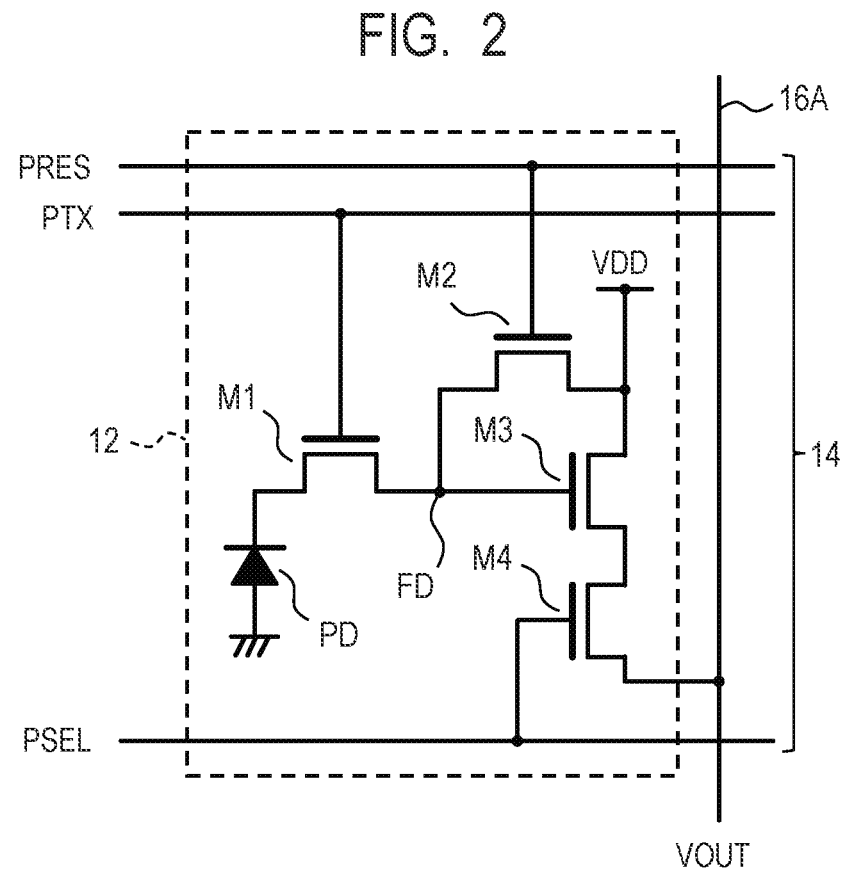
Figure 3:
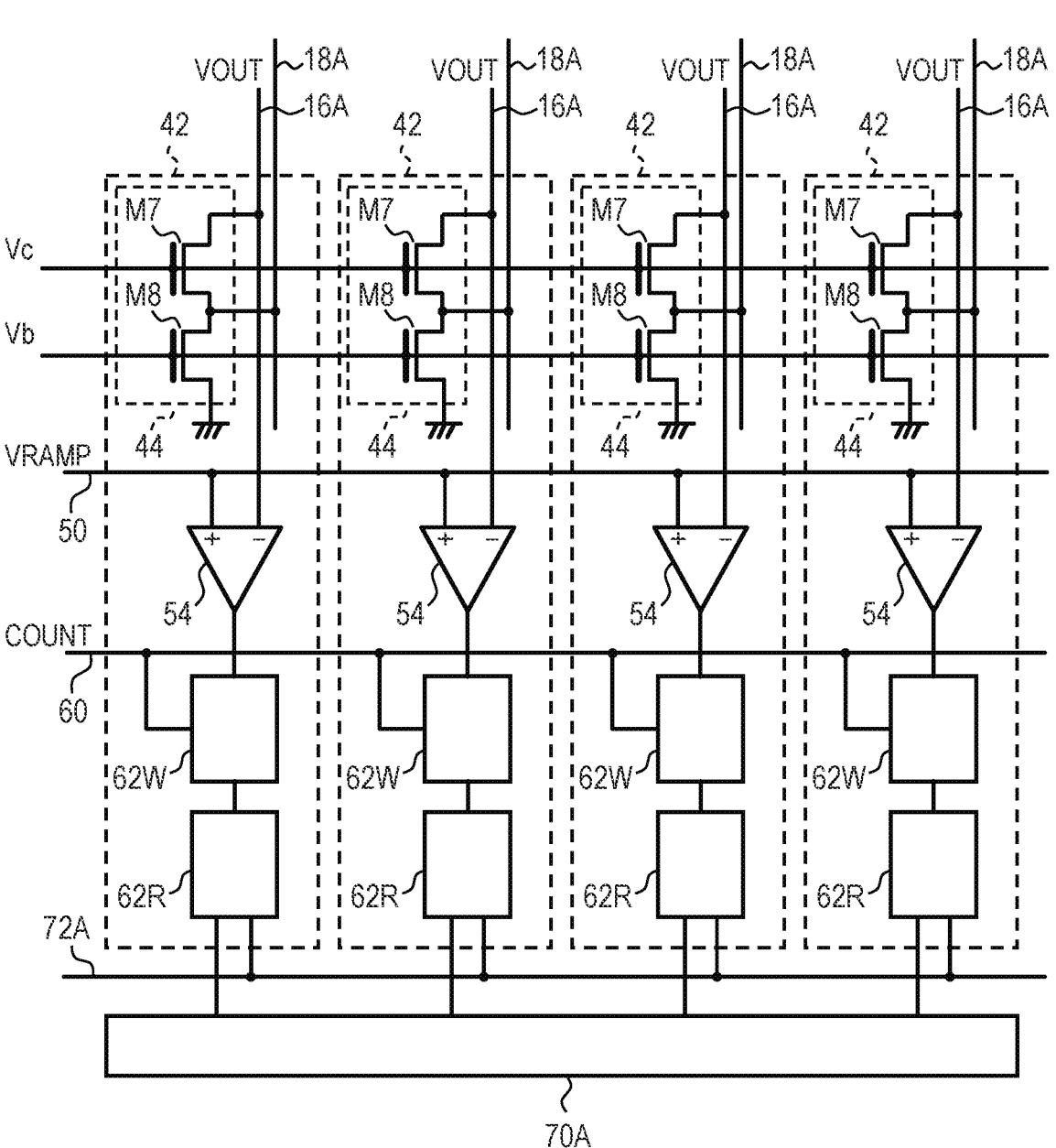
FIG. 3 is a circuit diagram illustrating a configuration example of a column circuit in the photoelectric conversion device according to the first embodiment of the present invention.
Figures 4A, 4B:
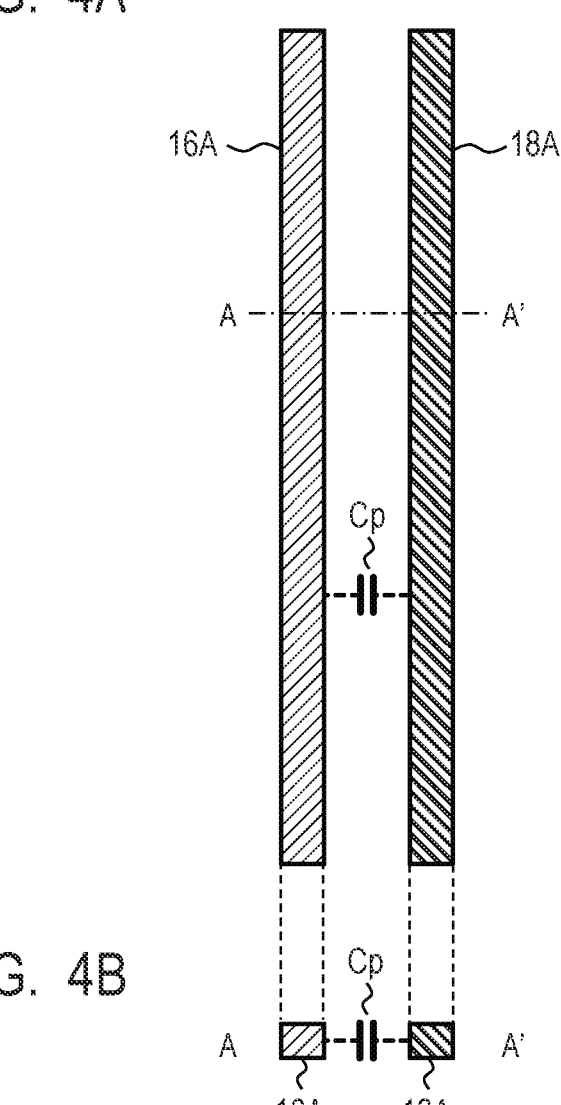
FIG. 4A and FIG. 4B are schematic views illustrating a positional relationship between a vertical output line and an interconnection in the photoelectric conversion device according to the first embodiment of the present invention.
Figure 5:
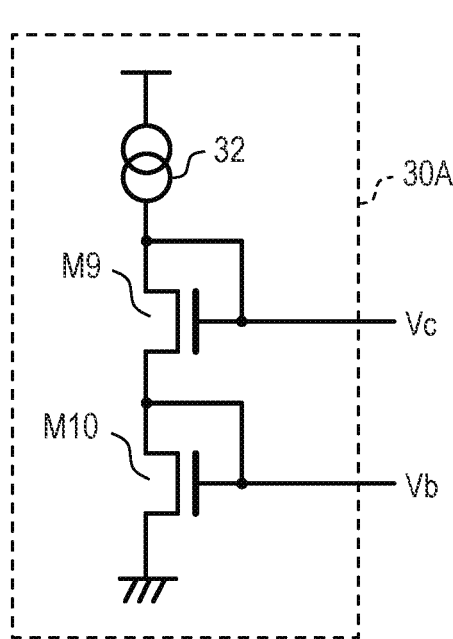
FIG. 5 is a circuit diagram illustrating a configuration example of a bias circuit in the photoelectric conversion device according to the first embodiment of the present invention.
Figure 6:
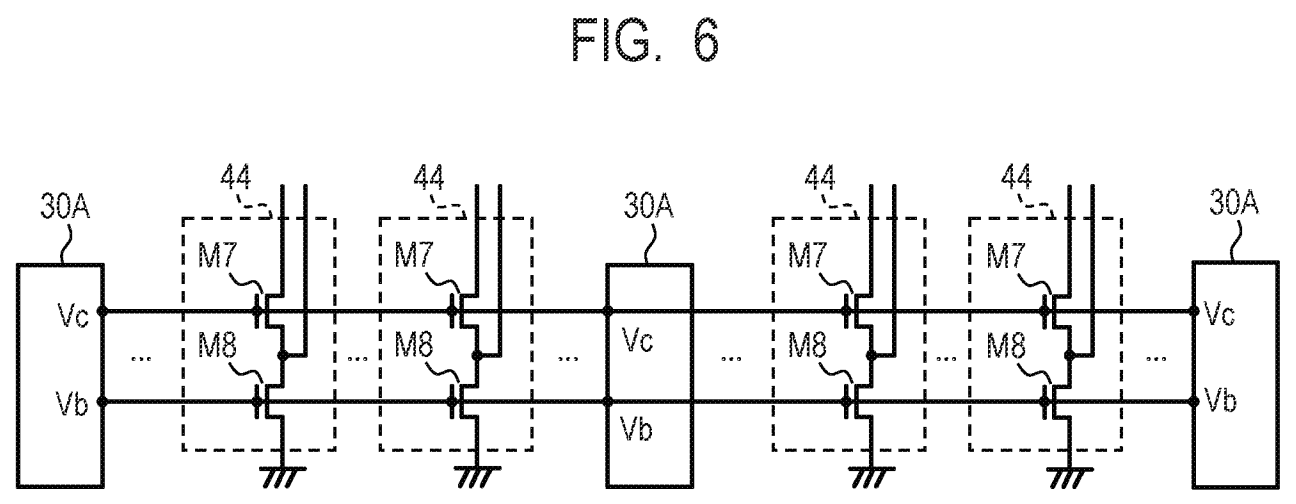
Figure 7A:
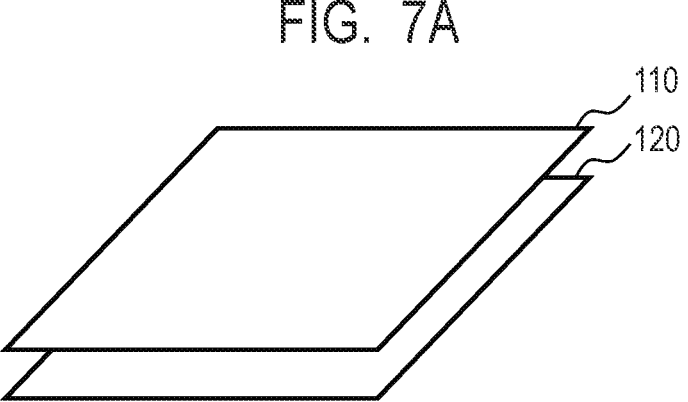
FIG. 7A and FIG. 7B are schematic diagrams illustrating a configuration example of the photoelectric conversion device according to the first embodiment of the present invention.
Figure 7B:
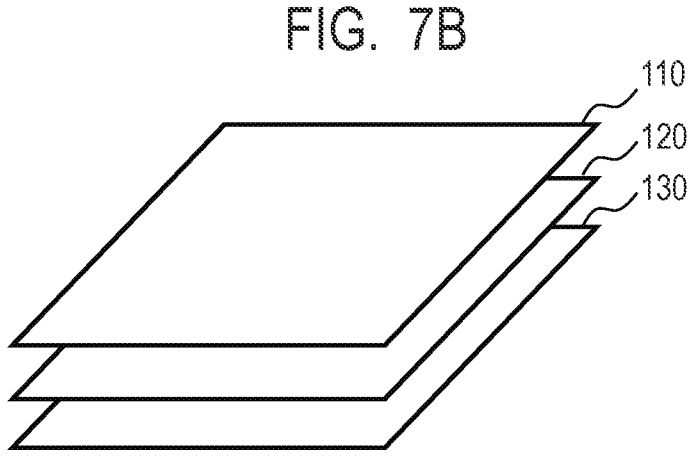
Figure 8:
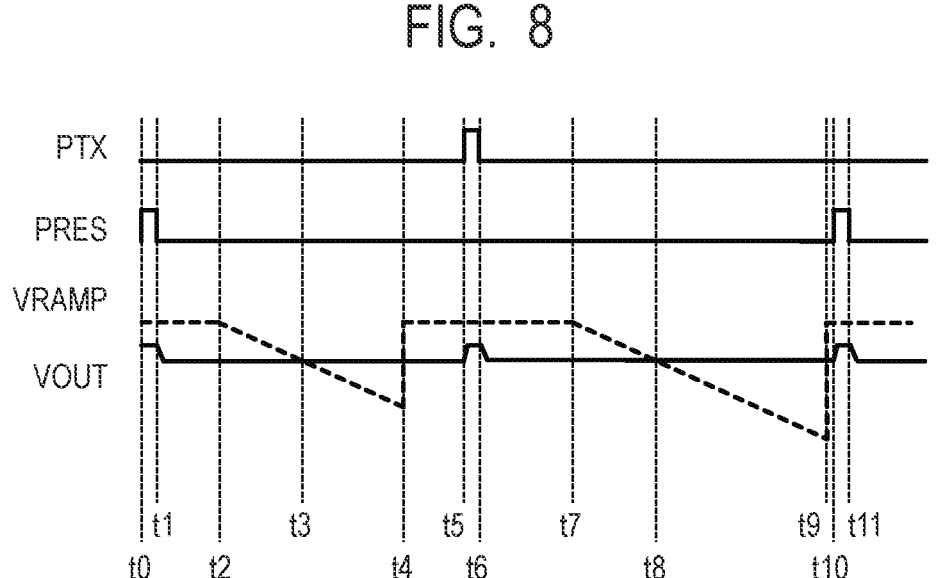
FIG. 8 is a timing chart illustrating a method of driving the photoelectric conversion device according to the first embodiment of the present invention.

A photoelectric conversion device and a method of driving the same according to a first embodiment of the present invention will be described with reference to FIG. 1 to FIG. 8. FIG. 1 is a block diagram illustrating a schematic configuration of a photoelectric conversion device according to the present embodiment. FIG. 2 is a circuit diagram illustrating a configuration example of a pixel in the photoelectric conversion device according to the present embodiment. FIG. 3 is a circuit diagram illustrating a configuration example of a column circuit in the photoelectric conversion device according to the present embodiment. FIG. 4A and FIG. 4B are schematic views illustrating a positional relationship between a vertical output line and an interconnections in the photoelectric conversion device according to the present embodiment. FIG. 5 is a circuit diagram illustrating a configuration example of a bias circuit in the photoelectric conversion device according to the present embodiment. FIG. 6 is a circuit diagram illustrating another configuration example of the bias circuit in the photoelectric conversion device according to the present embodiment. FIG. 7A and FIG. 7B are schematic diagrams illustrating a configuration example of the photoelectric conversion device according to the present embodiment. FIG. 8 is a timing chart illustrating a method of driving the photoelectric conversion device according to the present embodiment.

As illustrated in FIG. 1, the photoelectric conversion device 100 according to the present embodiment includes a pixel array unit 10, a vertical scanning circuit 20, bias circuits 30A and 30B, readout circuits 40A and 40B, reference signal generation circuits 48A and 48B, and counter circuits 58A and 58B. The photoelectric conversion device 100 further includes horizontal scanning circuits 70A and 70B, output circuits 80A and 80B, and a control circuit 90.

The pixel array unit 10 is provided with a plurality of pixels 12 arranged in a matrix form over a plurality of rows and a plurality of columns. Each pixel 12 includes a photoelectric conversion unit including a photoelectric conversion element such as a photodiode, and outputs a pixel signal corresponding to an amount of incident light. The number of rows and columns of a pixel array arranged in the pixel array unit 10 is not particularly limited. In addition, in the pixel array unit 10, in addition to effective pixels which output the pixel signals according to the amount of incident light, optical black pixels in which the photoelectric conversion units are shielded from light, dummy pixels which do not output signals, and the like may be arranged. A specific configuration of the pixel 12 will be described later.

In each row of the pixel array unit 10, a control line 14 is arranged so as to extend in a first direction (lateral direction in FIG. 1). Each of the control lines 14 is connected to each of the pixels 12 arranged in the first direction on the corresponding row, and serves as a signal line common to these pixels 12. The first direction in which the control lines 14 extend may be referred to as a row direction or a horizontal direction. The control lines 14 are connected to the vertical scanning circuit 20. The control line 14 in each row may include a plurality of signal lines.

In each column of the pixel array unit 10, a vertical output line 16A and an interconnection 18A or a vertical output line 16B and an interconnection 18B are arranged so as to extend in a second direction (vertical direction in FIG. 1) intersecting the first direction. The vertical output lines 16A and the interconnections 18A, and the vertical output lines 16B and the interconnections 18B are alternately arranged in each column. For example, the vertical output lines 16A and the interconnections 18A are arranged in odd columns, and the vertical output lines 16B and the interconnections 18B are arranged in even columns. The vertical output lines 16A and 16B are connected to the pixels 12 arranged in the second direction on the corresponding column, respectively, and form common signal lines for these pixels 12. Each of the interconnections 18A and 18B is disposed adjacent to the vertical output line 16A or the vertical output line 16B of the corresponding column. The second direction in which the vertical output lines 16A and 16B and the interconnections 18A and 18B extend may be referred to as a column direction or a vertical direction. The vertical output lines 16A and the interconnections 18A are connected to the readout circuit 40A. The vertical output lines 16B and the interconnections 18B are connected to the readout circuit 40B.

The vertical scanning circuit 20 is a control circuit having a function of receiving control signals from the control circuit 90, generating control signals for driving the pixels 12, and outputting the generated control signals to the pixels 12 via the control lines 14. A logic circuit such as a shift register or an address decoder may be used for the vertical scanning circuit 20. The vertical scanning circuit 20 sequentially outputs the control signals to the control lines 14 of each row, and sequentially drives the pixels 12 of the pixel array unit 10 in units of rows. Each of the signals read out from the pixels 12 in units of rows is input to the readout circuit 40A or the readout circuit 40B via the vertical output line 16A or the vertical output line 16B arranged in each column of the pixel array unit 10.

The bias circuit 30A supplies a predetermined bias voltage to a current source (a current source circuit 44 described later)(not illustrated) included in the column circuit 42 of each column of the readout circuit 40A. Similarly, the bias circuit 30B supplies a predetermined bias voltage to a current source (a current source circuit 44 described later) (not illustrated) included in the column circuit 42 of each column of the readout circuit 40B.

The readout circuit 40A includes a plurality of column circuits 42 corresponding to the number of columns in which the vertical output lines 16A and the interconnections 18A are arranged. Each of the column circuits 42 of the readout circuit 40A is connected to the vertical output line 16A and the interconnection 18A of the corresponding column. Similarly, the readout circuit 40B includes a plurality of column circuits 42 corresponding to the number of columns in which the vertical output lines 16B and the interconnections 18B are arranged. Each column circuit 42 of the readout circuit 40B is connected to the vertical output line 16B and the interconnection 18B of the corresponding column. The column circuit 42 is a processing circuit that performs predetermined processing on the pixel signals read out from the pixels 12 on the corresponding columns. Examples of the processing performed by the column circuits 42 include amplification processing and signal processing such as AD (analog-to-digital) conversion. Each of the column circuits 42 may include a signal holding circuit (memory) for holding the processed pixel signals.

The reference signal generation circuit 48A is connected to the readout circuit 40A. The reference signal generation circuit 48A has a function of receiving a control signal from the control circuit 90, generating a reference signal used for AD conversion, and outputting the generated reference signal to the readout circuit 40A. Similarly, the reference signal generation circuit 48B is connected to the readout circuit 40B. The reference signal generation circuit 48B has a function of receiving a control signal from the control circuit 90, generating a reference signal used for AD conversion, and outputting the generated reference signal to the readout circuit 40B.

The reference signal used in the AD conversion may be a signal having a predetermined amplitude corresponding to the range of the pixel signal and whose signal level changes with lapse of time. The reference signal is not particularly limited, but, for example, a ramp signal whose signal level monotonically increases or monotonically decreases over time may be applied. It is to be noted that the change of the signal level is not necessarily continuous, and may be in a step shape. The change in the signal level need not necessarily be linear with respect to time, but may be curvilinear with respect to time (e.g., sine wave or cosine wave).

The counter circuit 58A is connected to the readout circuit 40A. The counter circuit 58A has a function of performing a counting operation in response to a control signal from the control circuit 90, and outputting a count signal indicating the count value to the readout circuit 40A. The counter circuit 58A starts the counting operation in synchronization with a timing at which a change in the signal level of the reference signal supplied from the reference signal generation circuit 48A starts. Similarly, the counter circuit 58B is connected to the readout circuit 40B. The counter circuit 58B has a function of performing a counting operation in response to a control signal from the control circuit 90, and outputting a count signal indicating the count value to the readout circuit 40B. The counter circuit 58B starts the counting operation in synchronization with a timing at which a change in the signal level of the reference signal supplied from the reference signal generation circuit 48B starts.

The horizontal scanning circuit 70A is a control circuit having a function of receiving control signals from the control circuit 90, generating control signals for reading out the pixel signals from the column circuits 42 of the readout circuit 40A, and outputting the generated control signals to the readout circuit 40A. The horizontal scanning circuit 70A sequentially scans the column circuits 42 of the readout circuit 40A, and sequentially outputs the pixel signals held in the column circuits 42 to the output circuit 80A via the horizontal output line 72A. Similarly, the horizontal scanning circuit 70B is a control unit having a function of receiving control signals from the control circuit 90, generating control signals for reading out the pixel signals from the column circuits 42 of the readout circuit 40B, and outputting the generated control signals to the readout circuit 40B. The horizontal scanning circuit 70B sequentially scans the column circuits 42 of the readout circuit 40B, and sequentially outputs the pixel signals held in the column circuits 42 to the output circuit 80B via the horizontal output line 72B. A logic circuit such as a shift register or an address decoder may be used for the horizontal scanning circuits 70A and 70B.

The output circuit 80A is a processing circuit that includes a buffer amplifier, a differential amplifier, or the like and performs predetermined signal processing on the pixel signal on the column selected by the horizontal scanning circuit 70A, and outputs the processed pixel data. Similarly, the output circuit 80B is a processing circuit that includes a buffer amplifier, a differential amplifier, or the like and performs predetermined signal processing on the pixel signal of the columns selected by the horizontal scanning circuit 70B, and outputs the processed pixel data. Examples of the signal processing performed by the output circuits 80A and 80B include correction processing by CDS (correlated double sampling) and amplification processing.

The control circuit 90 is a control circuit for generating control signals for controlling operations of the vertical scanning circuit 20, the readout circuits 40A and 40B, the reference signal generation circuits 48A and 48B, the counter circuits 58A and 58B, and the horizontal scanning circuits 70A and 70B, and outputting the generated control signals to these functional blocks. At least a part of the control signals for controlling the operation of these functional blocks may be supplied from the outside of the photoelectric conversion device 100.

FIG. 1 illustrates an example in which two readout circuit blocks are provided: a readout circuit block including a readout circuit 40A, a horizontal scanning circuit 70A, an output circuit 80A, and the like; and a readout circuit block including a readout circuit 40B, a horizontal scanning circuit 70B, an output circuit 80B, and the like. However, the number of readout circuit blocks is not necessarily two, but may be one.

As illustrated in, e.g., FIG. 2, each of the pixels 12 constituting the pixel array unit 10 may include a photoelectric conversion element PD, a transfer transistor M1, a reset transistor M2, an amplifier transistor M3, and a select transistor M4.

The photoelectric conversion element PD is, for example, a photodiode, an anode of which is connected to a ground voltage node, and a cathode of which is connected to a source of the transfer transistor M1. A drain of the transfer transistor M1 is connected to a source of the reset transistor M2 and a gate of the amplifier transistor M3. A node FD to which the drain of the transfer transistor M1, the source of the reset transistor M2, and the gate of the amplifier transistor M3 are connected is a so-called floating diffusion. The floating diffusion includes a capacitance component (floating diffusion capacitance) and functions as a charge holding portion. The floating diffusion capacitance may include a gate capacitance of a transistor, a p-n junction capacitance, an interconnection capacitance, and the like. A drain of the reset transistor M2 and a drain of the amplifier transistor M3 are connected to a node to which a power supply voltage (voltage VDD) is supplied. A source of the amplifier transistor M3 is connected to a drain of the select transistor M4. A source of the select transistor M4 is connected to the vertical output line 16A (or the vertical output line 16B).

In the case of the pixel configuration of FIG. 2, the control line 14 of each row includes three signal lines including a signal line connected to a gate of the transfer transistor M1, a signal line connected to a gate of the reset transistor M2, and a signal line connected to a gate of the select transistor M4. A control signal PTX is supplied from the vertical scanning circuit 20 to the gate of the transfer transistor M1. A control signal PRES is supplied from the vertical scanning circuit 20 to the gate of the reset transistor M2. A control signal PSEL is supplied from the vertical scanning circuit 20 to the gate of the select transistor M4. When each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

In the present embodiment, a description will be given assuming a case where electrons are used as a signal charge among electron-hole pairs generated in the photoelectric conversion element PD by light incidence. When electrons are used as the signal charge, each transistor included in the pixel 12 may be formed of an n-channel MOS transistor. However, the signal charge is not limited to electrons, and holes may be used as the signal charge. When holes are used as signal charge, the conductivity type of each transistor is opposite to that described in the present embodiment. In addition, the term "source" or "drain" of the MOS transistor may vary depending on the conductivity type of the transistor or the target function. Some or all of names of the source and the drain used in the present embodiment are sometimes referred to as reverse names.

The photoelectric conversion element PD converts (photoelectrically converts) incident light into charge of an amount corresponding to an amount of the incident light, and accumulates the generated charge. The transfer transistor M1 transfers the charge held in the photoelectric conversion element PD to the node FD by turning on. The charge transferred from the photoelectric conversion element PD is held in the capacitance component (floating diffusion capacitance) of the node FD. As a result, the node FD becomes a potential corresponding to the amount of charge transferred from the photoelectric conversion element PD by the charge-voltage conversion by the floating diffusion capacitance.

The select transistor M4 connects the amplifier transistor M3 to the vertical output line 16A (or the vertical output line 16B) by turning on. The amplifier transistor M3 has a configuration in which a voltage VDD is supplied to the drain and a bias current is supplied from a current source (a current source circuit 44 described later) (not illustrated) to the source via the select transistor M4, and constitutes an amplification unit (source follower circuit) having the gate as an input node. Accordingly, the amplifier transistor M3 outputs a signal based on the potential of the node FD to the vertical output line 16A (or the vertical output line 16B) via the select transistor M4. In this sense, the amplifier transistor M3 and the select transistor M4 are an output unit that outputs the pixel signal corresponding to the amount of charge held in the node FD.

The reset transistor M2 has a function of controlling supply of a voltage (voltage VDD) for resetting the node FD serving as a charge holding portion to the FD node. The reset transistor M2 resets the node FD to a voltage corresponding to the voltage VDD by turning on.

Each of the column circuits 42 constituting the readout circuit 40A may include a current source circuit 44, a comparison circuit 54, and memories 62W and 62R, for example, as illustrated in FIG. 3. The current source circuit 44 may include n-channel transistors M7 and M8, for example. The comparison circuit 54 includes two input nodes (a non-inverting input node (+) and an inverting input node (−)) to which two signals to be compared are input, and one output node to which a signal indicating a comparison result is output, and may be configured by, for example, a differential amplifier circuit. The memory 62W includes two input nodes and one output node. The memory 62R includes two input nodes and one output node.

The current source circuit 44 serves as a load current source of the amplifier transistor M3 of the pixel 12. The transistor M7 functions as a cascode transistor, and the transistor M8 functions as a current source transistor. A drain of the transistor M7 is connected to the vertical output line 16A. A source of the transistor M7 is connected to a drain of the transistor M8. A connection node between the source of the transistor M7 and the drain of the transistor M8 is connected to the interconnection 18A. A source of the transistor M8 is connected to the ground voltage node (fixed voltage node). A voltage Vc is supplied from the bias circuit 30A to a gate of the transistor M7. A voltage Vb is supplied from the bias circuit 30A to a gate of the transistor M8.

FIG. 4A and FIG. 4B schematically illustrate a positional relationship between the vertical output line 16A and the interconnection 18A. FIG. 4A illustrates a planar positional relationship between the vertical output line 16A and the interconnection 18A, and FIG. 4B illustrates a cross-sectional view taken along the line A-A' of FIG. 4A. As illustrated in, e.g., FIG. 4A, the vertical output line 16A and the interconnection 18A are disposed adjacent to each other and parallel to each other. A parasitic capacitance Cp is formed between the vertical output line 16A and the interconnection 18A. In FIG. 4A and FIG. 4B, it is assumed that the vertical output line 16A and the interconnection 18A are formed with the same line width and line thickness in the same level interconnection layer, but the vertical output line 16A and the interconnection 18A may be formed with different level interconnection layers or may be formed with different line widths and/or different line thicknesses. The vertical output line 16A may be disposed so as to be sandwiched between two interconnections 18A connected to the same current source circuit 44.

The bias circuit 30A may include a current source 32 and n-channel transistors M9 and M10 as illustrated in, e.g., FIG. 5. One node of the current source 32 is connected to a power supply voltage node. The other node of the current source 32 is connected to a drain and a gate of the transistor M9. A source of the transistor M9 is connected to a drain and a gate of the transistor M10. A source of the transistor M10 is connected to the ground voltage node. A connection node between the drain and the gate of the transistor M9 is a node to which the voltage Vc is supplied, and a connection node between the drain and the gate of the transistor M10 is a node to which the voltage Vb is supplied. The voltages Vb and Vc are determined by a current value of the current source 32, and threshold voltages and sizes of the transistors M9 and M10.

As illustrated in, e.g., FIG. 6, a plurality of bias circuits 30A may be connected in parallel and arranged between columns at predetermined intervals. By connecting the plurality of bias circuits 30A in parallel, the variation of the voltages Vb and Vc may be suppressed, and the interference between the columns may be suppressed.

One input node (inverted input node) of the comparison circuit 54 is connected to the vertical output line 16A, and a voltage VOUT, which is an output signal of the pixel 12, is input from the vertical output line 16A thereto. The other input node (non-inverting input node) of the comparison circuit 54 is connected to the reference signal line 50. A reference signal VRAMP is input from the reference signal generation circuit 48A to the other input node of the comparison circuit 54 via the reference signal line 50.

One input node of the memory 62W is connected to the output node of the comparison circuit 54. The other input node of the memory 62W is connected to the count signal line 60. A count signal COUNT is input from the counter circuit 58A to the other input node of the memory 62W via the count signal line 60. One input node of the memory 62R is connected to the output node of the memory 62W. The other input node of the memory 62R is connected to the horizontal scanning circuit 70A. The output node of the memory 62R is connected to the horizontal output line 72A.

The comparison circuit 54 compares a level of the voltage VOUT supplied from the vertical output line 16A with a level of the reference signal VRAMP supplied from the reference signal line 50, and outputs a signal according to the comparison result. For example, the comparison circuit 54 outputs a high-level signal when the level of the reference signal VRAMP is lower than the level of the voltage VOUT. The comparison circuit 54 outputs a low-level signal when the level of the reference signal VRAMP is higher than the level of the voltage VOUT. The relationship between the relationship of the magnitudes of the input signals and the level of the output signal may be reversed.

The memory 62W holds the count value indicated by the count signal COUNT supplied from the counter circuit 58A at a timing when the level of the output node of the comparison circuit 54 is inverted, as digital data of the pixel signal. The memory 62R holds the digital data of the pixel signal transferred from the memory 62W. The digital data held in the memory 62R is sequentially transferred to the output circuit 80A via the horizontal output line 72A for each column according to the control signal supplied from the horizontal scanning circuit 70A. By providing the memory 62R after the memory 62W, the AD conversion processing may be performed in parallel with the transfer operation to the output circuit 80A.

Instead of providing the counter circuit 58A, the memory 62W of each of the column circuit 42 may have a function of the counter circuit. In this case, the memory 62W of the column circuit 42 of each column receives the common clock signal output from the control circuit 90 and counts pulses of the clock signal. The count value at the timing when the level of the output signal of the comparison circuit 54 is inverted becomes the digital data to be held in the memory 62W.

Since the column circuit 42 of the readout circuit 40B is the same as the column circuit 42 of the readout circuit 40A except that the column circuit 42 of the readout circuit 40A is arranged in a column different from the column in which the column circuit 42 of the readout circuit 40A is arranged, description thereof is omitted. Hereinafter, the column circuit 42 of the readout circuit 40A will be described, but the same applies to the column circuit 42 of the readout circuit 40B. In the following description, when the common explanations are described for the vertical output lines 16A and 16B, the interconnections 18A and 18B, the readout circuits 40A and 40B, or the like, the distinction between A and B is omitted, and they are sometimes referred to as the vertical output line 16, the interconnection 18, the readout circuit 40, or the like.

The photoelectric conversion device 100 according to the present embodiment may have a configuration in which all the functional blocks described above are arranged on one substrate, or may have a configuration in which the functional blocks are separately formed on a plurality of substrates as a stacked-type in which the plurality of substrates is stacked.

FIG. 7A is a schematic diagram of a case where a pixel substrate 110 in which the pixel array unit 10 is disposed and a circuit substrate 120 in which other functional blocks are disposed are stacked. By disposing the pixel substrate 110 and the circuit substrate 120 on different substrates, the size of the photoelectric conversion device 100 may be reduced without sacrificing the area of the pixel array unit 10.

FIG. 7B is a schematic diagram of a case where a pixel substrate 110 in which the pixel array unit 10 is disposed and circuit substrates 120 and 130 in which other functional blocks are disposed are stacked. Also in this case, the size of the photoelectric conversion device 100 may be reduced without sacrificing the area of the pixel array unit 10.

Note that the circuit elements constituting one functional block are not necessarily arranged on the same substrate, and may be arranged on different substrates.

Next, an operation of the photoelectric conversion device according to the present embodiment will be described with reference to FIG. 8. The timing chart of FIG. 8 illustrates waveforms of the control signals PTX and PRES, the reference signal VRAMP, and the voltage of the vertical output line 16A (voltage VOUT) connected to the pixel 12 to be read out.

It is assumed that the control signal PSEL (not illustrated) of the row to be read out is at high-level immediately before time t0. As a result, the select transistor M4 of each of the pixels 12 belonging to the corresponding row is turned on, and each of the pixels 12 may output a pixel signal to the vertical output line 16A of the corresponding column. It is assumed that, immediately before the time t0, the control signals PTX and PRES of the row to be read out are at low-level, and the reference signal VRAMP is a predetermined reference voltage.

During a period from the time t0 to time t1, the vertical scanning circuit 20 controls the control signal PRES of the row to be read out to high-level. Accordingly, the reset transistor M2 of each of the pixels 12 belonging to the corresponding row is turned on, and the node FD is reset to a voltage corresponding to the voltage VDD. A voltage VOUT corresponding to the reset voltage of the node FD (a pixel signal at the reset level of the pixel 12) is output to the vertical output line 16A connected to the pixel 12.

When the control signal PRES is changed from low-level to high-level at the time t0, the voltage of the node FD is increased by capacitive coupling between the gate and the source of the reset transistor M2, and the voltage VOUT is also increased accordingly. When the control signal PRES changes from high-level to low-level at the time t1, the voltage of the node FD is decreased by the capacitive coupling between the gate and the source of the reset transistor M2, and the voltage VOUT also decreases accordingly. The settling of the voltage VOUT accompanying the change in the gate voltage of the reset transistor M2 requires a certain time.

At a subsequent time t2, the reference signal generation circuit 48A starts a slope operation of gradually decreasing the voltage of the reference signal VRAMP with time. The counter circuit 58A starts counting up simultaneously with the start of the slope operation, and outputs a count signal COUNT indicating the count value to the column circuit 42A of each column via the count signal line 60.

The comparison circuit 54 of the column circuit 42A performs a comparison operation between the level of the voltage VOUT and the level of the reference signal VRAMP. The level of the output signal of the comparison circuit 54 is inverted at a timing when the magnitude relationship between the level of the voltage VOUT and the level of the reference signal VRAMP is changed, for example, at time t3 in FIG. 8.

The memory 62W of the column circuit 42A holds the count value indicated by the count signal COUNT output from the counter circuit 58A at the timing when the level of the output signal of the comparison circuit 54 is inverted, as digital data of the pixel signal of the reset level of the pixel 12. In this manner, the AD conversion of the pixel signal of the reset level of the pixel 12 is performed. After the digital data held in the memory 62W is transferred to the memory 62R, the digital data is transferred to the output circuit 80A in response to a control signal from the horizontal scanning circuit 70A.

At a subsequent time t4, the reference signal generation circuit 48A resets the reference signal VRAMP to a level of the reference voltage.

During a period from a subsequent time t5 to time t6, the vertical scanning circuit 20 controls the control signal PTX of the row to be read out to high-level. Thereby, the transfer transistor M1 of each of the pixel 12 belonging to the corresponding row is turned on, and charge accumulated in the photoelectric conversion element PD during the predetermined exposure period is transferred to the node FD. Thereby, the voltage of the node FD decreases according to an amount of charge transferred from the photoelectric conversion element PD, and the voltage VOUT of the vertical output line 16A also decreases. A voltage VOUT corresponding to the voltage of the node FD (pixel signal of the light signal level of the pixel 12) is output to the vertical output line 16A. It is to be noted that FIG. 8 illustrates a waveform corresponding to dark, and it is assumed that the voltage VOUT is settled at a reset level substantially the same as the reset level at the time t3 also after the time t6.

When the control signal PTX is changed from low-level to high-level at the time t5, the voltage of the node FD is increased by capacitive coupling between the gate and the drain of the transfer transistor M1, and the voltage VOUT is also increased accordingly. When the control signal PTX changes from high-level to low-level at the time t6, the voltage of the node FD is decreased by the capacitive coupling between the gate and the drain of the transfer transistor M1, and the voltage VOUT also decreases accordingly. The settling of the voltage VOUT accompanying the change in the gate voltage of the transfer transistor M1 requires a certain time.

At a subsequent time t7, the reference signal generation circuit 48A starts a slope operation in which the voltage of the reference signal VRAMP changes with time. The counter circuit 58A starts counting up simultaneously with the start of the slope operation, and outputs a count signal COUNT indicating the count value to the column circuit 42A of each column via the count signal line 60.

The comparison circuit 54 of the column circuit 42A performs a comparison operation between the level of the voltage VOUT and the level of the reference signal VRAMP. The level of the output signal of the comparison circuit 54 is inverted at a timing when the magnitude relationship between the level of the voltage VOUT and the level of the reference signal VRAMP is changed, for example, at a time t8 in FIG. 8.

The memory 62W of the column circuit 42A holds the count value indicated by the count signal COUNT output from the counter circuit 58A at the timing when the level of the output signal of the comparison circuit 54 is inverted, as digital data of the pixel signal of the light signal level of the pixel 12. In this manner, the AD conversion of the pixel signal of the light signal level of the pixel 12 is performed. After the digital data held in the memory 62W is transferred to the memory 62R, the digital data is transferred to the output circuit 80A in response to a control signal from the horizontal scanning circuit 70A.

The digital data of the pixel signal acquired in this manner is subjected to correction processing by digital CDS (Correlated Double Sampling) in the output circuit 80A of the subsequent stage. In the correction processing by the digital CDS, the digital data of the pixel signal of the reset level is subtracted from the digital data of the pixel signal of the light signal level, and the noise component superimposed on the pixel signal of the light signal level is removed.

As described above, when the gate voltages of the transfer transistor M1 and the reset transistor M2 are changed, the voltage VOUT of the vertical output line 16A is changed by the capacitive coupling between the gates of these transistors and the node FD. Since the settling of the potential of the vertical output line 16A requires a certain time, the time required for the settling may be a factor that limits the operating speed of the photoelectric conversion device. Also, even when the potential of the vertical output line 16A varies due to other factors, it is preferable to shorten the time required for settling.

In this respect, in the photoelectric conversion device according to the present embodiment, as illustrated in FIG. 1, FIG. 3, FIG. 4A, and FIG. 4B, the interconnection 18A connected to the drain of the transistor M8 constituting the current source circuit 44 is disposed adjacent to and parallel to the vertical output line 16A. By disposing the vertical output line 16A and the interconnection 18A adjacent to each other, as illustrated in FIG. 4A and FIG. 4B, a parasitic capacitance Cp is formed between the vertical output line 16A and the interconnection 18A. With this configuration, when the potential of the vertical output line 16A decreases at time t1 and time t6 in FIG. 8, a current flows from the drain of the transistor M8 to the parasitic capacitance Cp via the interconnection 18A. By increasing the current flowing through the transistor M7 by the amount of the current, the decrease in the potential of the vertical output line 16A is accelerated. When the voltage VOUT of the vertical output line 16A increases, the current of the transistor M7 decreases by an amount by which a current flows into the drain of the transistor M8 via the interconnection 18A, and the increase in the voltage VOUT of the vertical output line 16A is accelerated. This makes it possible to accelerate the settling of the potential of the vertical output line 16A.

From the viewpoint of suppressing variation in the potential of the interconnection 18A due to increase or decrease in the current of the transistor M7, it is preferable that the transconductance gm of the transistor M7 is large. For example, the transconductance gm of the transistor M7 is desirably larger than the transconductance gm of the transistor M8.

Further, in the photoelectric conversion device according to the present embodiment, since a negative capacitance circuit described in, e.g., Japanese Patent Application Laid-Open No. 2019-030002 is not connected to the vertical output line 16A, it is possible to suppress power consumption and an increase in area due to addition of the negative capacitance circuit, and narrowing of the voltage range of the vertical output line 16A. For example, when the source follower circuit is connected to the vertical signal line as illustrated in FIG. 7 of Japanese Patent Application Laid-Open No. 2019-030002, the lower limit of the voltage of the vertical signal line is limited by the voltage at which the source follower circuit operates.

When the interconnection 18A is a power supply line, a ground voltage line, a control line of the pixel 12, or the like, since the current of the transistor M7 does not increase, the settling cannot be accelerated as in the present embodiment. In other words, in the present embodiment, the interconnection 18A connected to the drain of the transistor M8 is adjacent to the vertical output line 16A to suppress the formation of a parasitic capacitance between the vertical output line 16A and the other interconnections, thereby accelerating the settling.

Further, in the present embodiment, by the shielding effect of the interconnections 18A and 18B, it is possible to suppress interference or the like from the vertical output line 16A to the node FD of the pixel 12 in another column. That is, the interconnection 18A or the interconnection 18B is disposed between the pixel 12 to which the vertical output line 16A is connected and the pixel 12 to which the vertical output line 16B is connected, so that interference from the vertical output line 16A to the pixel 12 connected to the vertical output line 16B may be suppressed.

There is a certain effect on speeding up only by providing the interconnections 18A in parallel adjacent to the vertical output lines 16A outside the area of the pixel array unit 10. However, also in the pixel array unit 10, by disposing the interconnection 18A adjacent to the vertical output line 16A, the parasitic capacitance increases, and the effect of speeding up is further increased. Further, by disposing the interconnection 18A in the pixel array unit 10, it is possible to suppress interference between columns generated in the pixel array unit 10.

As described above, according to the present embodiment, the operation speed of the photoelectric conversion device may be increased while suppressing the increase in power consumption and chip area.

Second Embodiment

Figure 9:
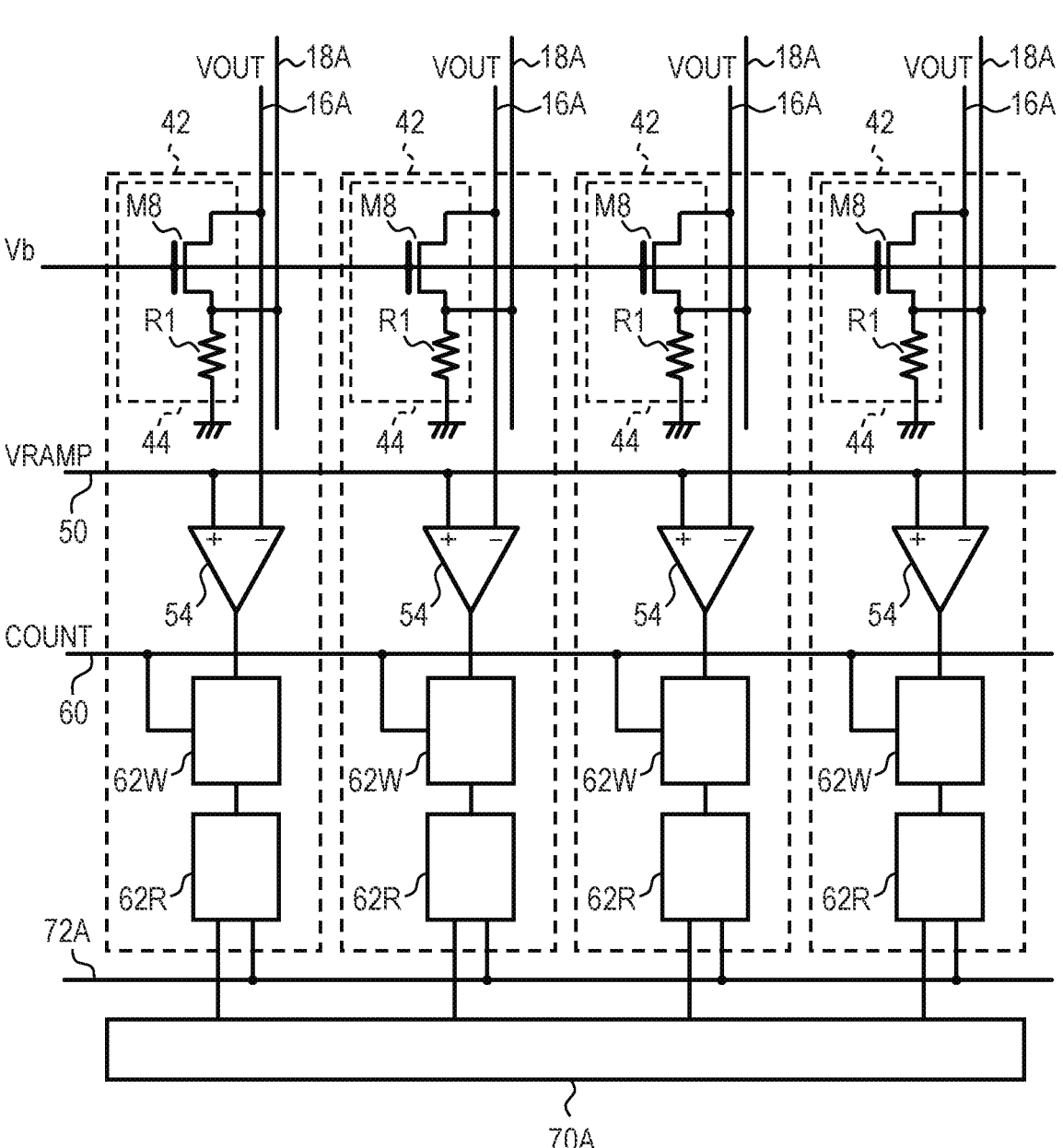
FIG. 9 is a circuit diagram illustrating a configuration example of a column circuit in a photoelectric conversion device according to a second embodiment of the present invention.
Figure 10:
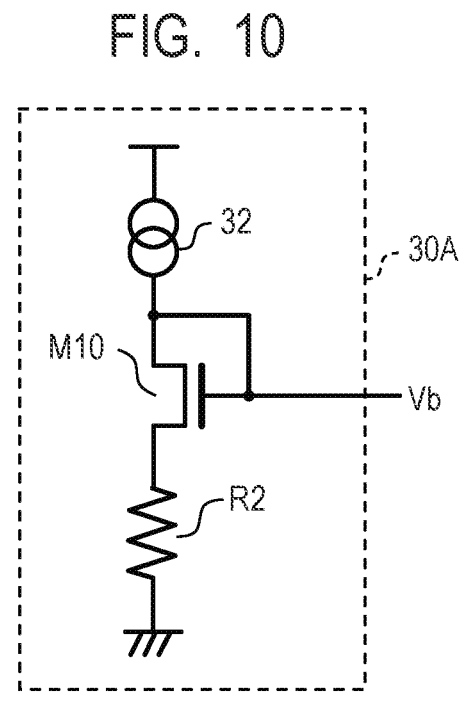

A photoelectric conversion device and a method of driving the same according to a second embodiment of the present invention will be described with reference to FIG. 9 and FIG. 10. Components similar to those of the photoelectric conversion device according to the first embodiment are denoted by the same reference numerals, and description thereof will be omitted or simplified. FIG. 9 is a circuit diagram illustrating a configuration example of a column circuit in the photoelectric conversion device according to the present embodiment. FIG. 10 is a circuit diagram illustrating a configuration example of a bias circuit in the photoelectric conversion device according to the present embodiment.

The photoelectric conversion device according to the present embodiment is the same as the photoelectric conversion device according to the first embodiment except that the bias circuit 30 and the current source circuit 44 are different in configuration. In the present embodiment, differences from the photoelectric conversion device according to the first embodiment will be mainly described, and description of the same portions as those of the photoelectric conversion device according to the first embodiment will be appropriately omitted.

As illustrated in, e.g., FIG. 9, the current source circuit 44 in the photoelectric conversion device according to the present embodiment may include a transistor M8 and a resistor R1. A drain of the transistor M8 is connected to the vertical output line 16A. A source of the transistor M8 is connected to one terminal of the resistor R1. The other terminal of the resistor R1 is connected to a ground voltage node (fixed voltage node). A voltage Vb is supplied from the bias circuit 30A to agate of the transistor M8.

As illustrated in, e.g., FIG. 10, the bias circuit 30A may include a current source 32, a transistor M10, and a resistor R2. One node of the current source 32 is connected to a power supply voltage node. The other node of the current source 32 is connected to a drain and a gate of the transistor M10. A source of the transistor M10 is connected to one terminal of the resistor R2. The other terminal of the resistor R2 is connected to a ground voltage node. A connection node between the drain and the gate of the transistor M10 is a node to which the voltage Vb is supplied. The voltage Vb is determined by the current value of the current source 32, the threshold voltage and size of the transistor M10, and the resistance value of the resistor R2. As the resistor R1 of the current source circuit 44 and the resistor R2 of the bias circuit 30A, for example, a resistor using polycrystalline silicon or a transistor operating in a linear region may be applied.

Also in the photoelectric conversion device according to the present embodiment, it is possible to accelerate the settling of the potential of the vertical output line 16 similarly to the photoelectric conversion device according to the first embodiment. For example, when the potential of the vertical output line 16 increases, a current flows into the source of the transistor M8 via the parasitic capacitance Cp between the vertical output line 16 and the interconnection 18, and the source potential increases. By increasing the source potential of the transistor M8 and decreasing the current flowing through the transistor M8, the increase in the potential of the vertical output line 16 is increased.

However, from the viewpoint of suppressing variation in the voltage Vb supplied to the gate of the transistor M8, the configuration of the first embodiment is preferable. This is because the voltage between the gate and the source of the transistor M8 is always kept substantially constant in the first embodiment, whereas the source potential of the transistor M8 varies according to the current flowing from the interconnection 18 to the source of the transistor M8 in the present embodiment. The variation in the source potential of the transistor M8 may cause the voltage Vb to be varied via the gate-source capacitance of the transistor M8. Since the variation of the voltage Vb may cause the interference between the columns, the first embodiment is preferable from the viewpoint of suppressing the interference between the columns.

As described above, according to the present embodiment, the operation speed of the photoelectric conversion device may be increased while suppressing the increase in power consumption and chip area.

Third Embodiment

Figure 11A:
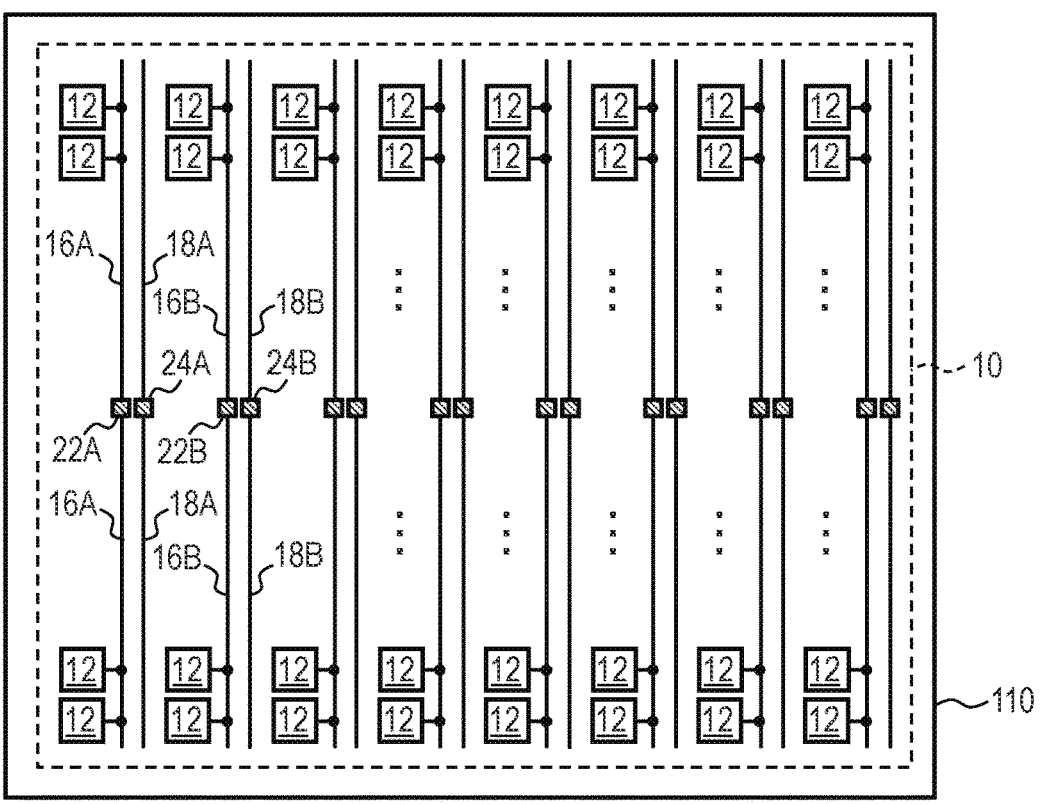
FIG. 11A and FIG. 11B are schematic diagrams illustrating a configuration example of a photoelectric conversion device according to a third embodiment of the present invention.
Figure 11B:
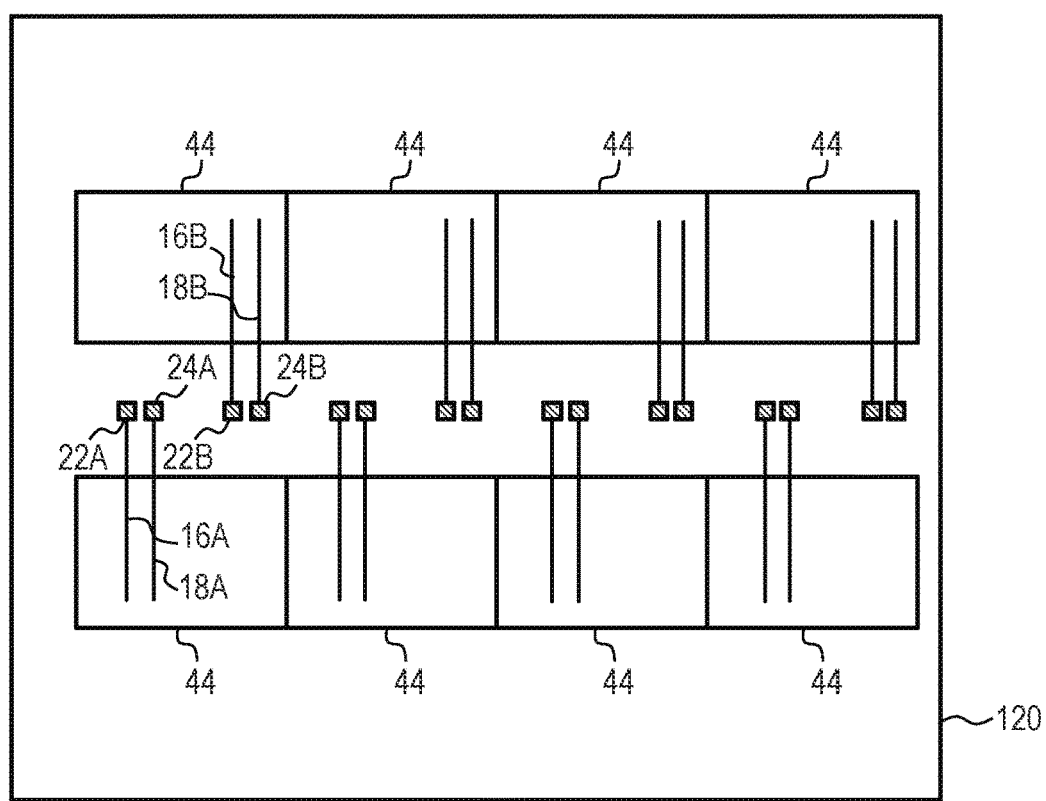
Figure 12A:
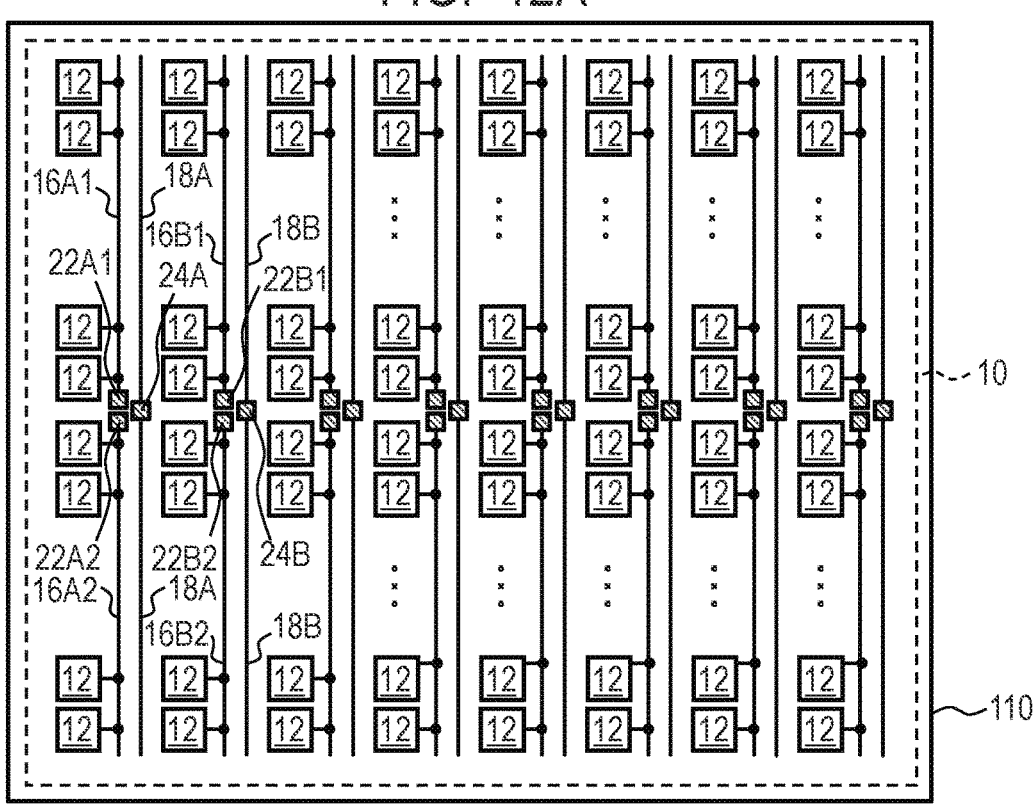
FIG. 12A and FIG. 12B are schematic diagrams illustrating a configuration example of a photoelectric conversion device according to a fourth embodiment of the present invention.
Figure 12B:
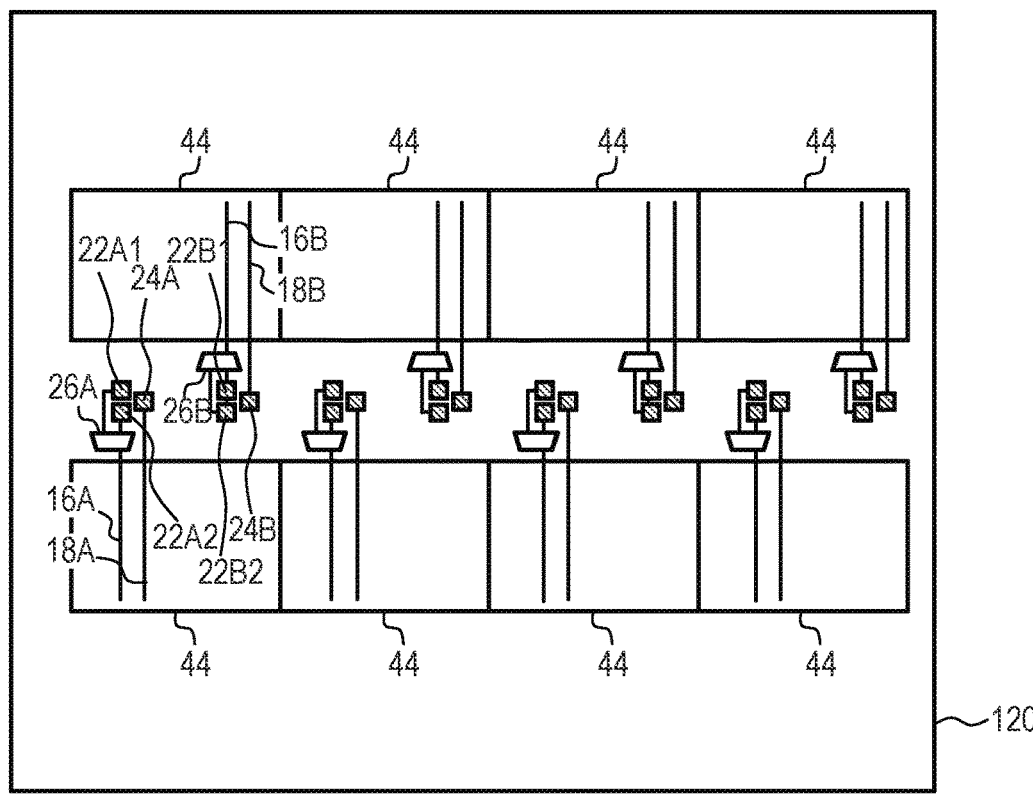

A photoelectric conversion device according to a third embodiment of the present invention will be described with reference to FIG. 11A and FIG. 11B. Components similar to those of the photoelectric conversion device according to the first or second embodiment are denoted by the same reference numerals, and description thereof will be omitted or simplified. FIG. 11A and FIG. 11B are schematic diagrams illustrating a configuration example of the photoelectric conversion device according to the present embodiment.

In the present embodiment, an example of connection between the pixel array unit 10 and the current source circuit 44 when the photoelectric conversion device is formed of a plurality of substrates will be described. In the present embodiment, differences from the photoelectric conversion device according to the first or second embodiment will be mainly described, and description of the same portions as those of the photoelectric conversion device according to the first or second embodiment will be appropriately omitted.

The photoelectric conversion device according to the present embodiment is a stacked-type photoelectric conversion device including a pixel substrate 110 in which the pixel array unit 10 is disposed and a circuit substrate 120 in which other circuit blocks are disposed. FIG. 11A is a plan view of the pixel substrate 110, and FIG. 11B is a plan view of the circuit substrate 120. The photoelectric conversion device according to the present embodiment is formed by stacking the substrates so as to overlap each other in a planar manner. FIG. 11A and FIG. 11B illustrate eight columns out of a plurality of columns constituting the pixel array unit 10, and a plurality of current source circuits 44 corresponding to each column. FIG. 11A and FIG. 11B illustrate the vertical output lines 16A and the interconnections 18A arranged in odd-numbered columns, the vertical output lines 16B and the interconnections 18B arranged in even-numbered columns, and the electrical connecting portions 22A, 24A, 22B and 24B between the pixel substrate 110 and the circuit substrate 120. In order to simplify the drawings, descriptions of other components are omitted.

As illustrated in FIG. 11A and FIG. 11B, the pixel array unit 10 is disposed on the pixel substrate 110, and the current source circuit 44 is disposed on the circuit substrate 120. Each of the vertical output lines 16A is divided into a portion disposed on the pixel substrate 110 and a portion disposed on the circuit substrate 120, and these portions are connected to each other via the connecting portion 22A. Similarly, each of the vertical output lines 16B is divided into a portion disposed on the pixel substrate 110 and a portion disposed on the circuit substrate 120, and these portions are connected to each other via the connecting portion 22B. Further, each of the interconnections 18A is divided into a portion disposed on the pixel substrate 110 and a portion disposed on the circuit substrate 120, and these portions are connected to each other via the connecting portion 24A. Similarly, each of the interconnection 18B is divided into a portion disposed on the pixel substrate 110 and a portion disposed on the circuit substrate 120, and these portions are connected to each other via the connecting portion 24B. The connecting portions 22A, 24A, 22B and 24B are disposed near the center row among the plurality of rows constituting the pixel array unit 10.

Thus, each of the pixels 12 on the odd-numbered columns is connected to the current source circuit 44 via the vertical output line 16A disposed on the pixel substrate 110, the connecting portion 22A, and the vertical output line 16A disposed on the circuit substrate 120. Similarly, each of the pixels 12 on the even-numbered columns is connected to the current source circuit 44 via the vertical output line 16B disposed on the pixel substrate 110, the connecting portion 22B, and the vertical output line 16B disposed on the circuit substrate 120. Each of the interconnections 18A disposed on the pixel substrate 110 is connected to the current source circuit 44 via the connecting portion 24A and the interconnection 18A disposed on the circuit substrate 120. Similarly, each of the interconnections 18B disposed on the pixel substrate 110 is connected to the current source circuit 44 via the connecting portion 24B and the interconnection 18B disposed on the circuit substrate 120.

As described above, in the present embodiment, in the stacked-type photoelectric conversion device, the vertical output lines 16A and 16B and the interconnections 18A and 18B, and the current source circuits 44 are connected via the connecting portions 22A, 22B, 24A and 24B disposed near the center pixel row. With this configuration, the distance from the current source circuit 44 to the upper and lower ends of the vertical output lines 16A and 16B arranged on the pixel substrate 110 may be shortened, and parasitic resistance and parasitic capacitance accompanying the vertical output lines 16A and 16B arranged on the pixel substrate 110 may be reduced. Thus, in, e.g., the pixel substrate 110, the potential of the interconnection 18 may be suppressed from varying due to interference from another interconnection to the interconnection 18, and degradation of image quality may be reduced.

As described above, according to the present embodiment, the operation speed of the photoelectric conversion device may be increased while suppressing the increase in power consumption and chip area.

Fourth Embodiment

A photoelectric conversion device according to a fourth embodiment of the present invention will be described with reference to FIG. 12A to FIG. 13B. Components similar to those of the photoelectric conversion devices according to the first to third embodiments are denoted by the same reference numerals, and description thereof will be omitted or simplified. FIG. 12A to FIG. 13B are schematic diagrams illustrating a configuration example of the photoelectric conversion device according to the present embodiment.

In the present embodiment, as in the third embodiment, an example of connection between the pixel array unit 10 and the current source circuit 44 when the photoelectric conversion device is formed of a plurality of substrates will be described. In the present embodiment, differences from the photoelectric conversion devices according to the first to third embodiments will be mainly described, and description of the same portions as those of the photoelectric conversion devices according to the first to third embodiments will be appropriately omitted.

In the present embodiment, each of the vertical output lines 16A disposed on the pixel substrate 110 is divided into a vertical output line 16A1 and a vertical output line 16A2 in the vicinity of a center row among a plurality of rows. Each of the vertical output lines 16B disposed on the pixel substrate 110 is divided into a vertical output line 16B1 and a vertical output line 16B2 in the vicinity of the center row among the plurality of rows. Each of the connecting portions 22A is divided into connecting portions 22A1 and 22A2 corresponding to the vertical output lines 16A1 and 16A2, and each of the connecting portions 22B is divided into connecting portions 22B1 and 22B2 corresponding to the vertical output lines 16B1 and 16B2. The connecting portions 22A1 and 22A2 of each column are connected to a selection circuit (multiplexer) 26A disposed on the circuit substrate 120, and the selection circuit 26A is configured to select one of the vertical output line 16A1 and the vertical output line 16A2 and connect the selected one to the vertical output line 16A disposed on the circuit substrate 120. Further, the connecting portions 22B1 and 22B2 of each column are connected to a selection circuit 26B disposed on the circuit substrate 120, and the selection circuit 26B is configured to select one of the vertical output line 16B1 and the vertical output line 16B2 and connect the selected one to the vertical output line 16B disposed on the circuit substrate 120. Similarly to the third embodiment, the interconnections 18A and 18B disposed on the pixel substrate 110 are connected to the interconnections 18A and 18B disposed on the circuit substrate 120 via the connecting portions 24A and 24B.

In the readout operation, the selection circuit 26A selects the vertical output line 16A1 and the selection circuit 26B selects the vertical output line 16B1 and the readout operation is sequentially performed on the pixels 12 on the rows corresponding to the vertical output lines 16A1 and 16B1. Then, the selection circuit 26A selects the vertical output line 16A2 and the selection circuit 26B selects the vertical output line 16B2, and the readout operation is sequentially performed on the pixels 12 on the rows corresponding to the vertical output lines 16A2 and 16B2. When readout is performed from one of the vertical output lines 16A1 and 16B1 and the vertical output lines 16A2 and 16B2 and the readout is not performed from the other, the potential of the other vertical output lines which are not readout may be held at a fixed potential such as a power supply voltage.

The interconnections 18A and 18B are connected to the current source circuit 44 both when reading out the pixels 12 on the row corresponding to the vertical output lines 16A1 and 16B1 and when reading out the pixels 12 on the row corresponding to the vertical output lines 16A2 and 16B2. Therefore, as in the case of the above-described embodiments, it is possible to accelerate the potential settling of the vertical output lines 16A1, 16A2, 16B1 and 16B2.

Figure 13A:
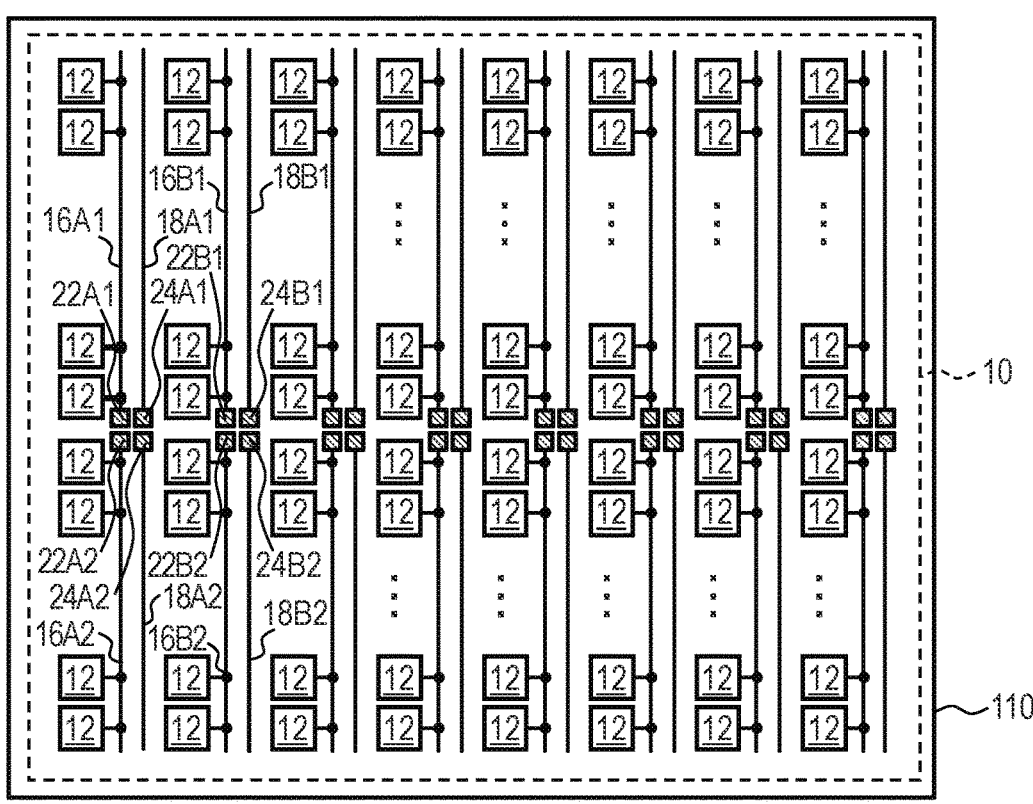
FIG. 13A and FIG. 13B are schematic diagrams illustrating another configuration example of the photoelectric conversion device according to the fourth embodiment of the present invention.
Figure 13B:
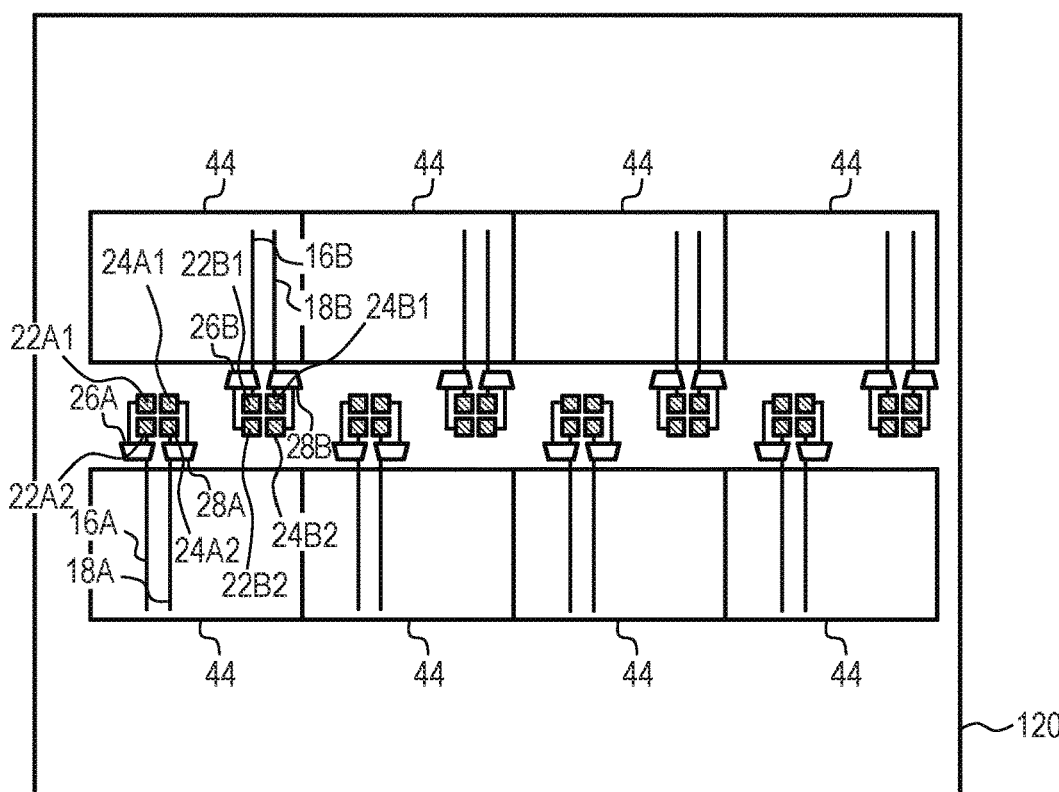

Alternatively, as illustrated in, e.g., FIG. 13A and FIG. 13B, the interconnections 18A and 18B disposed on the pixel substrate 110 may be divided into the interconnections 18A1 and 18B1 and the interconnections 18A2 and 18B2 in the vicinity of the center row among the plurality of rows, similarly to the vertical output lines 16A and 16B. Each of the connecting portion 24A is divided into connecting portions 24A1 and 24A2 corresponding to the interconnections 18A1 and 18A2, and each of the connecting portion 24B is divided into connecting portions 24B1 and 24B2 corresponding to the interconnections 18B1 and 18B2. The connecting portions 24A1 and 24A2 of each column are connected to a selection circuit 28A disposed on the circuit substrate 120, and the selection circuit 28A is configured to select one of the interconnections 18A1 and 18A2 and connect the selected one to the interconnections 18A disposed on the circuit substrate 120. Further, the connecting portions 24B1 and 24B2 of each column are connected to a selection circuit 28B disposed on the circuit substrate 120, and the selection circuit 28B is configured to select one of the interconnections 18B1 and 18B2 and connect the selected one to the interconnections 18B disposed on the circuit substrate 120.

In the readout operation, the selection circuit 28A selects the interconnection 18A1 and the selection circuit 28B selects the interconnection 18B1 corresponding to the readout operation of the pixels 12 on the rows corresponding to the vertical output lines 16A1 and 16B1. Then, the selection circuit 28A selects the interconnection 18A2 and the selection circuit 28B selects the interconnection 18B2 corresponding to the readout operation of the pixels 12 on the rows corresponding to the vertical output lines 16A2 and 16B2. As a result, when reading out from the pixels 12 on the rows corresponding to the vertical output lines 16A1 and 16B1, it is possible to accelerate the potential settling of the vertical output lines 16A1 and 16B1 as in the case of the above-described embodiments. Also, when reading out from the pixels 12 on the rows corresponding to the vertical output lines 16A2 and 16B2, it is possible to accelerate the potential settling of the vertical output line 16A2 and 16B2, as in the case of the above-described embodiments. When readout is performed from one of the vertical output lines 16A1 and 16B1 and the vertical output lines 16A2 and 16B2 and readout is not performed from the other, the potential of the interconnections 18 corresponding to the vertical output lines 16 where readout is not performed may be held at a fixed potential such as a power supply voltage or a ground voltage.

As described above, according to the present embodiment, the operation speed of the photoelectric conversion device may be increased while suppressing the increase in power consumption and chip area.

Fifth Embodiment

Figure 14A:
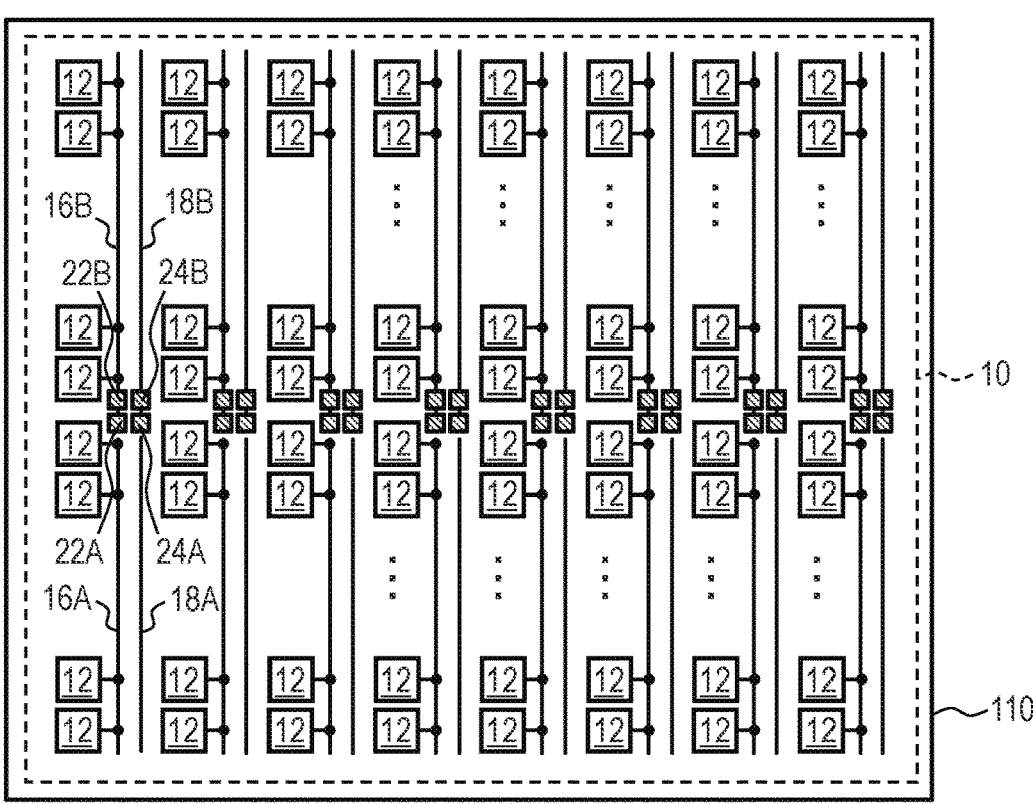
FIG. 14A and FIG. 14B are schematic diagrams illustrating a configuration example of a photoelectric conversion device according to a fifth embodiment of the present invention.
Figure 14B:
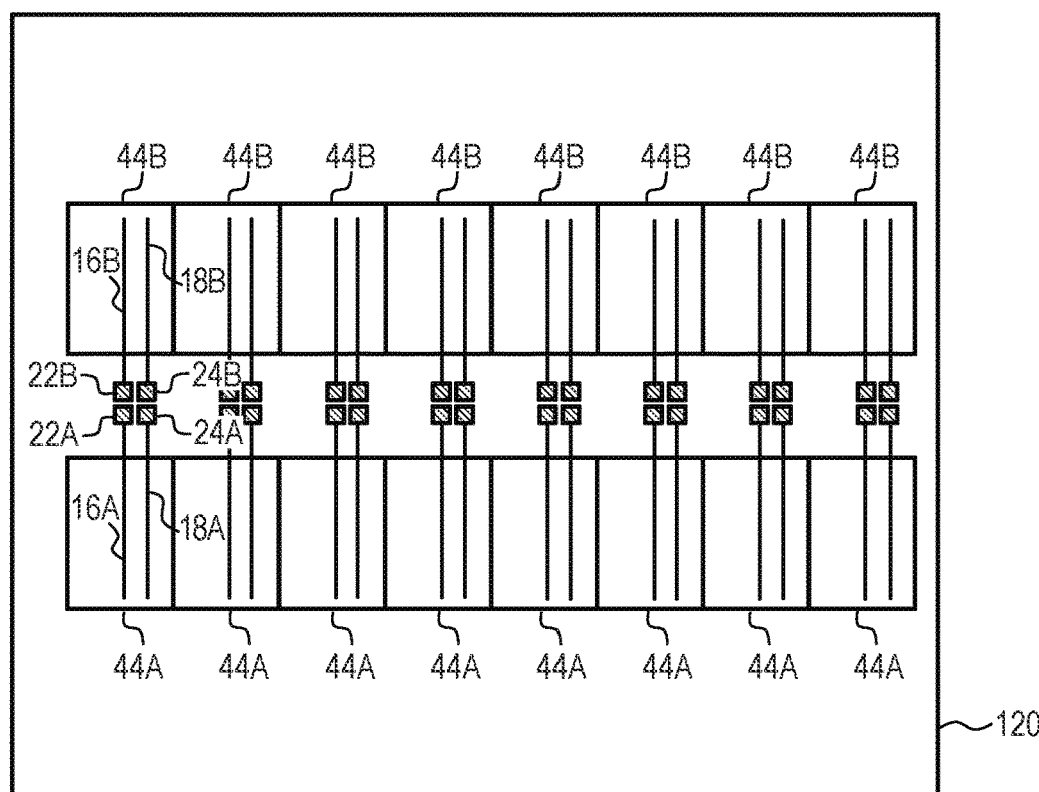

A photoelectric conversion device according to a fifth embodiment of the present invention will be described with reference to FIG. 14A and FIG. 14B. Components similar to those of the photoelectric conversion devices according to the first to fourth embodiments are denoted by the same reference numerals, and description thereof will be omitted or simplified. FIG. 14A and FIG. 14B are schematic diagrams illustrating a configuration example of the photoelectric conversion device according to the present embodiment.

Also in the present embodiment, similarly to the third and fourth embodiments, an example of connection between the pixel array unit 10 and the current source circuit 44 when the photoelectric conversion device is formed of a plurality of substrates will be described. In the present embodiment, differences from the photoelectric conversion devices according to the first to fourth embodiments will be mainly described, and description of the same portions as those of the photoelectric conversion devices according to the first to fourth embodiments will be appropriately omitted.

In the present embodiment, the vertical output lines 16 of each column disposed on the pixel substrate 110 are divided into a vertical output line 16A and a vertical output line 16B in the vicinity of a center row among a plurality of rows. The connecting portion 22 of each column is divided into connecting portions 22A and 22B corresponding to the vertical output lines 16A and 16B. Each of the vertical output lines 16A disposed on the pixel substrate 110 is connected to the current source circuit 44A via the connecting portion 22A and the vertical output line 16A disposed on the circuit substrate 120. Each of the vertical output lines 16B disposed on the pixel substrate 110 is connected to the current source circuit 44B via the connecting portion 22B and the vertical output line 16B disposed on the circuit substrate 120.

Similarly, the interconnections 18 of each column disposed on the pixel substrate 110 are divided into interconnections 18A and 18B in the vicinity of the center row among the plurality of rows. The connecting portion 24 of each column is divided into connecting portions 24A and 24B corresponding to the interconnections 18A and 18B.

Each of the interconnections 18A disposed on the pixel substrate 110 is connected to the current source circuit 44A via the connecting portion 24A and the interconnection 18A disposed on the circuit substrate 120. Each of the interconnection 18B disposed on the pixel substrate 110 is connected to the current source circuit 44B via the connecting portion 24B and the interconnection 18B disposed on the circuit substrate 120.

By configuring the photoelectric conversion device in this manner, even when the vertical output line 16 of each column is divided into two, i.e., the vertical output line 16A and the vertical output line 16B, it is possible to obtain the effect of accelerating the potential settling described in the above embodiments.

As described above, according to the present embodiment, the operation speed of the photoelectric conversion device may be increased while suppressing the increase in power consumption and chip area.

In the fourth and fifth embodiments, the vertical output lines 16 and the interconnections 18 of each column are divided into two, but the vertical output lines 16 and the interconnections 18 of each column may be divided into three or more. In this case, the number of divisions of the vertical output lines 16 and the number of divisions of the interconnections 18 may be the same or different. Further, a plurality of connecting portions 22 and a plurality of connecting portions 24 may be arranged for each of the divided vertical output lines 16 and the interconnections 18.

Sixth Embodiment

Figure 15:
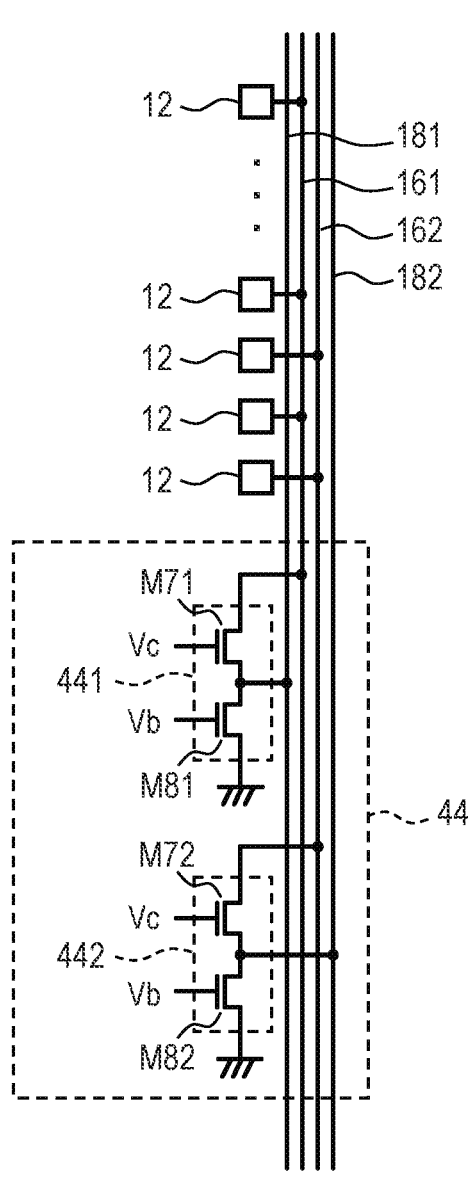
FIG. 15 is a circuit diagram illustrating a configuration example of a photoelectric conversion device according to a sixth embodiment of the present invention.
Figures 16A, 16B:
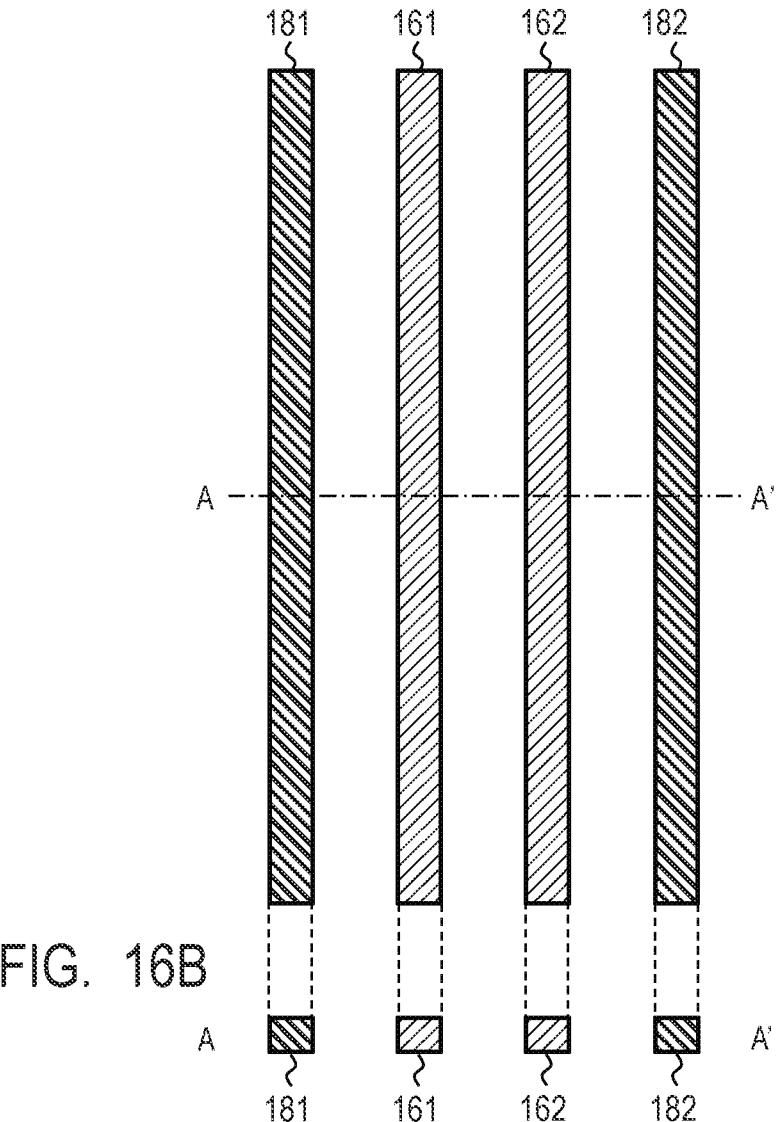
FIG. 16A and FIG. 16B are diagrams illustrating an example of arrangement of vertical output lines and interconnections in the photoelectric conversion device according to the sixth embodiment of the present invention.

A photoelectric conversion device according to a sixth embodiment of the present invention will be described with reference to FIG. 15 to FIG. 18E. Components similar to those of the photoelectric conversion devices according to the first to fifth embodiments are denoted by the same reference numerals, and description thereof will be omitted or simplified. FIG. 15 is a circuit diagram illustrating a configuration example of the photoelectric conversion device according to the present embodiment. FIG. 16A and FIG. 16B are diagrams illustrating an example of arrangement of the vertical output lines and the interconnections in the photoelectric conversion device according to the present embodiment. FIG. 17A to FIG. 18E are diagrams illustrating another arrangement example of the vertical output lines and the interconnections in the photoelectric conversion device according to the present embodiment.

The photoelectric conversion device according to the present embodiment is the same as the photoelectric conversion device according to the first embodiment except that the number of vertical output lines 16 and interconnections 18 arranged in each column of the pixel array unit 10 and the configuration of the current source circuit 44 are different. In the present embodiment, differences from the photoelectric conversion device according to the first embodiment will be mainly described, and description of the same portions as those of the photoelectric conversion device according to the first embodiment will be appropriately omitted.

FIG. 15 illustrates, among the components of the photoelectric conversion device according to the present embodiment, the vertical output lines 16 and the interconnections 18 arranged in one pixel column of the pixel array unit 10, and the pixels 12 and the current source circuit 44 connected to the vertical output lines 16 and the interconnections 18. Other portions of the photoelectric conversion device according to the present embodiment are similar to those of the photoelectric conversion device according to the first embodiment.

In the photoelectric conversion device according to the present embodiment, as illustrated in FIG. 15, two vertical output lines 16 (vertical output lines 161 and 162) and two interconnections 18 (interconnections 181 and 182) are disposed in each pixel column of the pixel array unit 10. The pixels 12 in each row are connected to one of the vertical output line 161 and the vertical output line 162. The current source circuit 44 includes a current source circuit 441 connected to the vertical output line 161 and the interconnection 181, and a current source circuit 442 connected to the vertical output line 162 and the interconnection 182. Each of the current source circuit 441 and the current source circuit 442 may be similar to the current source circuit 44 according to the first embodiment described with reference to FIG. 3. The current source circuit 441 and the current source circuit 442 may be the current source circuit 44 of the second embodiment described with reference to FIG. 9. The connection between the vertical output line 161 and the interconnection 181, and the current source circuit 441, and the connection between the vertical output line 162 and the interconnection 182, and the current source circuit 442 are the same as the connection between the vertical output line 16 and the interconnection 18, and the current source circuit 44 in the first embodiment. By disposing a plurality of vertical output lines 16 in one pixel column, signals of the pixels 12 in a plurality of rows may be simultaneously read out.

FIG. 16A and FIG. 16B schematically illustrate a positional relationship between the vertical output lines 161 and 162 and the interconnections 181 and 182. FIG. 16A illustrates a planar positional relationship between the vertical output lines 161 and 162 and the interconnections 181 and 182, and FIG. 16B illustrates a cross-sectional view taken along line A-A' of FIG. 16A. As illustrated in FIG. 16A and FIG. 16B, the interconnections 181 and 182 are disposed so as to sandwich the vertical output lines 161 and 162 in a plan view. The interconnection 181 is disposed adjacent to the vertical output line 161, and the interconnection 182 is disposed adjacent to the vertical output line 162. Therefore, even in the photoelectric conversion device according to the present embodiment in which the plurality of vertical output lines 16 are arranged in each pixel column, it is possible to accelerate the potential settling of the vertical output lines 161 and 162 as in the case of the embodiments described above. In addition, by arranging the vertical output lines 161 and 162 and the interconnections 181 and 182 in this order, the potentials of the vertical output lines 161 and 162 may be driven at high speed, and the difference in the characteristics of the vertical output lines 161 and 162 hardly occurs. In addition, since no interconnection is provided between the vertical output lines 161 and 162, the number of interconnections may be reduced.

In the present embodiment, since no other interconnection is provided between the vertical output line 161 and the vertical output line 162, parasitic capacitance may be formed between the vertical output line 161 and the vertical output line 162. However, since the tendency of the potential change of the vertical output lines 161 and 162 accompanying the potential change of the control signals PTX and PRES becomes the same, the parasitic capacitance between the vertical output lines 161 and 162 hardly contributes to the load capacitance.

In FIG. 16A and FIG. 16B, it is assumed that the vertical output lines 161 and 162 and the interconnections 181 and

182 are formed in the interconnection layer of the same level with the same line width and the same line thickness. However, the vertical output lines 161 and 162 and the interconnections 181 and 182 may be formed by interconnection layers of different levels, or may have different line widths and different line thicknesses.

FIG. 17A to FIG. 18E illustrate other arrangement examples of the plurality of vertical output lines 16 and the plurality of interconnections 18 arranged in the same pixel column. FIG. 17A to FIG. 17C illustrate planar positional relationships between the vertical output lines 16 and the interconnections 18, and FIG. 18A to FIG. 18E illustrate cross-sectional views of the vertical output lines 16 and the interconnections 18.

The lengths of the vertical output lines 161 and 162 and the interconnections 181 and 182 are not particularly limited. Although the vertical output lines 161 and 162 and the interconnections 181 and 182 are illustrated as having the same length in FIG. 16A, the lengths of the vertical output lines 161 and 162 and the interconnections 181 and 182 may be different from each other, for example, as illustrated in FIG. 17A. Although the vertical output lines 161 and 162 are longer than the interconnections 181 and 182 in FIG. 17A, the interconnections 181 and 182 may be longer than the vertical output lines 161 and 162. The lengths of the vertical output lines 161 and 162 are not necessarily the same. The same applies to the lengths of the interconnections 181 and 182.

The intervals between the vertical output lines 161 and 162 and the interconnections 181 and 182 are not particularly limited. Although FIG. 16A and FIG. 16B illustrate an example in which the vertical output lines 161 and 162 and the interconnections 181 and 182 are arranged at equal intervals, the interval between the vertical output lines 161 and 162 may be widen as illustrated in, e.g., FIG. 17B. This arrangement also has an effect of reducing parasitic capacitance between the vertical output lines 161 and 162.

As illustrated in FIG. 17C, in a plan view, two interconnections 181 may be disposed so as to sandwich the vertical output line 161, and two interconnections 182 may be disposed so as to sandwich the vertical output line 162. With such a configuration, the number of interconnections increases as compared with the configuration example of FIG. 16A and FIG. 16B, but the influence of interference that may occur when the signal amplitude of the vertical output line 161 and the signal amplitude of the vertical output line 162 are different may be reduced.

The number of interconnection layers constituting the vertical output lines 161 and 162 and the interconnections 181 and 182 is not necessarily one, and may be plural. In FIG. 16A and FIG. 16B, the vertical output lines 161 and 162 and the interconnections 181 and 182 are formed of one interconnection layer, but, as illustrated in, e.g., FIG. 18A, each of the vertical output lines 161 and 162 and the interconnections 181 and 182 may be formed of two interconnection layers. The interconnection layers may be electrically connected to each other as appropriate with a via layer. In FIG. 18A, each of the vertical output lines 161 and 162 and the interconnections 181 and 182 is formed of two interconnection layers, but may be formed of three or more interconnection layers. By forming each of the vertical output lines 161 and 162 and the interconnections 181 and 182 with a plurality of interconnection layers, even when one of the interconnection layers is disconnected, if another interconnection layer is connected, a defective chip may be avoided, and an improvement in yield may be expected.

The number of interconnection layers constituting the vertical output lines 161 and 162 is not necessarily the same as the number of interconnection layers constituting the interconnections 181 and 182. For example, as illustrated in FIG. 18B, the vertical output lines 161 and 162 may be formed of one interconnection layer, and the interconnections 181 and 182 may be formed of three interconnection layers. The number of interconnection layers constituting the vertical output lines 161 and 162 and the number of interconnection layers constituting the interconnections 181 and 182 may be arbitrarily selected.

When the number of interconnection layers forming the interconnections 181 and 182 is larger than the number of interconnection layers forming the vertical output lines 161 and 162, as illustrated in, e.g., FIG. 18C, the vertical output lines 161 and 162 and the interconnections 181 and 182 may overlap each other in a plan view. By configuring the interconnections 181 and 182 in this manner, it is possible to prevent the vertical output lines 161 and 162 from forming parasitic capacitance between the vertical output lines 161 and 162 and other interconnections in the upper layer and/or the lower layer, and it is possible to expect higher speed.

The vertical output line 161 and the vertical output line 162 are not necessarily formed by the interconnection layer of the same level. For example, as illustrated in FIG. 18D, the vertical output lines 161 and 162 may be formed by interconnection layers of different levels. In this case, the vertical output line 161 may be disposed between two interconnections 181 formed of the interconnection layer of the same level, and the vertical output line 162 may be disposed between two interconnections 182 formed of an interconnection layer of the same level. The vertical output line 161 and the two interconnections 181 may be connected to the same current source circuit 44, and the vertical output line 162 and the two interconnections 182 may be connected to the same current source circuit. The vertical output line 161 and the vertical output line 162 do not necessarily overlap with each other in a plan view, however, by disposing the vertical output line 161 and the vertical output line 162 so as to overlap with each other in a plan view, the number of interconnections arranged in a planar manner becomes three, so that the pixel size may be reduced.

Further, the interconnection 181 may be further arranged below the vertical output line 161 and the interconnection 182 may be further arranged above the vertical output line 162 (refer to FIG. 18E). With such a configuration, it is possible to prevent the vertical output lines 161 and 162 from forming parasitic capacitance between the vertical output lines 161 and 162 and other interconnections in the upper layer and/or the lower layer, and it is possible to expect higher speed.

As described above, according to the present embodiment, the operation speed of the photoelectric conversion device may be increased while suppressing the increase in power consumption and chip area.

Seventh Embodiment

Figure 19:
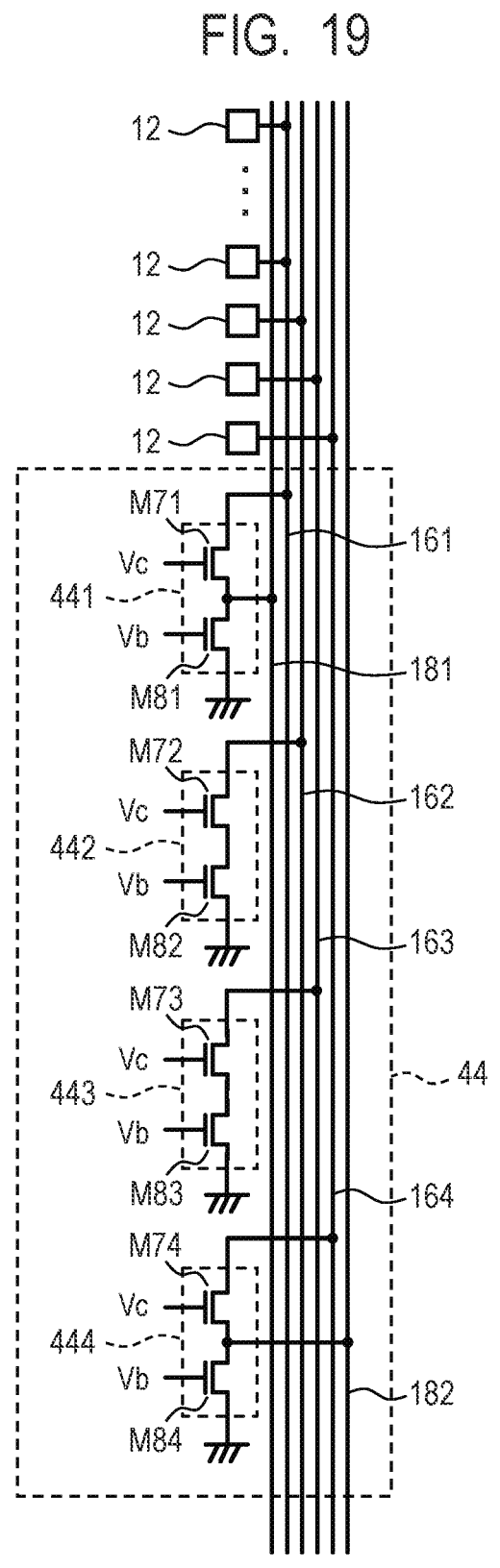
Figures 20A, 20B:
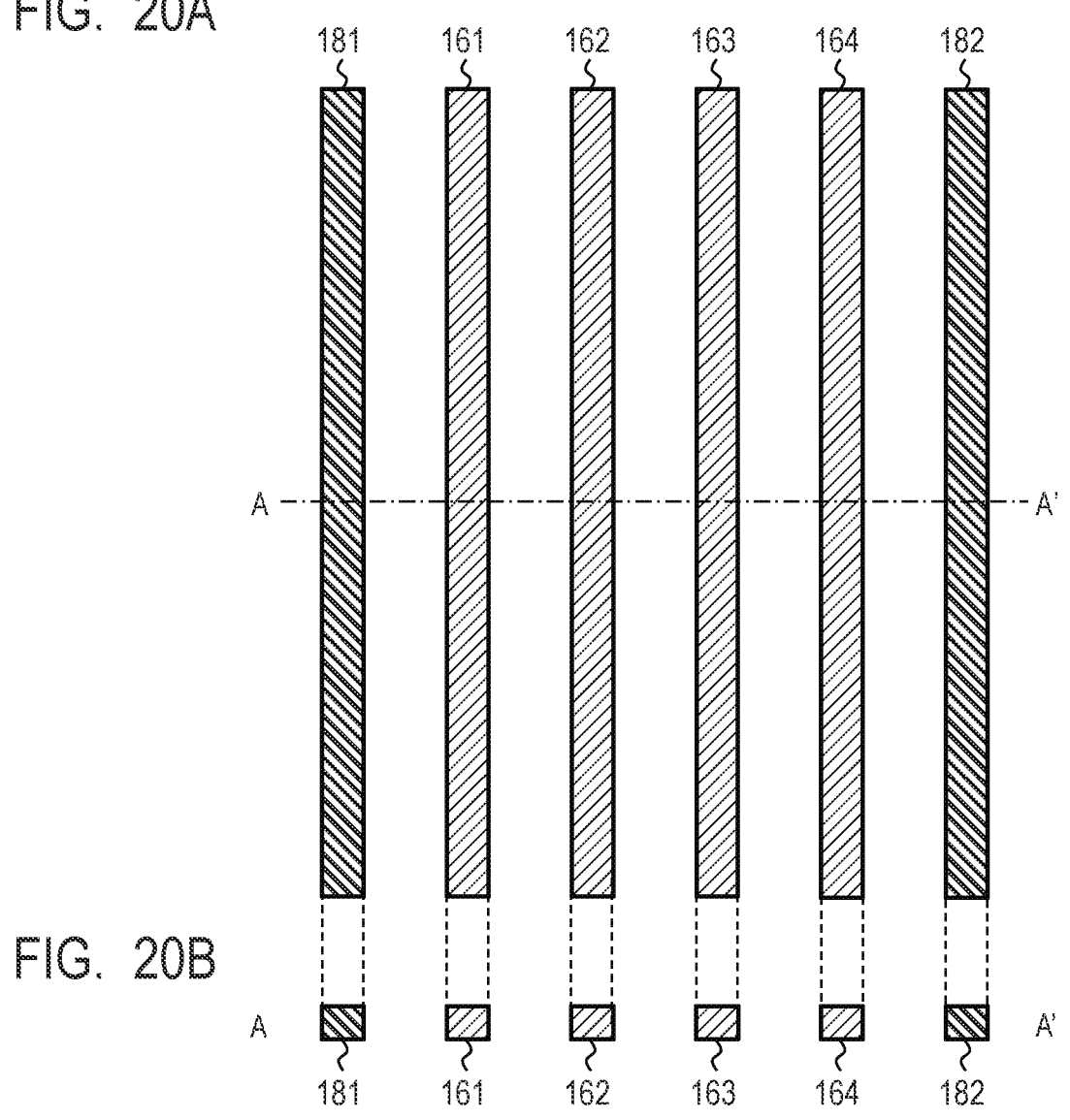
FIG. 20A and FIG. 20B are diagrams illustrating an example of arrangement of vertical output lines and interconnections in the photoelectric conversion device according to the seventh embodiment of the present invention.

A photoelectric conversion device according to a seventh embodiment of the present invention will be described with reference to FIG. 19 to FIG. 21E. Components similar to those of the photoelectric conversion devices according to the first to sixth embodiments are denoted by the same reference numerals, and description thereof will be omitted or simplified. FIG. 19 is a circuit diagram illustrating a configuration example of the photoelectric conversion device according to the present embodiment. FIG. 20A and FIG. 20B are diagrams illustrating an example of arrangement of vertical output lines and interconnections in the photoelectric conversion device according to the present embodiment. FIG. 21A to FIG. 21E are cross-sectional views illustrating other arrangement examples of the vertical output lines and the interconnections in the photoelectric conversion device according to the present embodiment.

The photoelectric conversion device according to the present embodiment is the same as the photoelectric conversion device according to the first embodiment except that the number of vertical output lines 16 and interconnections 18 arranged in each column of the pixel array unit 10 and the configuration of the current source circuit 44 are different. In the present embodiment, differences from the photoelectric conversion device according to the first embodiment will be mainly described, and description of the same portions as those of the photoelectric conversion device according to the first embodiment will be appropriately omitted.

FIG. 19 illustrates, among the components of the photoelectric conversion device according to the present embodiment, the vertical output lines 16 and the interconnections 18 arranged in one pixel column of the pixel array unit 10, and the pixels 12 and the current source circuit 44 connected to the vertical output lines 16 and the interconnections 18. Other portions of the photoelectric conversion device according to the present embodiment are similar to those of the photoelectric conversion device according to the first embodiment.

In the photoelectric conversion device according to the present embodiment, as illustrated in FIG. 19, four vertical output lines 16 (vertical output lines 161, 162, 163 and 164) and two interconnections 18 (interconnections 181 and 182) are disposed in each pixel column of the pixel array unit 10. The pixels 12 in each row are connected to one of the vertical output lines 161, 162, 163 and 164. The current source circuit 44 includes a current source circuit 441 connected to the vertical output line 161 and the interconnection 181, and a current source circuit 442 connected to the vertical output line 162. The current source circuit 44 further includes a current source circuit 443 connected to the vertical output line 163 and a current source circuit 444 connected to the vertical output line 164 and the interconnection 182. Each of the current source circuits 441, 442, 443 and 444 may be similar to the current source circuit 44 of the first embodiment described with reference to FIG. 3. The current source circuit 441, 442, 443 and 444 may be the current source circuit 44 of the second embodiment described with reference to FIG. 9. The connection between the vertical output line 161 and the interconnection 181 and the current source circuit 441, and the connection between the vertical output line 164 and the interconnection 182 and the current source circuit 444 are the same as the connection between the vertical output line 16 and the interconnection 18, and the current source circuit 44 in the first embodiment. The vertical output line 162 is connected to a drain of the transistor M72 of the current source circuit 442, and the vertical output line 163 is connected to a drain of the transistor M73 of the current source circuit 443. The interconnection 18 is not connected to the current source circuits 442 and 443.

FIG. 20A and FIG. 20B schematically illustrate a positional relationship between the vertical output lines 161, 162, 163 and 164 and the interconnections 181 and 182. FIG. 20A illustrates a planar positional relationship between the vertical output lines 161, 162, 163 and 164 and the interconnections 181 and 182, and FIG. 20B illustrates a cross-sectional view taken along a line A-A' of FIG. 20A. As illustrated in FIG. 20A and FIG. 20B, the interconnections 181 and 182 are disposed so as to sandwich the four vertical output lines 161, 162, 163 and 164 in a plan view. In other words, the interconnections 181 and 182 are disposed adjacent to only the vertical output lines 161 and 164 disposed at both ends of the four vertical output lines 161, 162, 163 and 164 in the plan view. By arranging the interconnection 181, the vertical output line 161, 162, 163 and 164, and the interconnection 182 in the stated order, it is possible to prevent the vertical output lines 161 and 164 from having parasitic capacitance with respect to other interconnections other than the vertical output line 16 and thus to prevent a characteristic difference due to a decrease in speed. In addition, by not providing an interconnection between the vertical output lines 161, 162, 163 and 164, the number of interconnections may be reduced.

The arrangement of the vertical output lines 161, 162, 163 and 164 and the interconnections 181 and 182 is not limited to the example illustrated in FIG. 20A and FIG. 20B, and various modifications are possible. For example, various modifications in the sixth embodiment described with reference to FIG. 17A to FIG. 18E may also be applied to the present embodiment. Further, the present embodiment is not limited to the modifications of FIG. 17A to FIG. 18E, and other modifications are possible. FIG. 21A to FIG. 21E illustrate other arrangement examples of the vertical output lines 16 and the interconnections 18 arranged in the same pixel column. FIG. 21A to FIG. 21E are cross-sectional views of the vertical output lines 16 and the interconnections 18.

Figure 21A:
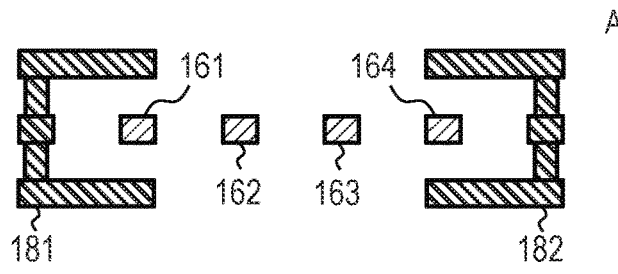
FIG. 21A, FIG. 21B, FIG. 21C, FIG. 21D, and FIG. 21E are cross-sectional views illustrating other arrangement examples of the vertical output lines and the interconnections in the photoelectric conversion device according to the seventh embodiment of the present invention.

FIG. 21A illustrates an example in which the vertical output lines 161 and 162 and the interconnections 181 and 182 overlap each other in a plan view in the case where the number of interconnection layers forming the interconnections 181 and 182 is larger than the number of interconnection layers forming the vertical output line 161, 162, 163 and 164. By configuring the interconnections 181 and 182 in this manner, it is possible to prevent the vertical output lines 161 and 162 from forming parasitic capacitance between the vertical output lines 161 and 162 and other interconnections in the upper layer and/or the lower layer, and it is possible to expect higher speed.

Figure 21B:
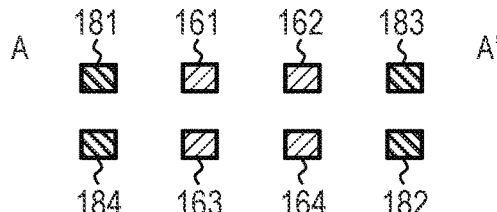

FIG. 21B illustrates an example in which the vertical output lines 161 and 162 and the vertical output lines 163 and 164 are formed by interconnection layers of different levels. When the vertical output lines 161 and 162 and the vertical output lines 163 and 164 are arranged so as to overlap each other in a plan view, the number of interconnections arranged in a planar manner is reduced from six to four, and the pixel size may be reduced. In this case, by further disposing the interconnection 183 connected to the current source circuit 442 adjacent to the vertical output line 162 and the interconnection 184 connected to the current source circuit 443 adjacent to the vertical output line 163, the characteristic difference between the vertical output lines 161, 162, 163 and 164 may be reduced. In the arrangement example of FIG. 21B, the number of vertical output lines 161, 162, 163 and 164 is equal to the number of interconnections 181, 182, 183 and 184. That is, when the number of vertical output lines 16 in one pixel column is four and two interconnection layers are used, it is desirable to increase the number of interconnections 18 to the same number as the number of vertical output lines 16.

Figure 21C:
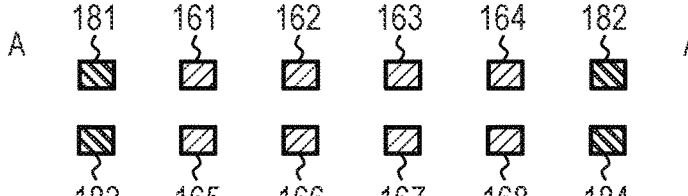

FIG. 21C illustrates a configuration example in which the number of vertical output lines 16 arranged in one pixel column is increased to eight using two interconnection layers. When the eight vertical output lines 16 (vertical output lines 161 to 168) are formed by two interconnection layers, it is possible to adopt a configuration in which the number of the interconnections 181 to 184 is smaller than the number of the vertical output lines 161 to 168. Note that in the case where signals of different colors are read out from the vertical output lines 161, 162, 165 and 166 and the vertical output lines 163, 164, 167 and 168, interconnections 185 to 188 are preferably provided between them in order to suppress color mixture (refer to FIG. 21D). In this case, even if the number of vertical output lines 16 is eight, the number of vertical output lines 161 to 168 is equal to the number of interconnections 181 to 188.

Figure 21D:
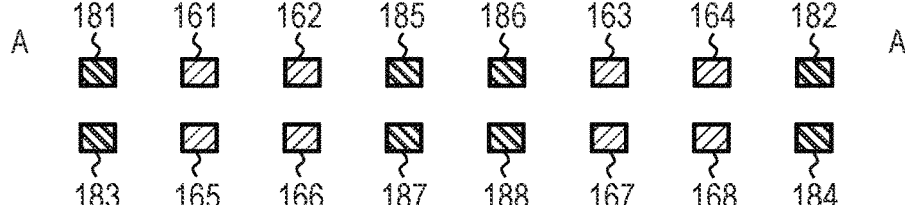
Figure 21E:
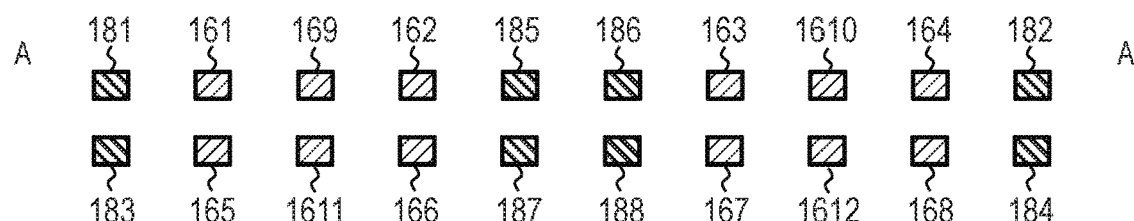

FIG. 21E illustrates a configuration example in which the number of vertical output lines 16 arranged in one pixel column is increased to twelve using two interconnection layers. Also in the case where twelve vertical output lines 16 (vertical output lines 161 to 1612) are formed by two interconnection layers, it is possible to adopt a configuration in which the number (8) of the interconnections 181 to 188 is smaller than the number (12) of the vertical output lines 161 to 1612.

Further, in FIG. 21C to FIG. 21E, the interconnection 18 may be further disposed above the vertical output lines 161, 162, 163, 164, 169 and 1610 or below the vertical output line 165, 166, 167, 168, 1611 and 1612.

As described above, according to the present embodiment, the operation speed of the photoelectric conversion device may be increased while suppressing the increase in power consumption and chip area.

Eighth Embodiment

Figure 22:
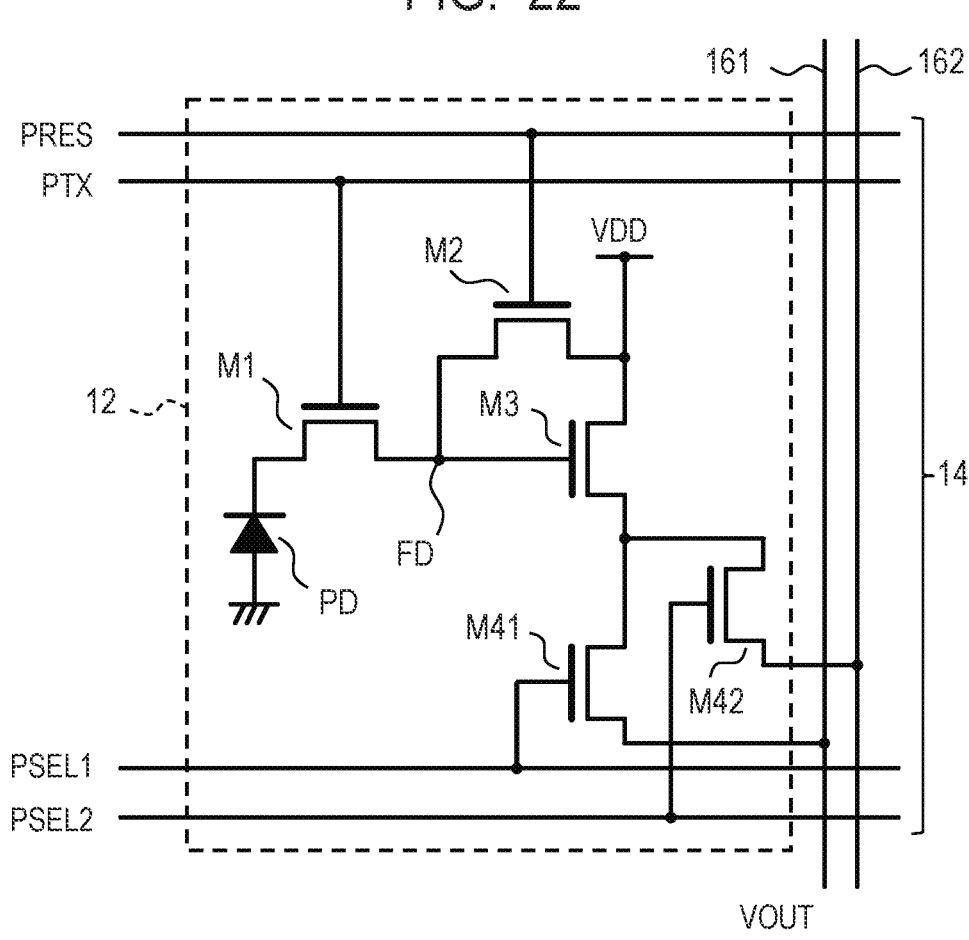
FIG. 22 is a circuit diagram illustrating a configuration example of a pixel in a photoelectric conversion device according to an eighth embodiment of the present invention.
Figure 23:
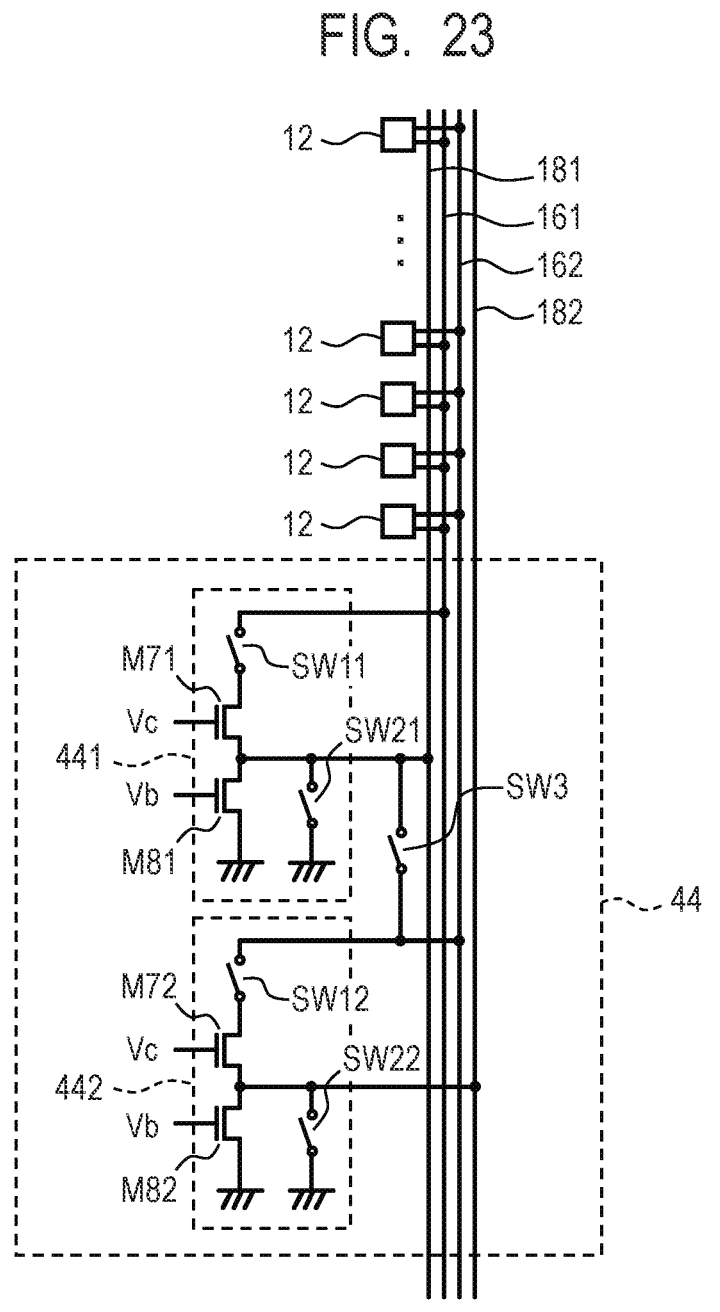

A photoelectric conversion device according to an eighth embodiment of the present invention will be described with reference to FIG. 22 and FIG. 23. Components similar to those of the photoelectric conversion devices according to the first to seventh embodiments are denoted by the same reference numerals, and description thereof will be omitted or simplified. FIG. 22 is a circuit diagram illustrating a configuration example of a pixel in the photoelectric conversion device according to the present embodiment. FIG. 23 is a circuit diagram illustrating a configuration example of the photoelectric conversion device according to the present embodiment.

The photoelectric conversion device according to the present embodiment is the same as the photoelectric conversion device according to the sixth embodiment except that the configurations of the pixel 12 and the current source circuit 44 are different. In the present embodiment, differences from the photoelectric conversion device according to the sixth embodiment will be mainly described, and description of the same portions as those of the photoelectric conversion device according to the sixth embodiment will be appropriately omitted.

As illustrated in FIG. 22, the pixel 12 of the present embodiment includes two select transistors M41 and M42 instead of the select transistor M4. A drain of the select transistor M41 and a drain of the select transistor M42 are connected to the source of the amplifier transistor M3. A source of the select transistor M41 is connected to the vertical output line 161. A source of the select transistor M42 is connected to the vertical output line 162. A control signal PSEL1 is supplied from the vertical scanning circuit 20 to a gate of the select transistor M41. A control signal PSEL2 is supplied from the vertical scanning circuit to a gate of the select transistor M42. Other configurations of the pixel 12 of the present embodiment are similar to those of the pixel 12 of the first embodiment. The pixel 12 of the present embodiment is configured to be able to output a signal based on the charge generated by the photoelectric conversion element PD to either the vertical output line 161 or the vertical output line 162.

As illustrated in FIG. 23, the current source circuit 44 of the present embodiment includes a current source circuit 441, a current source circuit 442, and a switch SW3. The current source circuit 441 includes transistors M71 and M81 and switches SW11 and SW21. The current source circuit 442 includes transistors M72 and M82 and switches SW12 and SW22. As described above, the current source circuit 44 of the present embodiment further includes the switches SW11, SW12, SW21, SW22, and SW3 in comparison with the current source circuit 44 of the sixth embodiment.

The switch SW11 is connected between the vertical output line 161 and a drain of the transistor M71. The switch SW21 is connected between a connection node of a source of the transistor M71, a drain of the transistor M81, and the interconnection 181, and a ground voltage node. The switch SW12 is connected between the vertical output line 162 and a drain of the transistor M72. The switch SW22 is connected between a connection node of a source of the transistor M72, a drain of the transistor M82, and the interconnection 182, and the ground voltage node. The switch SW3 is connected between the connection node of the source of the transistor M71, the drain of the transistor M81, one terminal of the switch SW21, and the interconnection 181, and the connection node of the one terminal of the switch SW12 and the vertical output line 162.

Next, a method of driving the photoelectric conversion device according to the present embodiment will be described with reference to the following first operation mode and second operation mode. The first operation mode is an operation mode in which pixel signals are sequentially read out by two pixel rows using two vertical output lines 161 and 162 of each pixel column. The second operation mode is an operation mode in which pixel signals are sequentially read out by one pixel row using only one vertical output line 161 among the two vertical output lines 161 and 162 of each pixel column.

First, the first operation mode will be described. In the first operation mode, the select transistor M41 is driven to output the pixel signal to the vertical output line 161 for the pixels 12 of, e.g., odd-numbered rows, and the select transistor M42 is driven to output the pixel signal to the vertical output line 162 for the pixels 12 of, e.g., even-numbered rows. Then, the switches SW11 and SW12 are turned on, and the switches SW21, SW22, and SW3 are turned off. By driving the pixel 12 and the current source circuit 44 in this manner, the circuit configuration of the pixel 12 and the current source circuit 44 is substantially the same as the circuit configuration of the pixel 12 and the current source circuit 44 in the sixth embodiment illustrated in FIG. 15.

Next, the second operation mode will be described. In the second operation mode, the switch SW11 of the current source circuit 441 is turned on, and the switch SW12 of the current source circuit 442 is turned off. As a result, the current source circuit 441 is powered on, the current source circuit 442 is powered off, and power consumption during operation may be reduced by the amount by which the current source circuit 442 is not driven. The switch SW21 of the current source circuit 441 is turned off, and the switch SW22 of the current source circuit 442 is turned on. Thereby, the interconnection 182 is connected to the ground voltage node via the switch SW22, and the interconnection 182 is prevented from being in a floating state. When the switch SW3 is turned on, the interconnection 181 and the vertical output line 162 are electrically connected to each other.

In the second operation mode, when the vertical output line 162 that does not read out a signal is fixed to, for example, a ground voltage or a power supply voltage, parasitic capacitance between the vertical output line 161 and the vertical output line 162 contributes as a load capacitance, and the settling speed at the time of potential change of the vertical output line 161 decreases. In this regard, in the present embodiment, by turning on the switch SW3, the vertical output line 162 is connected to the interconnection 181, and the vertical output line 162 has the same function as the interconnection 181. Thus, the settling time of the potential of the vertical output line 161 is shortened, and the readout speed may be increased.

As described above, the current source circuit 44 of the present embodiment has the switch circuit capable of switching to the first connection mode in which the current source circuit 441 is connected to the vertical output line 161 and the interconnection 181, and the current source circuit 442 is connected to the vertical output line 162 and the interconnection 182. The switch circuit of the current source circuit 44 is configured to be switchable to a second connection mode in which the current source circuit 441 is connected to the vertical output line 161 and the interconnection 181, and the vertical output line 162 is connected to the interconnection 181.

In the second operation mode, the switches SW11 and SW12 do not necessarily need to be provided when no special consideration is required for power consumption. When the interconnection 18 on the side of the vertical output line 16 which is not used for readout may be allowed to become floating, the switches SW21 and SW22 need not necessarily be provided.

Further, although the case where the number of vertical output lines 16 arranged in each pixel column is two has been described in the present embodiment, the number of vertical output lines 16 arranged in each pixel column may be further increased. For example, the configuration and operation of the present embodiment may be applied to a case where a signal is output from two vertical output lines 16 out of four vertical output lines 16 arranged in each pixel column, or a case where a signal is output from four vertical output lines 16 out of eight vertical output lines 16 arranged in each pixel column.

As described above, according to the present embodiment, the operation speed of the photoelectric conversion device may be increased while suppressing the increase in power consumption and chip area.

Ninth Embodiment

Figure 24A:
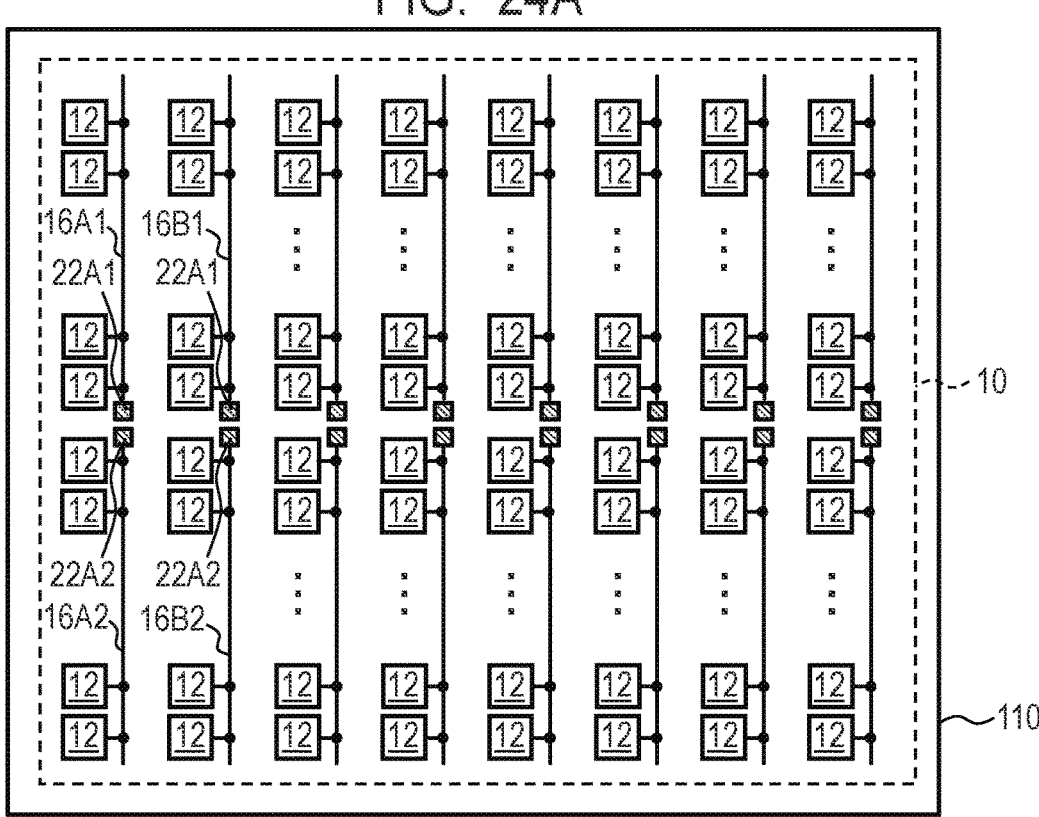
FIG. 24A and FIG. 24B are schematic diagrams illustrating a configuration example of a photoelectric conversion device according to a ninth embodiment of the present invention.
Figure 24B:
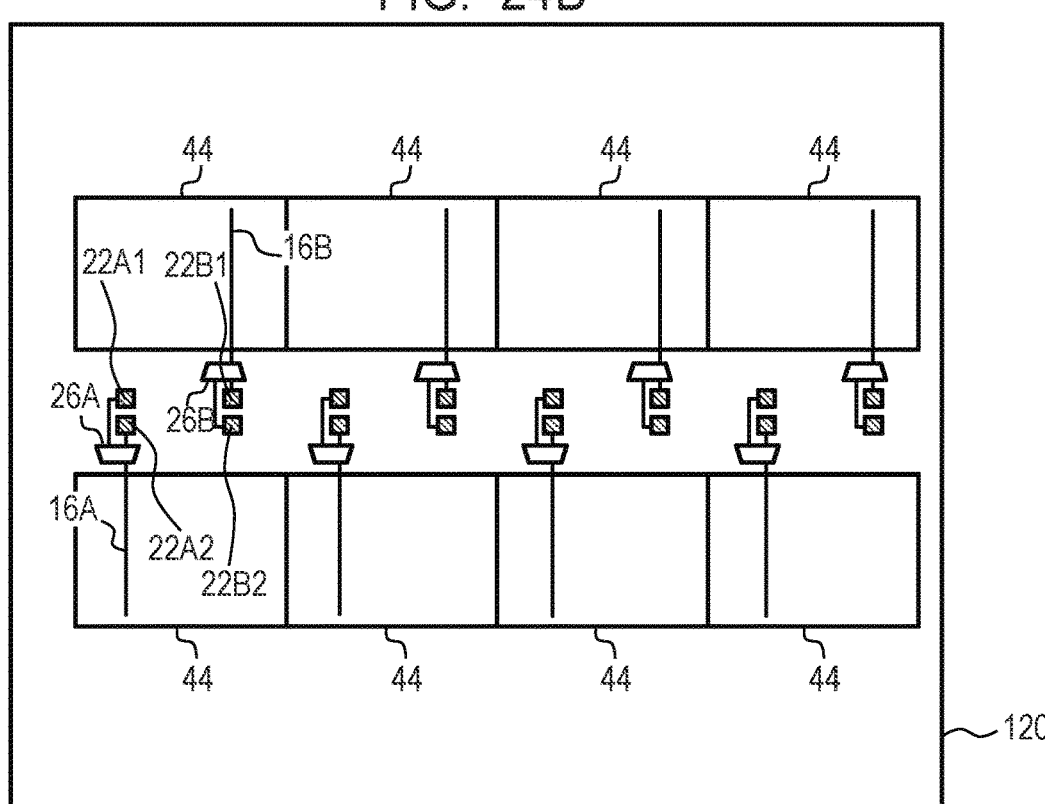
Figure 25:
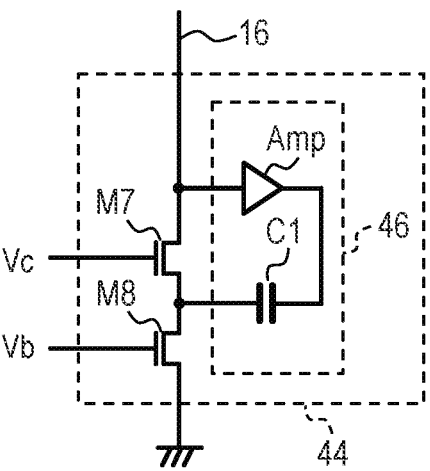
FIG. 25 is a circuit diagram illustrating a configuration example of a current source circuit in a photoelectric conversion device according to the ninth embodiment of the present invention.

A photoelectric conversion device according to a ninth embodiment of the present invention will be described with reference to FIG. 24A to FIG. 25. Components similar to those of the photoelectric conversion devices according to the first to eighth embodiments are denoted by the same reference numerals, and description thereof will be omitted or simplified. FIG. 24A and FIG. 24B are schematic diagrams illustrating a schematic configuration of the photoelectric conversion device according to the present embodiment. FIG. 25 is a circuit diagram illustrating a configuration example of a current source circuit in the photoelectric conversion device according to the present embodiment.

The photoelectric conversion device according to the present embodiment is different from the photoelectric conversion devices according to the first to eighth embodiments in that each pixel column of the pixel array unit 10 does not have the interconnection 18 and the current source circuit 44 is different in configuration. In the present embodiment, differences from the photoelectric conversion device according to the fourth embodiment will be mainly described, and description of the same portions as those of the photoelectric conversion device according to the fourth embodiment will be appropriately omitted.

In the photoelectric conversion device according to the present embodiment, as illustrated in FIG. 24A and FIG. 24B, the interconnections 18A1, 18A2, 18B1 and 18B2 are not provided on the pixel substrate 110, and the interconnections 18A and 18B are not provided on the circuit substrate 120. The vertical output lines 16A and 16B are divided into a portion disposed on the pixel substrate 110 and a portion disposed on the circuit substrate 120. The vertical output line 16A disposed on the pixel substrate 110 is divided into a vertical output line 16A1 and a vertical output line 16A2 in the vicinity of a center row among a plurality of rows. The vertical output line 16B disposed on the pixel substrate 110 is divided into a vertical output line 16B1 and a vertical output line 16B2 in the vicinity of the center row among the plurality of rows. By dividing the vertical output lines 16A and 16B, the parasitic capacitance associated with each of the vertical output lines 16A and 16B becomes substantially half as compared with the case where the vertical output lines 16A and 16B are not divided. The number of divisions of each of the vertical output lines 16A and 16B is not necessarily two, and may be three or more, for example, four or eight.

The vertical output line 16A1 is connected to the input node of the selection circuit 26A via the connecting portion 22A1, and the vertical output line 16A2 is connected to the input node of the selection circuit 26A via the connecting portion 22A2. The output node of the selection circuit 26A is connected to the vertical output line 16A disposed on the circuit substrate 120. Thus, one of the vertical output line 16A1 and the vertical output line 16A2 selected by the selection circuit 26A is connected to the vertical output line 16A disposed on the circuit substrate 120. Similarly, the vertical output line 16B1 is connected to the input node of the selection circuit 26B via the connecting portion 22B1, and the vertical output line 16B2 is connected to the input node of the selection circuit 26B via the connecting portion 22B2. The output node of the selection circuit 26B is connected to the vertical output line 16B disposed on the circuit substrate 120. Thus, one of the vertical output line 16B1 and the vertical output line 16B2 selected by the selection circuit 26B is connected to the vertical output line 16B disposed on the circuit substrate 120.

As illustrated in FIG. 25, the current source circuit 44 of the present embodiment further includes a negative capacitance circuit 46 in addition to the transistors M7 and M8. The negative capacitance circuit 46 includes an amplifier Amp and a capacitor C1. As the amplifier Amp, for example, a source follower circuit or the like may be applied. An input node of the amplifier Amp is connected to a connection node between the vertical output line 16 and a drain of the transistor M7. The output node of the amplifier Amp is connected to one terminal of the capacitor C1. The other terminal of the capacitor C1 is connected to a connection node between a source of the transistor M7 and a drain of the transistor M8.

When a gain of the amplifier Amp is A and the capacitance value of the capacitor C1 is C, the negative capacitance circuit 46 contributes as a negative capacitance of −A×C under a certain condition. Therefore, if the parasitic capacitance accompanying the vertical output line 16 is reduced, the optimum value of the capacitance value of the capacitor C1 may also be reduced. In the present embodiment, since the parasitic capacitance value accompanying the vertical output line 16 is reduced by dividing the vertical output line 16 as described above, the capacitance value C may be reduced by reducing the size of the capacitor C1. Further, the power of the amplifier Amp for driving the capacitor C1 may also be reduced.

Therefore, according to the above configuration of the present embodiment, it is possible to accelerate the settling of the potential in the vertical output line 16 while suppressing the increase in power and chip area caused by the negative capacitance circuit 46.

Since the optimum value of the capacitance value of the capacitor C1 is determined according to the capacitance value accompanying the vertical output line 16 as described above, it is preferable that the capacitance values accompanying each of the divided vertical output lines 16 are substantially the same. In other words, it is preferable that the lengths of the divided vertical output lines 16 are substantially the same. It is preferable that the interconnection widths of the divided vertical output lines 16 are substantially the same. It is preferable that the intervals between the respective divided vertical output lines 16 and the other interconnections are substantially the same. It is preferable that each of the divided vertical output lines 16 is formed by the same interconnection layer.

Further, in the present embodiment, the description has been made assuming a stacked-type photoelectric conversion device in which the pixel substrate 110 and the circuit substrate 120 are stacked, but a stacked-type photoelectric conversion device in which three or more substrates are stacked may be configured. In this case, the area of the negative capacitance circuit 46 may be enlarged without sacrificing the chip size by disposing the negative capacitance circuit 46 on a circuit substrate different from other functional blocks such as an analog/digital conversion circuit.

As described above, according to the present embodiment, the operation speed of the photoelectric conversion device may be increased while suppressing the increase in power consumption and chip area.

Tenth Embodiment

Figure 26:
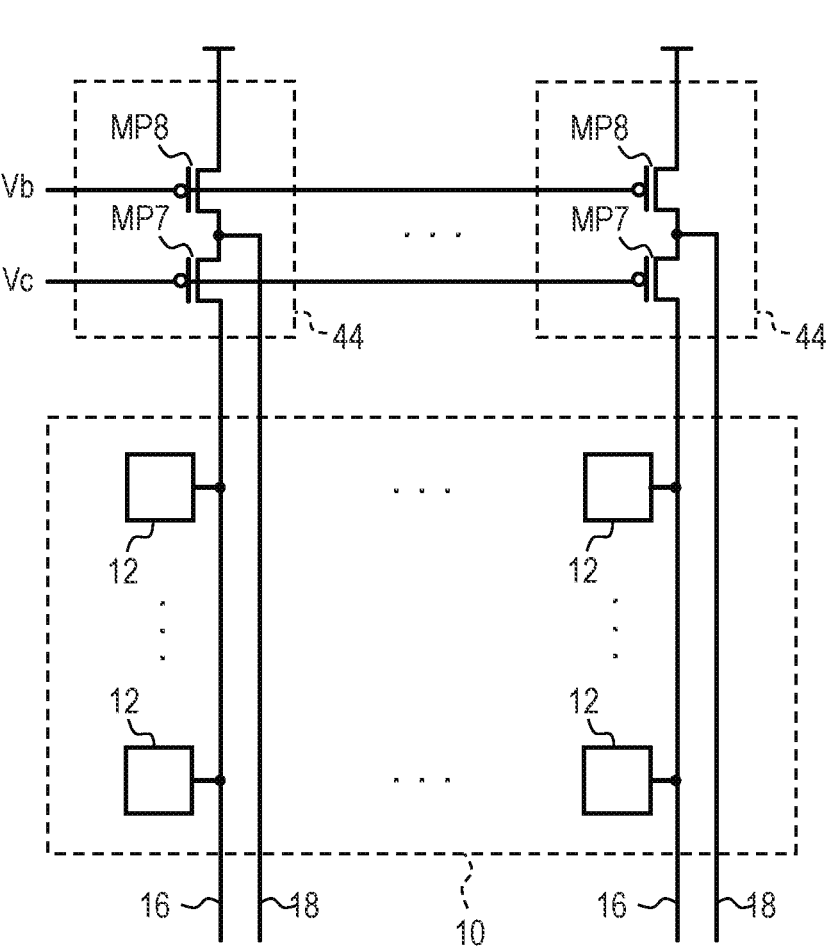
FIG. 26 is a circuit diagram illustrating a configuration example of a photoelectric conversion device according to a tenth embodiment of the present invention.
Figure 27:
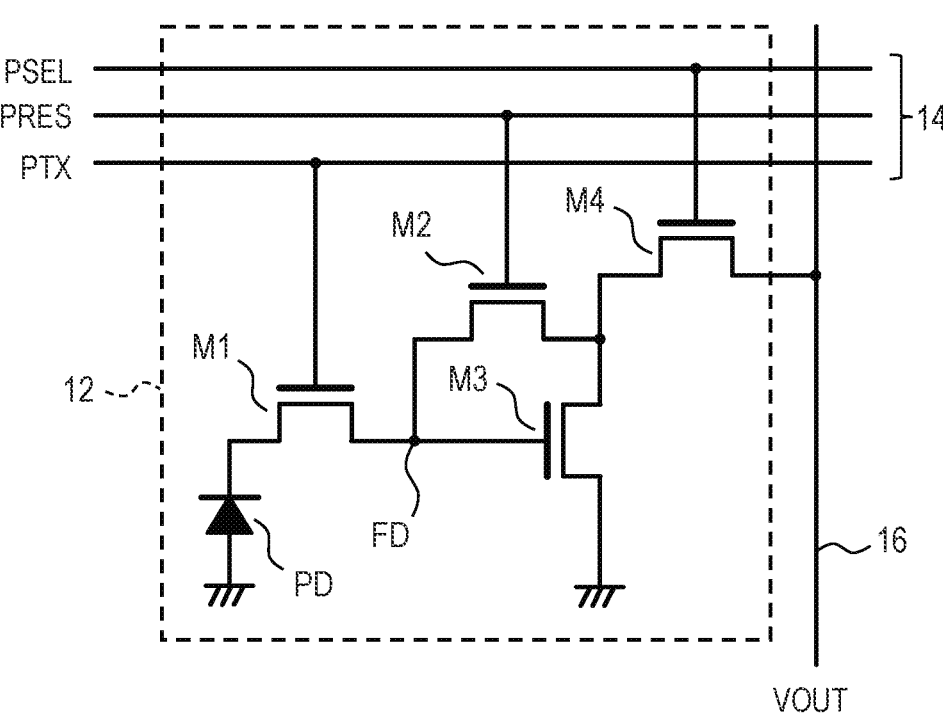
FIG. 27 is a circuit diagram illustrating a configuration example of a pixel having a common-source inverting amplifier.
Figure 28:
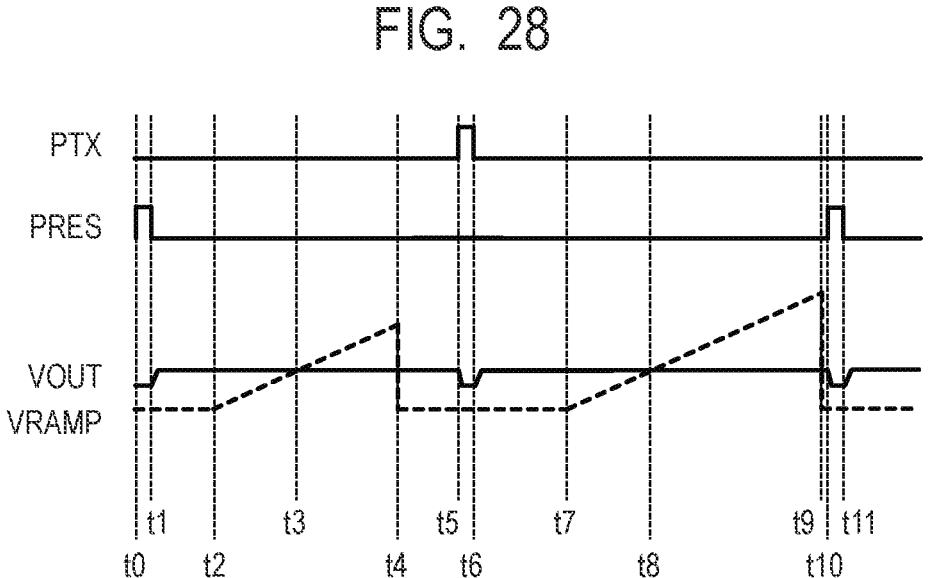
FIG. 28 is a timing chart illustrating a method of driving the photoelectric conversion device according to the tenth embodiment of the present invention.
Figure 29:
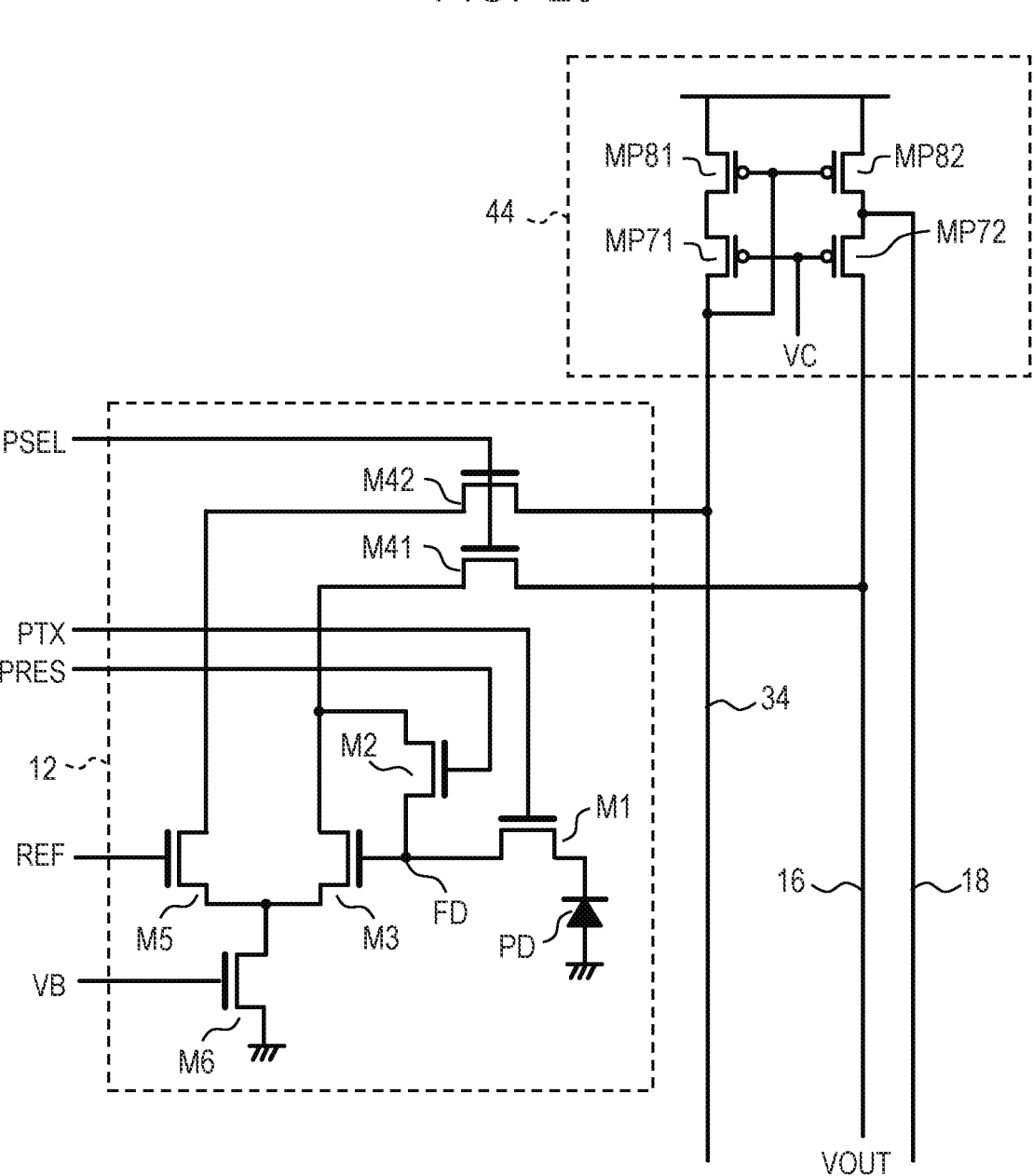
FIG. 29 is a circuit diagram illustrating a configuration example of a pixel having a differential inverting amplifier.

A photoelectric conversion device according to a tenth embodiment of the present invention will be described with reference to FIG. 26 to FIG. 29. Components similar to those of the photoelectric conversion devices according to the first to ninth embodiments are denoted by the same reference numerals, and description thereof will be omitted or simplified. FIG. 26 is a circuit diagram illustrating a configuration example of the photoelectric conversion device according to the present embodiment. FIG. 27 is a circuit diagram illustrating a configuration example of a pixel having a common-source inverting amplifier. FIG. 28 is a timing chart illustrating a method of driving the photoelectric conversion device according to the present embodiment. FIG. 29 is a circuit diagram illustrating a configuration example of a pixel having a differential inverting amplifier.

The photoelectric conversion device according to the present embodiment is different from the photoelectric conversion device according to the first embodiment in that the pixel 12 includes an inverting amplifier. In the present embodiment, differences from the photoelectric conversion device according to the first embodiment will be mainly described, and description of the same portions as those of the photoelectric conversion device according to the first embodiment will be appropriately omitted.

When the pixel 12 includes an inverting amplifier, the current source circuit 44 may be disposed between the power supply voltage node and the vertical output line 16 and the interconnection 18, for example, as illustrated in FIG. 26. In this case, the current source circuit 44 may include p-channel transistors MP7 and MP8. In this current source circuit 44, the transistor MP7 functions as a cascode transistor, and the transistor MP8 functions as a current source transistor. A drain of the transistor MP7 is connected to the vertical output line 16. A source of the transistor MP7 is connected to a drain of the transistor MP8. A connection node between the source of the transistor MP7 and the drain of the transistor MP8 is connected to the interconnection 18. A source of the transistor MP8 is connected to the power supply voltage node (fixed voltage node). A voltage Vc is supplied from the bias circuit 30 to a gate of the transistor MP7. A voltage Vb is supplied from the bias circuit 30 to a gate of the transistor MP8.

Also in the present embodiment, similarly to the first embodiment, the interconnection 18 is disposed adjacent to the vertical output line 16. Thus, even in the case of the pixel 12 having the inverting amplifier, the speed of the readout operation may be increased.

FIG. 27 is a circuit diagram illustrating a configuration example of a pixel 12 having a common-source inverting amplifier. As illustrated in, e.g., FIG. 27, the pixel 12 having a common-source inverting amplifier may be configured by a photoelectric conversion element PD, a transfer transistor M1, a reset transistor M2, an amplifier transistor M3, and a select transistor M4.

The photoelectric conversion element PD has an anode connected to a ground voltage node and a cathode connected to a source of the transfer transistor M1. A drain of the transfer transistor M1 is connected to a source of the reset transistor M2 and a gate of the amplifier transistor M3. A node FD to which the drain of the transfer transistor M1, the source of the reset transistor M2, and the gate of the amplifier transistor M3 are connected is a so-called floating diffusion. A source of the amplifier transistor M3 is connected to the ground voltage node. A drain of the reset transistor M2 and a drain of the amplifier transistor M3 are connected to a source of the select transistor M4. A drain of the select transistor M4 is connected to the vertical output line 16.

The amplifier transistor M3 constitutes a common-source amplifier circuit (amplification unit) together with the current source circuit 44 connected to the drain via the select transistor M4. Thus, the amplifier transistor M3 inverts and amplifies the signal voltage on the node FD and outputs to the vertical output line 16 via the select transistor M4. The basic operation of the other transistors constituting the pixel 12 is similar to that of the pixel 12 of the first embodiment.

Next, an operation of the photoelectric conversion device according to the present embodiment will be described with reference to FIG. 28. The timing chart of FIG. 28 illustrates waveforms of the control signals PTX and PRES, the reference signal VRAMP, and the voltage of the vertical output line 16A (voltage VOUT) connected to the pixel 12 to be read out.

It is assumed that the control signal PSEL (not illustrated) of the row to be read out is at high-level immediately before time t0. As a result, the select transistor M4 of each of the pixels 12 belonging to the corresponding row is turned on, and each of the pixels 12 may output a pixel signal to the vertical output line 16 of the corresponding column. It is assumed that, immediately before the time t0, the control signals PTX and PRES of the row to be read out are at low-level, and the reference signal VRAMP is a predetermined reference voltage.

During a period from the time t0 to time t1, the vertical scanning circuit 20 controls the control signal PRES of the row to be read out to high-level. Accordingly, the reset transistor M2 of each of the pixels 12 belonging to the corresponding row is turned on, and the node FD is reset to a voltage corresponding to the voltage VDD. A voltage VOUT corresponding to the reset voltage of the node FD (a pixel signal at the reset level of the pixel 12) is output to the vertical output line 16 connected to the pixel 12.

When the control signal PRES changes from low-level to high-level at the time t0, the voltage of the node FD is increased by capacitive coupling between the gate and the source of the reset transistor M2, and the voltage VOUT is decreased accordingly. When the control signal PRES changes from high-level to low-level at the time t1, the voltage of the node FD is decreased by the capacitive coupling between the gate and the source of the reset transistor M2, and the voltage VOUT is increased accordingly. The settling of the voltage VOUT accompanying the change in the gate voltage of the reset transistor M2 requires a certain time. The reason why the change in the voltage VOUT accompanying the change in the signal level of the control signal PRES is opposite to that in the case of FIG. 8 is that the amplifier transistor M3 functions as an inverting amplifier.

At a subsequent time t2, the reference signal generation circuit 48 starts a slope operation of gradually increasing the voltage of the reference signal VRAMP with time. The change in the voltage of the reference signal VRAMP is opposite to that in the case of FIG. 8 because the amplifier transistor M3 functions as the inverting amplifier. The counter circuit 58 starts counting up simultaneously with the start of the slope operation, and outputs a count signal COUNT indicating the count value to the column circuit 42 of each column via the count signal line 60.

The comparison circuit 54 of the column circuit 42 performs a comparison operation between the level of the voltage VOUT and the level of the reference signal VRAMP. The level of the output signal of the comparison circuit 54 is inverted at a timing when the magnitude relationship between the level of the voltage VOUT and the level of the reference signal VRAMP is changed, for example, at time t3 in FIG. 28.

The memory 62W of the column circuit 42 holds the count value indicated by the count signal COUNT output from the counter circuit 58 at the timing when the level of the output signal of the comparison circuit 54 is inverted, as digital data of the pixel signal of the reset level of the pixel 12. In this manner, the AD conversion of the pixel signal of the reset level of the pixel 12 is performed. After the digital data held in the memory 62W is transferred to the memory 62R, the digital data is transferred to the output circuit 80 in response to a control signal from the horizontal scanning circuit 70.

At a subsequent time t4, the reference signal generation circuit 48 resets the reference signal VRAMP to a level of the reference voltage.

During a period from a subsequent time t5 to time t6, the vertical scanning circuit 20 controls the control signal PTX of the row to be read out to high-level. Thereby, the transfer transistor M1 of each of the pixels 12 belonging to the corresponding row is turned on, and charge accumulated in the photoelectric conversion element PD during the predetermined exposure period is transferred to the node FD. Thereby, the voltage of the node FD decreases according to an amount of charge transferred from the photoelectric conversion element PD, and the voltage VOUT of the vertical output line 16 increases. A voltage VOUT corresponding to the voltage of the node FD (pixel signal of the light signal level of the pixel 12) is output to the vertical output line 16. It is to be noted that FIG. 28 illustrates a waveform corresponding to dark, and it is assumed that the voltage VOUT is settled at a reset level substantially the same level as the reset level at the time t3 also after the time t6.

When the control signal PTX changes from low-level to high-level at the time t5, the voltage of the node FD is increased by capacitive coupling between the gate and the drain of the transfer transistor M1, and the voltage VOUT is decreased accordingly. When the control signal PTX changes from high-level to low-level at the time t6, the voltage of the node FD is decreased by the capacitive coupling between the gate and the drain of the transfer transistor M1, and the voltage VOUT increases accordingly. The settling of the voltage VOUT accompanying the change in the gate voltage of the transfer transistor M1 requires a certain time. The reason why the change in the voltage VOUT accompanying the change in the signal level of the control signal PTX is opposite to that in the case of FIG. 8 is that the amplifier transistor M3 functions as the inverting amplifier.

At a subsequent time t7, the reference signal generation circuit 48 starts a slope operation in which the voltage of the reference signal VRAMP changes with time. The counter circuit 58 starts counting up simultaneously with the start of the slope operation, and outputs a count signal COUNT indicating the count value to the column circuit 42 of each column via the count signal line 60.

The comparison circuit 54 of the column circuit 42 performs a comparison operation between the level of the voltage VOUT and the level of the reference signal VRAMP. The level of the output signal of the comparison circuit 54 is inverted at a timing when the magnitude relationship between the level of the voltage VOUT and the level of the reference signal VRAMP is changed, for example, at a time t8 in FIG. 28.

The memory 62W of the column circuit 42 holds the count value indicated by the count signal COUNT output from the counter circuit 58 at the timing when the level of the output signal of the comparison circuit 54 is inverted, as digital data of the pixel signal of the light signal level of the pixel 12. In this manner, the AD conversion of the pixel signal of the light signal level of the pixel 12 is performed. After the digital data held in the memory 62W is transferred to the memory 62R, the digital data is transferred to the output circuit 80 in response to a control signal from the horizontal scanning circuit 70.

Even in the case where the pixel 12 is configured using the common-source inverting amplifier, the interconnection 18 connected to the drain of the transistor MP8 is disposed adjacent to and parallel to the vertical output line 16, whereby the speed of the readout operation may be increased by the same principle as in the first embodiment.

The inverting amplifier constituting the pixel 12 is not necessarily a common-source inverting amplifier, and may be a differential inverting amplifier, for example. FIG. 29 illustrates a configuration example in which the pixel 12 having a differential inverting amplifier and a current mirror circuit (current source circuit 44) connected to the pixel 12 are used.

As illustrated in, e.g., FIG. 29, a pixel 12 having a differential inverting amplifier includes a photoelectric conversion element PD, a transfer transistor M1, a reset transistor M2, an amplifier transistor M3, and select transistors M41 and M42. The pixel 12 further includes a differential transistor M5 forming a differential stage together with the amplifier transistor M3, and a transistor M6 serving as a tail current source. The current source circuit 44 includes p-channel transistors MP71, MP81, MP72, and MP82.

The photoelectric conversion element PD has an anode connected to a ground voltage node and a cathode connected to a source of the transfer transistor M1. A drain of the transfer transistor M1 is connected to a source of the reset transistor M2 and a gate of the amplifier transistor M3. A node FD to which the drain of the transfer transistor M1, the source of the reset transistor M2, and the gate of the amplifier transistor M3 are connected is a so-called floating diffusion. A source of the amplifier transistor M3 and a source of the differential transistor M5 are connected to a drain of the transistor M6. A source of the transistor M6 is connected to the ground voltage node. A drain of the reset transistor M2 and a drain of the amplifier transistor M3 are connected to a source of the select transistor M41. A drain of the select transistor M41 is connected to the vertical output line 16. The drain of the differential transistor M5 is connected to a source of the select transistor M42. A drain of the select transistor M42 is connected to an interconnection 34.

The transistor MP81 as a current source transistor and the transistor MP82 form a current mirror, and the transistor MP82 generates a current determined by a gate-source voltage of the transistor MP81. The transistor MP71 functions as a cascode transistor of the transistor MP81, and the transistor MP72 functions as a cascode transistor of the transistor MP82.

Charge generated by the photoelectric conversion element PD is transferred to the node FD by turning on the transfer transistor M1, and is converted into a signal voltage by a parasitic capacitance accompanying the node FD. The parasitic capacitance is mainly a capacitance between the gate and the drain of the amplifier transistor M3. The signal voltage converted at the node FD is output to the vertical output line 16 via the amplifier transistor M3 and the select transistor M41. The differential transistor M5 constitutes a differential stage together with the amplifier transistor M3. The differential stage constitutes a differential amplifier circuit (amplification unit) together with the current mirror circuit of the current source circuit 44. Since the node FD is connected to the inverting input side of the differential amplifier circuit, the signal of the node FD is inverted and amplified and output to the vertical output line 16.

Even in the case where the pixel 12 is configured using a differential inverting amplifier, since the interconnection 18 connected to the drain of the transistor MP82 is disposed adjacent to and parallel to the vertical output line 16, the speed of the readout operation may be increased by the same principle as in the first embodiment.

As described above, according to the present embodiment, the operation speed of the photoelectric conversion device may be increased while suppressing the increase in power consumption and chip area.

Eleventh Embodiment

Figure 33:
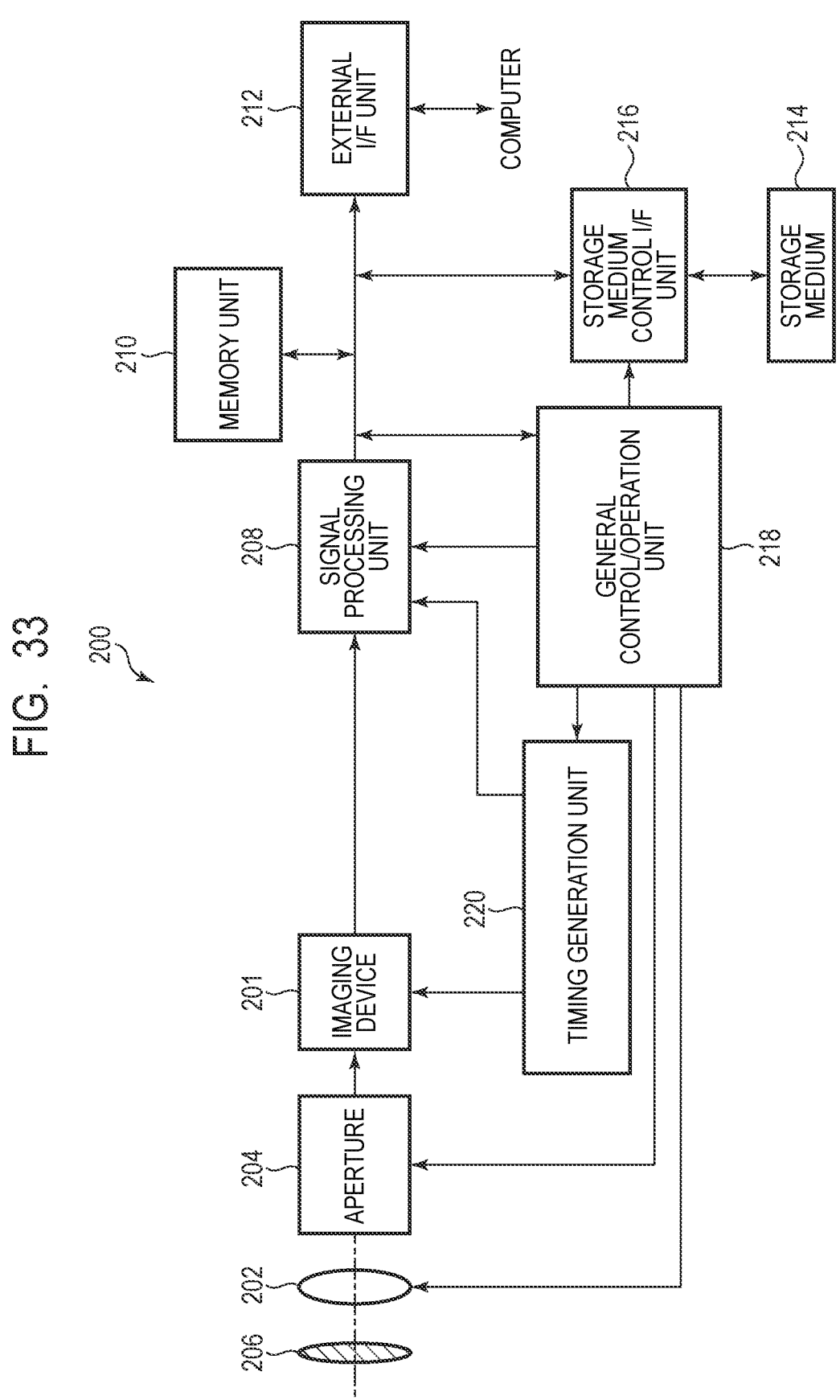
FIG. 33 is a block diagram illustrating a schematic configuration of a photoelectric conversion system according to an eleventh embodiment of the present invention.

A photoelectric conversion system according to an eleventh embodiment according to the present invention will be described with reference to FIG. 33. FIG. 33 is a block diagram illustrating a schematic configuration of the photoelectric conversion system according to the present embodiment.

The photoelectric conversion device 100 described in the first to tenth embodiments may be applied to various photoelectric conversion systems. Examples of applicable photoelectric conversion systems include digital still cameras, digital camcorders, surveillance cameras, copying machines, facsimiles, mobile phones, on-vehicle cameras, observation satellites, and the like. Further, a camera module including an optical system such as a lens and an imaging device is also included in the photoelectric conversion system. FIG. 33 is a block diagram of a digital still camera as an example of these.

The photoelectric conversion system 200 illustrated in FIG. 33 includes an imaging device 201, a lens 202 for forming an optical image of an object on the imaging device 201, an aperture 204 for varying the amount of light passing through the lens 202, and a barrier 206 for protecting the lens 202. The lens 202 and the aperture 204 form an optical system that collects light on the imaging device 201. The imaging device 201 is the photoelectric conversion device 100 described in any of the first to tenth embodiments, and converts an optical image formed by the lens 202 into image data.

The photoelectric conversion system 200 also includes a signal processing unit 208 that processes an output signal output from the imaging device 201. The signal processing unit 208 generates image data from a digital signal output from the imaging device 201. The signal processing unit 208 performs various corrections and compressions as necessary and outputs the processed image data. The imaging device 201 may include an AD conversion unit that generates a digital signal to be processed by the signal processing unit 208. The AD conversion unit may be formed on a semiconductor layer (semiconductor substrate) in which the photoelectric conversion unit of the imaging device 201 is formed, or may be formed on a semiconductor layer different from the semiconductor layer in which the photoelectric conversion unit of the imaging device 201 is formed. The signal processing unit 208 may be formed on the same semiconductor layer as the imaging device 201.

The photoelectric conversion system 200 further includes a memory unit 210 for temporarily storing image data, and an external interface unit (external I/F unit) 212 for communicating with an external computer or the like. Further, the photoelectric conversion system 200 includes a storage medium 214 such as a semiconductor memory for storing or reading out the captured image data, and a storage medium control interface unit (storage medium control I/F unit) 216 for storing or reading out the image data on or from the storage medium 214. The storage medium 214 may be built in the photoelectric conversion system 200, or may be detachable.

The photoelectric conversion system 200 further includes a general control/operation unit 218 that controls various calculations and operations of the entire digital still camera, and a timing generation unit 220 that outputs various timing signals to the imaging device 201 and the signal processing unit 208. Here, the timing signal or the like may be input from the outside, and the photoelectric conversion system 200 may include at least the imaging device 201 and a signal processing unit 208 that processes an output signal output from the imaging device 201.

The imaging device 201 outputs the imaging signal to the signal processing unit 208. The signal processing unit 208 performs predetermined signal processing on the imaging signal output from the imaging device 201, and outputs image data. The signal processing unit 208 generates an image using the imaging signal.

As described above, according to the present embodiment, it is possible to realize a photoelectric conversion system to which the photoelectric conversion device 100 according to the first to tenth embodiments is applied.

Twelfth Embodiment

Figure 34A:
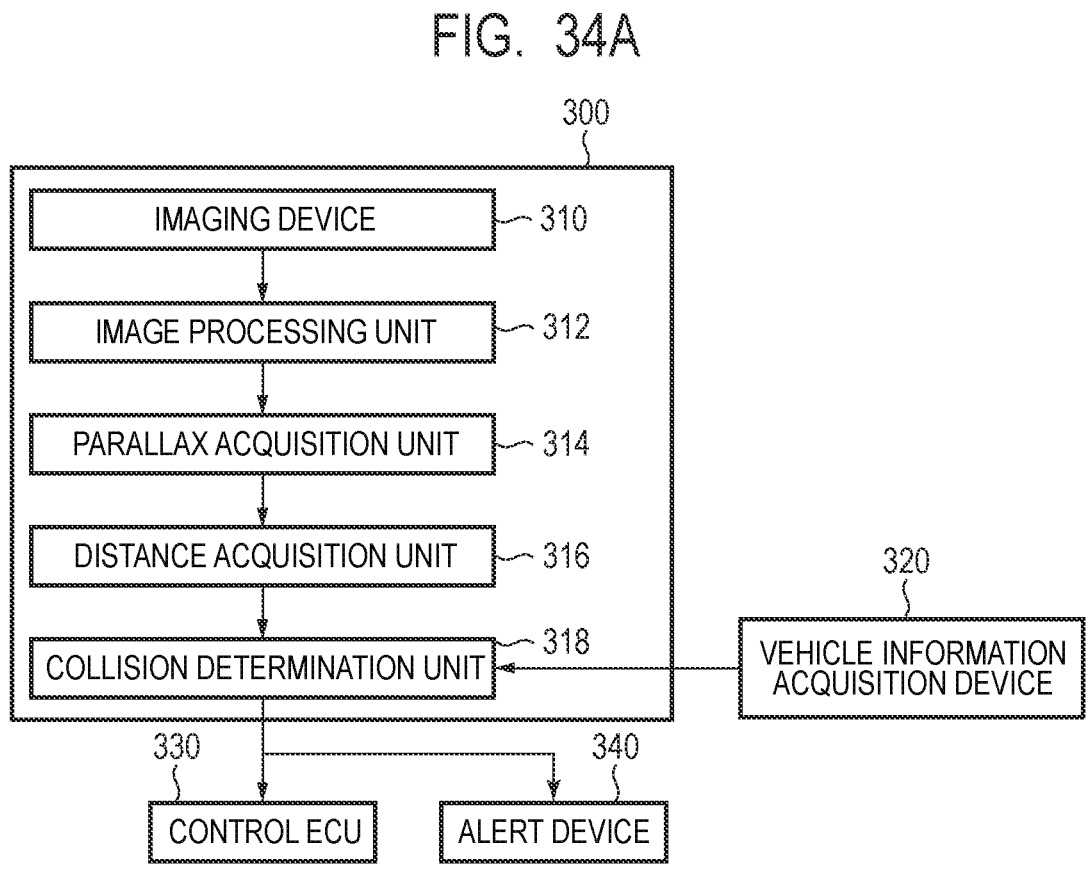
FIG. 34A is a diagram illustrating a configuration example of a photoelectric conversion system according to a twelfth embodiment of the present invention.
Figure 34B:
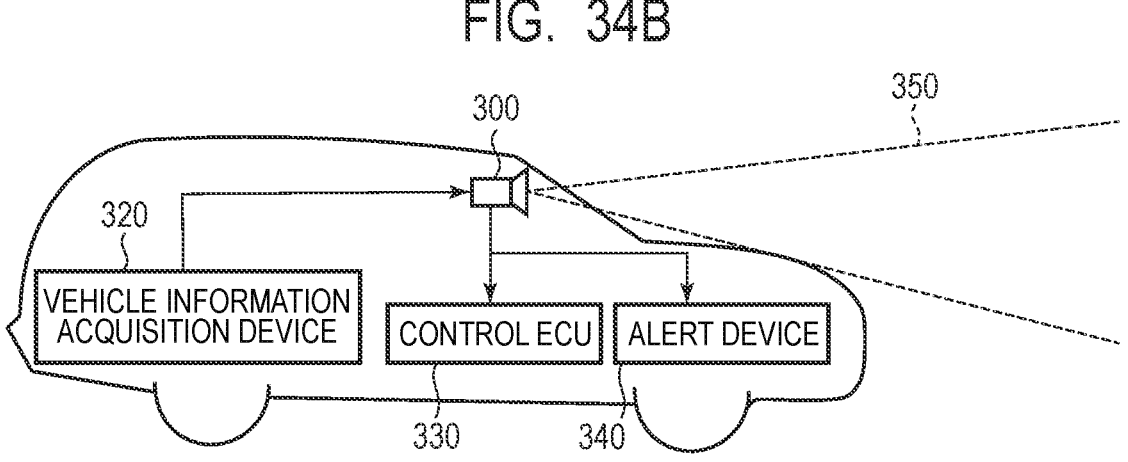
FIG. 34B is a diagram illustrating a configuration example of a movable object according to a twelfth embodiment of the present invention.

A photoelectric conversion system and a moving object according to a twelfth embodiment of the present invention will be described with reference to FIG. 34A and FIG. 34B. FIG. 34A is a diagram illustrating a configuration of the photoelectric conversion system according to the present embodiment. FIG. 34B is a diagram illustrating a configuration of the movable object according to the present embodiment.

FIG. 34A illustrates an example of a photoelectric conversion system relating to an on-vehicle camera. The photoelectric conversion system 300 includes an imaging device 310. The imaging device 310 is the photoelectric conversion device 100 described in any one of the first to tenth embodiments. The photoelectric conversion system 300 includes an image processing unit 312 that performs image processing on a plurality of image data acquired by the imaging device 310, and a parallax acquisition unit 314 that calculates parallax (phase difference of parallax images) from the plurality of image data acquired by the imaging device 310. The photoelectric conversion system 300 includes a distance acquisition unit 316 that calculates a distance to an object based on the calculated parallax, and a collision determination unit 318 that determines whether or not there is a possibility of collision based on the calculated distance. Here, the parallax acquisition unit 314 and the distance acquisition unit 316 are examples of a distance information acquisition unit that acquires distance information to the object. That is, the distance information may be information on a parallax, a defocus amount, a distance to the object, and the like. The collision determination unit 318 may determine the collision possibility using any of these pieces of distance information. The distance information acquisition unit may be implemented by dedicated hardware or software modules. Further, it may be implemented by FPGA (Field Programmable Gate Array), ASIC (Application Specific Integrated circuit), or the like, or may be implemented by a combination of these.

The photoelectric conversion system 300 is connected to the vehicle information acquisition device 320, and may acquire vehicle information such as a vehicle speed, a yaw rate, and a steering angle. Further, the photoelectric conversion system 300 is connected to a control ECU 330 which is a control device that outputs a control signal for generating a braking force to the vehicle based on the determination result of the collision determination unit 318. The photoelectric conversion system 300 is also connected to an alert device 340 that issues an alert to the driver based on the determination result of the collision determination unit 318. For example, when the collision possibility is high as the determination result of the collision determination unit 318, the control ECU 330 performs vehicle control to avoid collision and reduce damage by braking, returning an accelerator, suppressing engine output, or the like. The alert device 340 alerts a user by sounding an alarm such as a sound, displaying alert information on a screen of a car navigation system or the like, or giving vibration to a seat belt or a steering wheel.

In the present embodiment, the photoelectric conversion system 300 images the periphery of the vehicle, for example, the front side or the rear side. FIG. 34B illustrates a photoelectric conversion system in the case of imaging an image in front of a vehicle (an imaging range 350). The vehicle information acquisition device 320 sends an instruction to the photoelectric conversion system 300 or the imaging device 310. With such a configuration, the accuracy of distance measurement may be further improved.

In the above description, an example has been described in which control is performed so as not to collide with other vehicles, but the present invention is also applicable to control of automatic driving following other vehicles, control of automatic driving so as not to go out of a lane, and the like. Further, the photoelectric conversion system is not limited to a vehicle such as a host vehicle, and may be applied to, for example, a movable object (moving device) such as a ship, an aircraft, or an industrial robot. In addition, the present invention may be applied not only to a movable object but also to a wide variety of equipment such as an ITS (Intelligent Transport Systems).

Thirteenth Embodiment

Figure 35:
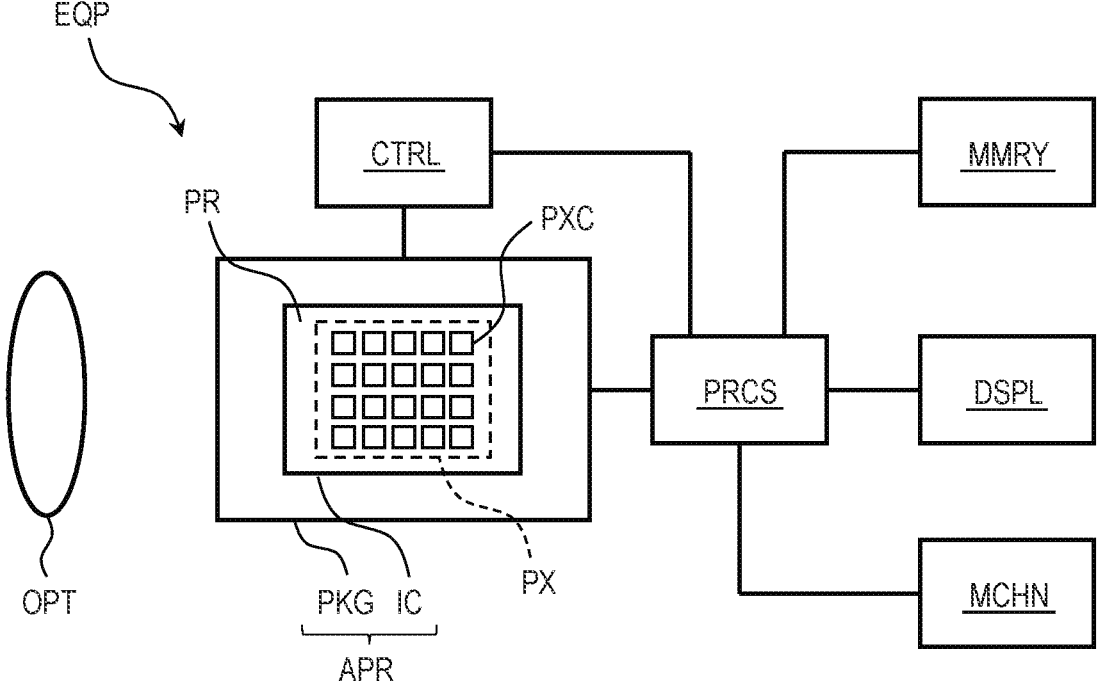
FIG. 35 is a block diagram illustrating a schematic configuration of equipment according to a thirteenth embodiment of the present invention.

Equipment according to a thirteenth embodiment of the present invention will be described with reference to FIG. 35. FIG. 35 is a block diagram illustrating a schematic configuration of the equipment according to the present embodiment.

FIG. 35 is a schematic diagram illustrating equipment EQP including a photoelectric conversion device APR. The photoelectric conversion device APR has the function of the photoelectric conversion device 100 of any one of the first to tenth embodiments. All or a part of the photoelectric conversion device APR is a semiconductor device IC. The photoelectric conversion device APR of this example may be used, for example, as an image sensor, an AF (Auto Focus) sensor, a photometry sensor, or a distance measurement sensor. The semiconductor device IC includes a pixel area PX in which pixel circuits PXC including photoelectric conversion units are arranged in a matrix. The semiconductor device IC may include a peripheral area PR around the pixel area PX. Circuits other than the pixel circuits may be arranged in the peripheral area PR.

The photoelectric conversion device APR may have a structure (chip stacked structure) in which a first semiconductor chip provided with a plurality of photoelectric conversion units and a second semiconductor chip provided with peripheral circuits are stacked. Each peripheral circuit in the second semiconductor chip may be a column circuit corresponding to a pixel column of the first semiconductor chip. The peripheral circuits in the second semiconductor chip may be matrix circuits corresponding to the pixels or the pixel blocks of the first semiconductor chip. As a connection between the first semiconductor chip and the second semiconductor chip, a through electrode (TSV (Through Silicon Via)), an inter-chip interconnection by direct bonding of a conductor such as copper, a connection by micro bumps between chips, a connection by wire bonding, or the like may be adopted.

In addition to the semiconductor device IC, the photoelectric conversion device APR may include a package PKG that accommodates the semiconductor device IC. The package PKG may include a base body to which the semiconductor device IC is fixed, a lid body made of glass or the like facing the semiconductor device IC, and a connection member such as a bonding wire or a bump that connects terminals provided on the base body to terminals provided on the semiconductor device IC.

The equipment EQP may further comprise at least one of an optical device OPT, a control device CTRL, a processing device PRCS, a display device DSPL, a storage device MMRY, and a mechanical device MCHN. The optical device OPT corresponds to the photoelectric conversion device APR as a photoelectric conversion device, and is, for example, a lens, a shutter, or a mirror. The control device CTRL controls the photoelectric conversion device APR, and is, for example, a semiconductor device such as an ASIC. The processing device PRCS processes a signal output from the photoelectric conversion device APR, and constitutes an AFE (analog front end) or a DFE (digital front end). The processing unit PRCS is a semiconductor device such as a central processing unit (CPU) or an ASIC. The display device DSPL is an EL display device or a liquid crystal display device which displays information (image) obtained by the photoelectric conversion device APR. The storage device MMRY may be a magnetic device or a semiconductor device that stores information (images) obtained by the photoelectric conversion device APR. The storage device MMRY may be a volatile memory such as an SRAM or a DRAM, or a nonvolatile memory such as a flash memory or a hard disk drive. The mechanical device MCHN includes a movable portion or a propulsion portion such as a motor or an engine. In the equipment EQP, a signal output from the photoelectric conversion device APR may be displayed on the display device DSPL, and is transmitted to the outside by a communication device (not illustrated) included in the equipment EQP. Therefore, it is preferable that the equipment EQP further includes a storage device MMRY and a processing device PRCS separately from the storage circuit unit and the arithmetic circuit unit included in the photoelectric conversion device APR.

The equipment EQP illustrated in FIG. 35 can be an electronic device such as an information terminal (for example, a smartphone or a wearable terminal) having a photographing function or a camera (for example, an interchangeable lens camera, a compact camera, a video camera, and a surveillance camera). The mechanical device MCHN in the camera may drive components of the optical device OPT for zooming, focusing, and shutter operation. The equipment EQP may be a transportation device (movable object) such as a vehicle, a ship, or an airplane. The equipment EQP may be a medical device such as an endoscope or a CT scanner.

The mechanical device MCHN in the transport device may be used as a mobile device. The equipment EQP as a transport device is suitable for transporting the photoelectric conversion device APR, or for assisting and/or automating operation (manipulation) by an imaging function. The processing device PRCS for assisting and/or automating operation (manipulation) may perform processing for operating the mechanical device MCHN as a mobile device based on information obtained by the photoelectric conversion device APR.

The photoelectric conversion device APR according to the present embodiment may provide the designer, the manufacturer, the seller, the purchaser, and/or the user with high value. Therefore, when the photoelectric conversion device APR is mounted on the equipment EQP, the value of the equipment EQP may be increased. Therefore, in order to increase the value of the equipment EQP, it is advantageous to determine the mounting of the photoelectric conversion device APR of the present embodiment on the equipment EQP when the equipment EQP is manufactured and sold.

Modified Embodiments

The present invention is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

Figure 30:
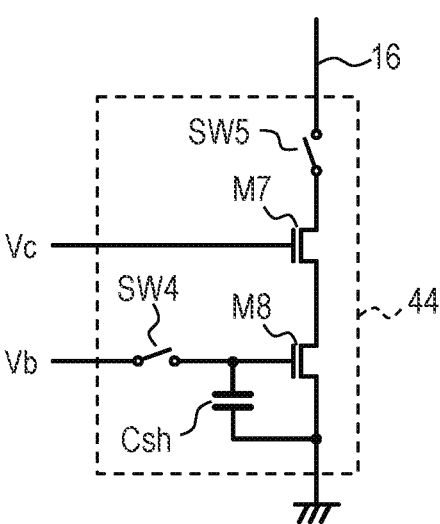

The current source circuit 44 is not limited to the configuration illustrated in FIG. 3 and FIG. 9, and various modifications are possible. For example, as illustrated in FIG. 30, a sample hold circuit including a capacitor Csh connected between the gate and the source of the transistor M8 and a switch SW4 connected between the node to which the voltage Vb is supplied and the gate of the transistor M8 may be added to the current source circuit 44. By holding the voltage Vb in the capacitor Csh, the source-gate voltage of the transistor M8 may be easily maintained even when the ground voltage varies, and current variation may be suppressed. A switch SW5 for switching the connection state between the vertical output line 16 and the drain of the transistor M7 may be further added.

Figure 31:
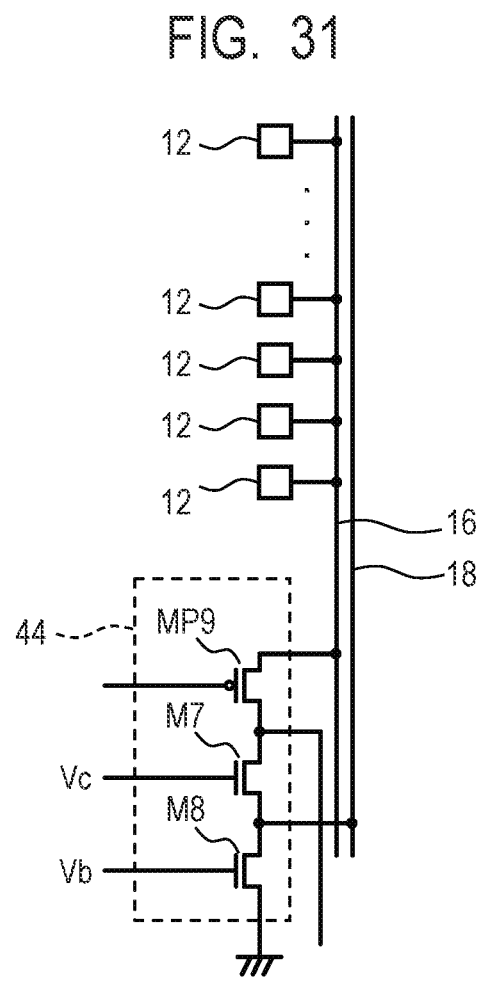

Alternatively, as illustrated in, e.g., FIG. 31, a transistor MP9 whose source is connected to the vertical output line 16 and whose drain is connected to the drain of the transistor M7 may be added to the current source circuit 44 to configure an inverting amplifier together with the transistor M7. In this case, the connection node between the drain of the transistor M7 and the drain of the transistor MP9 may be connected to the AD conversion circuit in the subsequent stage. The transistor MP9 has a conductivity type (p-channel transistor) opposite to that of the transistors M7 and M8.

The circuit configurations of the pixel 12 illustrated in FIG. 2, FIG. 22, FIG. 27, and FIG. 29 are examples, and may be changed as appropriate. For example, each pixel 12 may include two or more photoelectric conversion elements. In this case, a plurality of photoelectric conversion elements may share one node FD. Further, the pixel 12 may be a pupil division pixel including a plurality of photoelectric conversion elements that share one microlens so that phase difference may be detected. The pixel 12 does not necessarily have to include the select transistor M4. The capacitance value of the node FD may be switchable.

Figure 32:
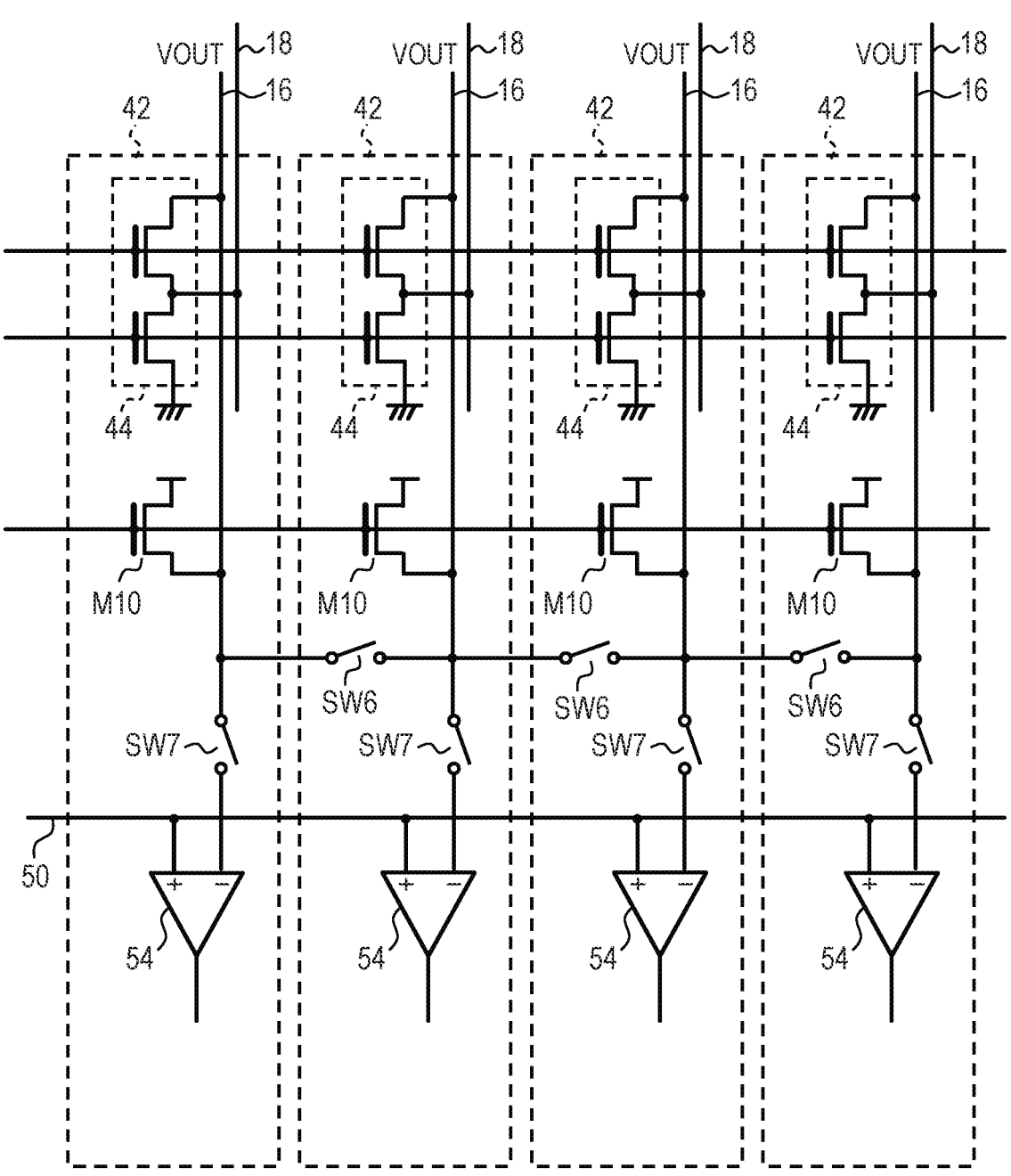
FIG. 32 is a circuit diagram illustrating a configuration example of a column circuit in a photoelectric conversion device according to a modification of the embodiments of the present invention.

Further, the configuration of the column circuit 42 is not limited to the configurations illustrated in FIG. 3 and FIG. 9, and may be appropriately changed. For example, as illustrated in FIG. 32, a transistor M10 that limits the lower limit of the potential of the vertical output line 16 may be provided. This makes it possible to suppress the current variation of the current source circuit 44. Further, a switch SW6 for controlling an electrical connection state (conduction or non-conduction) between adjacent vertical output lines 16 may be provided. Further, a switch SW7 for controlling an electrical connection state (conduction or non-conduction) between the vertical output line 16 and the post-stage circuit (for example, the comparison circuit 54) may be provided.

Further, in the above-described embodiments, the example in which the slope-type AD conversion circuit is used for the AD conversion of the pixel signal has been described, but the AD conversion circuit used for the AD conversion of the pixel signal is not limited to the slope-type AD conversion circuit. In addition to the slope-type AD conversion circuit, for example, an SRAM-type AD conversion circuit, a delta-sigma AD conversion circuit, a pipeline-type AD conversion circuit, or the like may be applied to the AD conversion of the pixel signal.

Further, in the current source circuit 44 described in the above-described embodiments, a negative capacitance circuit connected to the vertical output line 16 may be further added.

The photoelectric conversion systems described in the eleventh and twelfth embodiments are examples of photoelectric conversion systems to which the photoelectric conversion device of the present invention may be applied, and the photoelectric conversion system to which the photoelectric conversion device according to the present invention may be applied is not limited to the configurations illustrated in FIG. 33 and FIG. 34A.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-024230, filed Feb. 20, 2023 which is hereby incorporated by reference herein in its entirety.

What is claimed is:

1. A photoelectric conversion device comprising:
   a plurality of pixels arranged to form a column and each including a photoelectric conversion unit and an amplification unit configured to amplify a signal based on charge generated by the photoelectric conversion unit;
   an output line connected to the plurality of pixels;
   an interconnection disposed adjacent to the output line; and a current source circuit connected to the output line and configured to supply a current to the amplification unit of the pixel via the output line, wherein the current source circuit includes a current source transistor connected between the interconnection and a fixed voltage node, and a cascode transistor connected between the interconnection and the output line.

2. The photoelectric conversion device according to claim 1, wherein a transconductance of the cascode transistor is greater than a transconductance of the current source transistor.

3. The photoelectric conversion device according to claim 1, further comprising: a transistor connected between the current source transistor and the output line and having a conductivity type opposite to that of the current source transistor.

4. The photoelectric conversion device according to claim 1, further comprising:

a first substrate provided with the plurality of pixels; and a second substrate stacked over the first substrate and provided with the current source circuit.

5. The photoelectric conversion device according to claim 4, wherein the output line is divided into a first portion disposed on the first substrate and to which a part of the plurality of pixels is connected, a second portion disposed on the first substrate and to which another part of the plurality of pixels is connected, and a third portion disposed on the second substrate and connected to the current source circuit, and wherein the photoelectric conversion device further comprises a first selection circuit disposed on the second substrate and configured to select one of the first portion and the second portion of the output line and electrically connect the selected one to the third portion of the output line.

6. The photoelectric conversion device according to claim 5, wherein the interconnection is divided into a first portion disposed on the first substrate adjacent to the first portion of the interconnection, a second portion disposed on the first substrate adjacent to the second portion of the interconnection, and a third portion disposed on the second substrate adjacent to the third portion of the interconnection and connected to the current source circuit, and wherein the photoelectric conversion device further comprises a second selection circuit disposed on the second substrate and configured to select one of the first portion and the second portion of the interconnection and electrically connect the selected one to the third portion of the interconnection.

7. The photoelectric conversion device according to claim 4, wherein the output line is divided into a first portion disposed on the first substrate and to which a part of the plurality of pixels is connected, a second portion disposed on the first substrate and to which another part of the plurality of pixels is connected, a third portion disposed on the second substrate and electrically connected to the first portion, and a fourth portion disposed on the second substrate and electrically connected to the second portion, and wherein the current source circuit includes a first current source circuit electrically connected to the third portion, and a second current source circuit electrically connected to the fourth portion.

8. The photoelectric conversion device according to claim 1, wherein the output line comprises a plurality of output lines provided corresponding to the column and each connected to at least one of the plurality of pixels, wherein the interconnection comprises a plurality of interconnections provided corresponding to the column and each arranged adjacent to any one of the plurality of output lines in parallel, wherein the current source circuit comprises a plurality of current source circuits provided corresponding to the plurality of output lines and each configured to supply a current to the amplification unit of the pixel connected to the corresponding output line, and wherein each of the plurality of interconnections is connected to the current source circuit connected to the output line arranged adjacent thereto.

9. The photoelectric conversion device according to claim 8, wherein the plurality of output lines is arranged between two of the plurality of interconnections in a plan view.

10. The photoelectric conversion device according to claim 8, wherein the plurality of output lines is adjacent to each other without interposing another interconnection.

11. The photoelectric conversion device according to claim 8, wherein the number of output lines is greater than the number of the interconnections.

12. The photoelectric conversion device according to claim 8, wherein each of the plurality of output lines is sandwiched by the two interconnections connected to the same current source circuit.

13. The photoelectric conversion device according to claim 8, wherein at least two of the plurality of output lines are comprised of an interconnection layer of the same level.

14. The photoelectric conversion device according to claim 8, wherein at least two of the plurality of output lines are comprised of interconnection layers of different levels.

15. The photoelectric conversion device according to claim 8, wherein at least one of the plurality of output lines and the plurality of interconnections is comprised of a plurality of interconnection layers of different levels.

16. The photoelectric conversion device according to claim 15, wherein each of the plurality of interconnections is comprised of interconnection layers of the number greater than the number of interconnection layers comprising each of the plurality of output lines.

17. The photoelectric conversion device according to claim 16, wherein at least a part of the interconnection layers comprising the plurality of interconnection overlaps at least one of the plurality of output lines in a plan view.

18. The photoelectric conversion device according to claim 8, wherein the plurality of output lines includes a first output line and a second output line, wherein the plurality of interconnections includes a first interconnection and a second interconnection, wherein the plurality of current source circuit includes a first current source circuit, a second current source circuit, and a switch circuit configured to switch between a first mode in which the first current source circuit is connected to the first output line and the first interconnection and the second current source circuit is connected to the second output line and the second interconnection, and a second mode in which the first current source circuit is connected to the first output line and the first interconnection and the second interconnection is connected to the first interconnection.

19. The photoelectric conversion device according to claim 1, wherein the current source circuit further includes a negative capacitance circuit connected to the output line.

20. The photoelectric conversion device according to claim 1, wherein the output line and the interconnection are arranged adjacent to each other in a pixel array unit in which the plurality of pixels is arranged.

21. The photoelectric conversion device according to claim 1, further comprising a pixel array unit in which a plurality of the columns is arranged.

22. The photoelectric conversion device according to claim 1, wherein the amplification unit is configured by a source follower circuit.

23. The photoelectric conversion device according to claim 1, wherein the amplification unit is configured by a common-source amplifier circuit.

24. The photoelectric conversion device according to claim 1, wherein the amplification unit is configured by a differential amplifier circuit.

25. A photoelectric conversion system comprising:
the photoelectric conversion device according to claim 1; and
a signal processing device configured to process a signal output from the photoelectric conversion device.

26. A movable object comprising:
the photoelectric conversion device according to claim 1; and
a distance information acquisition unit configured to acquire distance information to an object from a parallax image based on a signal from the photoelectric conversion device; and
a control unit configured to control the movable object based on the distance information.

27. Equipment comprising:
the photoelectric conversion device according to claim 1, and
at least one of
an optical device corresponding to the photoelectric conversion device,
a control device configured to control the photoelectric conversion device,
a processing device configured to process a signal output from the photoelectric conversion device,
a mechanical device that is controlled based on information obtained by the photoelectric conversion device,
a display device configured to display information obtained by the photoelectric conversion device, and a storage device configured to store information obtained by the photoelectric conversion device.

28. A photoelectric conversion device comprising:
a plurality of pixels arranged to form a column and each including a photoelectric conversion unit and an amplification unit configured to amplify a signal based on charge generated by the photoelectric conversion unit;
an output line connected to the plurality of pixels;
an interconnection disposed adjacent to the output line; and
a current source circuit connected to the output line and configured to supply a current to the amplification unit of the pixel via the output line,
wherein the current source circuit includes a current source transistor connected between the output line and the interconnection, and a resistor connected between the interconnection and a fixed voltage node.

29. A photoelectric conversion device comprising:
a plurality of pixels arranged to form a column and each including a photoelectric conversion unit and an amplification unit configured to amplify a signal based on charge generated by the photoelectric conversion unit;
an output line connected to the plurality of pixels;
a current source circuit connected to the output line and configured to supply a current to the amplification unit of the pixel via the output line;
a first substrate provided with the plurality of pixels; and
a second substrate stacked over the first substrate and provided with the current source circuit,
wherein the output line is divided into
a first portion disposed on the first substrate and to which a part of the plurality of pixels is connected,
a second portion disposed on the first substrate and to which another part of the plurality of pixels is connected, and
a third portion disposed on the second substrate and connected to the current source circuit,
wherein the photoelectric conversion device further comprises a selection circuit disposed on the second substrate and configured to select one of the first portion and the second portion and electrically connect the selected one to the third portion, and
wherein the current source circuit includes a current source transistor connected to the output line and a negative capacitance circuit connected to the output line.

30. The photoelectric conversion device according to claim 29, further comprising a third substrate stacked over the first substrate and the second substrate and provided with an analog-to-digital conversion circuit configured to perform analog-to-digital conversion on a signal output from the output line.

* * * * *